(12) United States Patent
Leggette et al.

(10) Patent No.: US 9,009,564 B2
(45) Date of Patent: Apr. 14, 2015

(54) STORING DATA IN A DISTRIBUTED STORAGE NETWORK

(71) Applicant: Cleversafe, Inc., Chicago, IL (US)

(72) Inventors: Wesley Leggette, Chicago, IL (US); Andrew Baptist, Chicago, IL (US); Jason K. Resch, Chicago, IL (US)

(73) Assignee: Cleversafe, Inc., Chicago, IL (US)

( * ) Notice: Subject to any disclaimer, the term of this patent is extended or adjusted under 35 U.S.C. 154(b) by 97 days.

(21) Appl. No.: 13/707,471

(22) Filed: Dec. 6, 2012

(65) Prior Publication Data
US 2013/0151926 A1 Jun. 13, 2013

Related U.S. Application Data

(60) Provisional application No. 61/569,387, filed on Dec. 12, 2011.

(51) Int. Cl.
*G11C 29/00* (2006.01)
*H03M 13/05* (2006.01)
*H04L 29/08* (2006.01)
*G06F 11/10* (2006.01)

(52) U.S. Cl.
CPC ............... *H03M 13/05* (2013.01); *H04L 67/10* (2013.01); *H04L 67/1097* (2013.01); *G06F 11/1092* (2013.01); *G06F 2211/1028* (2013.01)

(58) Field of Classification Search
CPC .......................... G06F 11/1076; G06F 11/1008
USPC .................... 714/763, 774, 804, 795, 761, 45
See application file for complete search history.

(56) References Cited

U.S. PATENT DOCUMENTS

| | | | |
|---|---|---|---|
| 4,092,732 A | 5/1978 | Ouchi | |
| 5,454,101 A | 9/1995 | Mackay et al. | |
| 5,485,474 A | 1/1996 | Rabin | |
| 5,615,332 A * | 3/1997 | Yamamoto | 714/38.13 |
| 5,774,643 A | 6/1998 | Lubbers et al. | |
| 5,802,364 A | 9/1998 | Senator et al. | |
| 5,809,285 A | 9/1998 | Hilland | |

(Continued)

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

(Continued)

*Primary Examiner* — Fritz Alphonse
(74) *Attorney, Agent, or Firm* — Garlick & Markison; Timothy W. Markison

(57) ABSTRACT

A method begins by a dispersed storage (DS) processing module mapping a set of data partitions to a set of storage regions. For each data partition, the method continues with the DS processing module segmenting the data partition into a plurality of data segments and designating a first data segment. The method continues with the DS processing module generating data storage mapping information. The method continues with the DS processing module encoding the data storage mapping information to produce at least one set of encoded mapping information slices and for each data partition, encoding the plurality of data segments to produce a plurality of sets of encoded data slices. The method continues with the DS processing module outputting the at least one set of encoded mapping information slices and, for each data partition, the plurality of sets of encoded data slices to the DSN for storage therein.

12 Claims, 78 Drawing Sheets

(56) References Cited

U.S. PATENT DOCUMENTS

| | | | |
|---|---|---|---|
| 5,890,156 A | 3/1999 | Rekieta et al. | |
| 5,961,652 A * | 10/1999 | Thompson | 714/6.12 |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,680,986 B1 * | 1/2004 | Hemmati | 375/341 |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,480,909 B2 | 1/2009 | McKean et al. | |
| 7,636,724 B2 | 12/2009 | de la Torre et al. | |
| 8,649,521 B2 * | 2/2014 | Grube et al. | 380/268 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0185193 A1 * | 7/2011 | Grube et al. | 713/194 |
| 2011/0185258 A1 | 7/2011 | Grube et al. | |
| 2011/0264717 A1 | 10/2011 | Grube et al. | |

OTHER PUBLICATIONS

Shamir; How to Share a Secret; Communications of the ACM; vol. 22, No. 11; Nov. 1979; pp. 612-613.

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, Ti: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

International Search Report and Written Opinion; International Application No. PCT/US12/68883; Feb. 26, 2013; 12 pages.

* cited by examiner

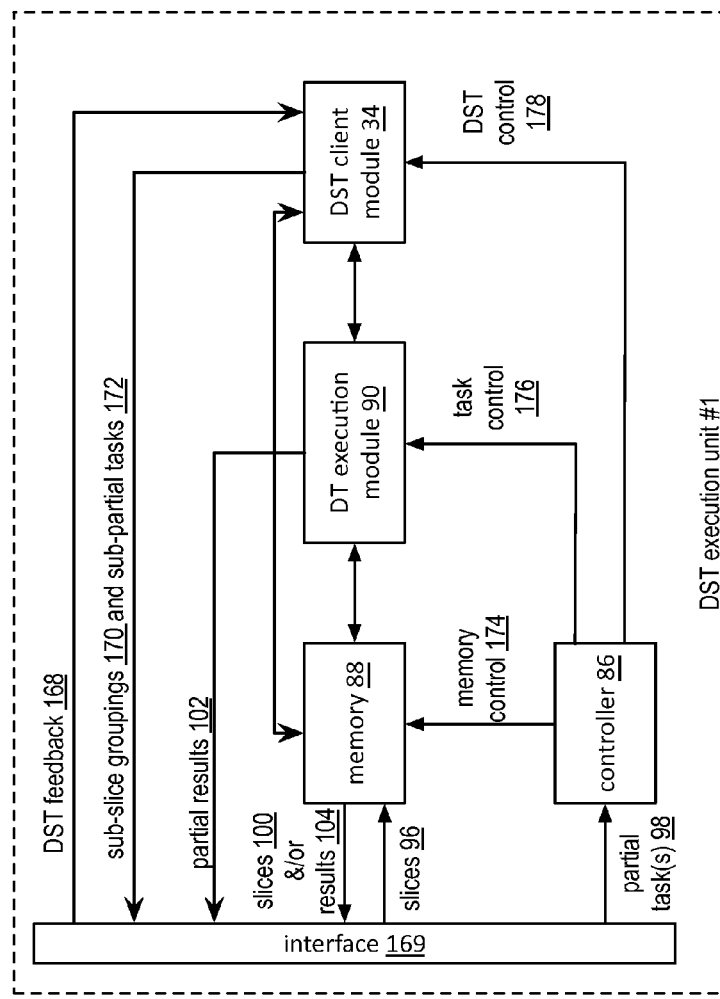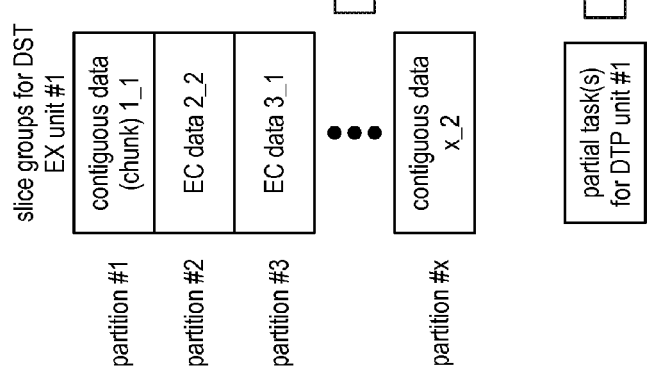
FIG. 11

FIG. 32

DST allocation info 242 | data partition info 320: ☒ data ID; No. of partitions; Addr. info for each partition; format conversion indication task execution info 322

| task 326 | task ordering 328 | data partition 330 | set of DT EX mods 332 | Name 334 | interm. result processing 336 | scratch pad storage 338 | intermediate result storage 340 |
|---|---|---|---|---|---|---|---|
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1_4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 & 1_5 | R1-1_1 - R1-1_z &<br>R1-5_1 - R1-5_z | 1_1, 2_1, 3_1, 4_1, & 5_1 | R1-6 | DST unit 2 | DST unit 2 | DST units 2-6 |
| 1_7 | after 1_2 & 1_5 | R1-2_1 - R1-2_z &<br>R1-5_1 - R1-5_z | 1_2, 2_2, 2_3, 2_4, 2_5, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 2_3, 3_2, 4_2, & 5_2 | R3-2 | DST unit 5 | DST unit 5 | DST units 5,6, 1-3 |

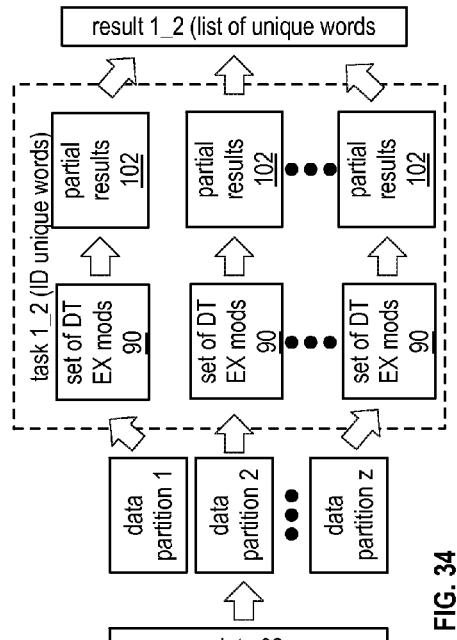
FIG. 34
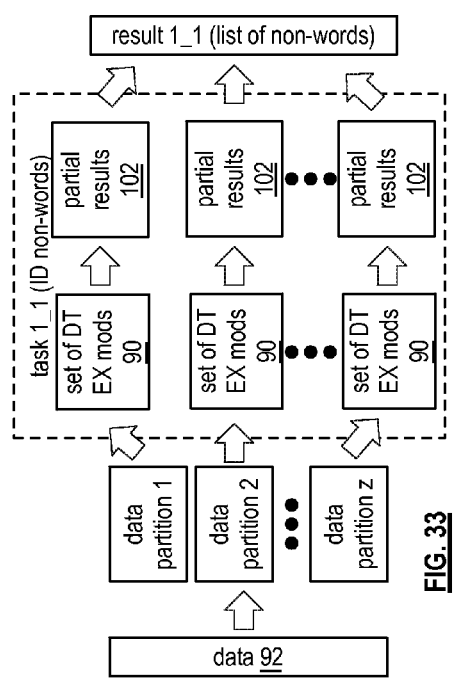
FIG. 33
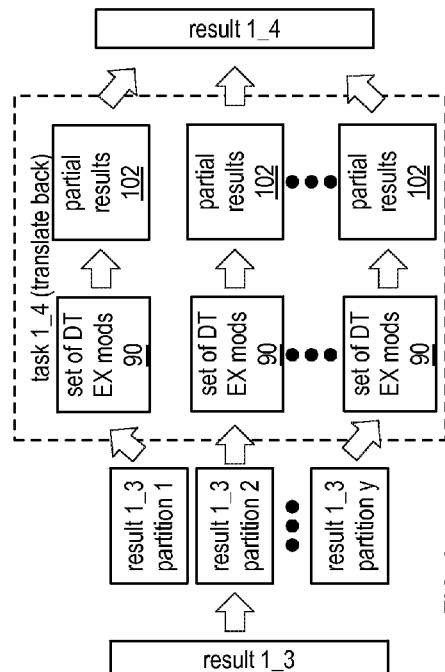
FIG. 35
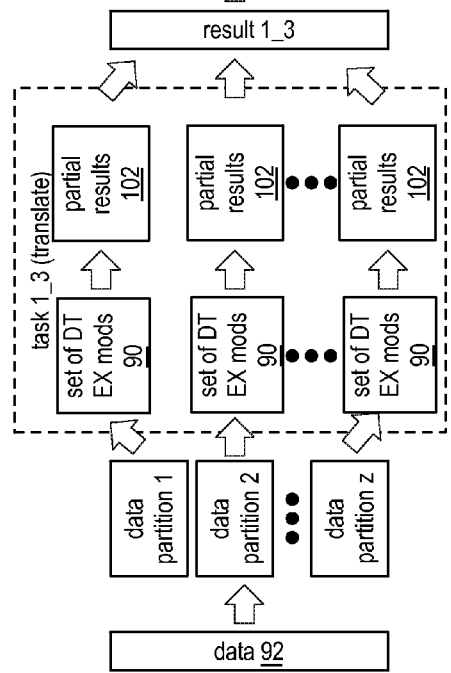

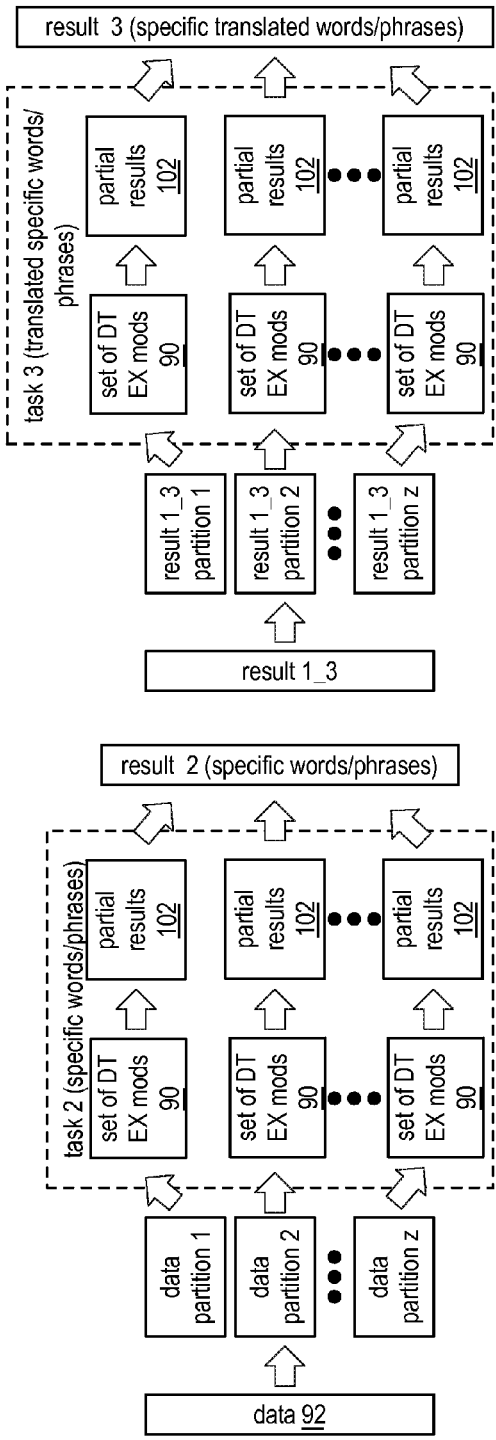
FIG. 38
FIG. 37
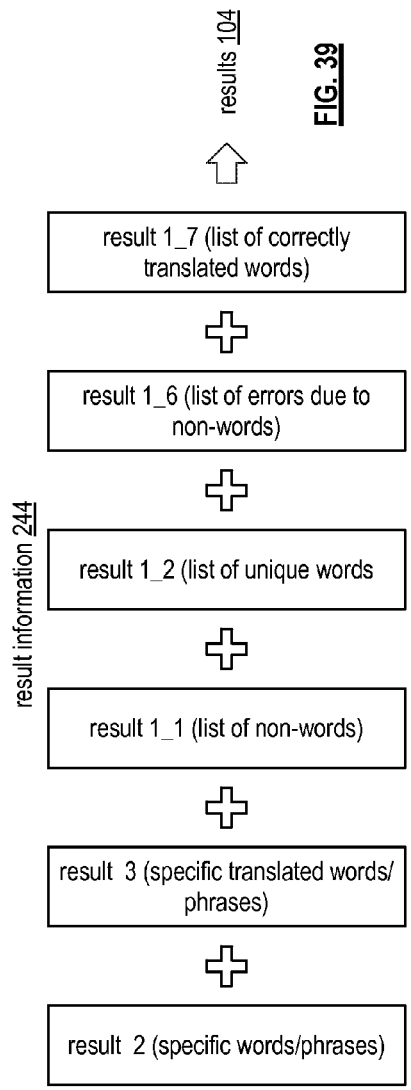
FIG. 39

STORING DATA IN A DISTRIBUTED STORAGE NETWORK

CROSS REFERENCE TO RELATED PATENTS

The present U.S. Utility patent application claims priority pursuant to 35 U.S.C. §119(e) to U.S. Provisional Application No. 61/569,387, entitled "Distributed Storage and Task Processing" filed Dec. 12, 2011, which is incorporated herein by reference in its entirety and made part of the present U.S. Utility patent application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to computer networks and more particularly to dispersed storage of data and distributed task processing of data.

2. Description of Related Art

Computing devices are known to communicate data, process data, and/or store data. Such computing devices range from wireless smart phones, laptops, tablets, personal computers (PC), work station, video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 11 is a schematic block diagram of an embodiment of a DST execution unit in accordance with the present invention;

Figure 25:
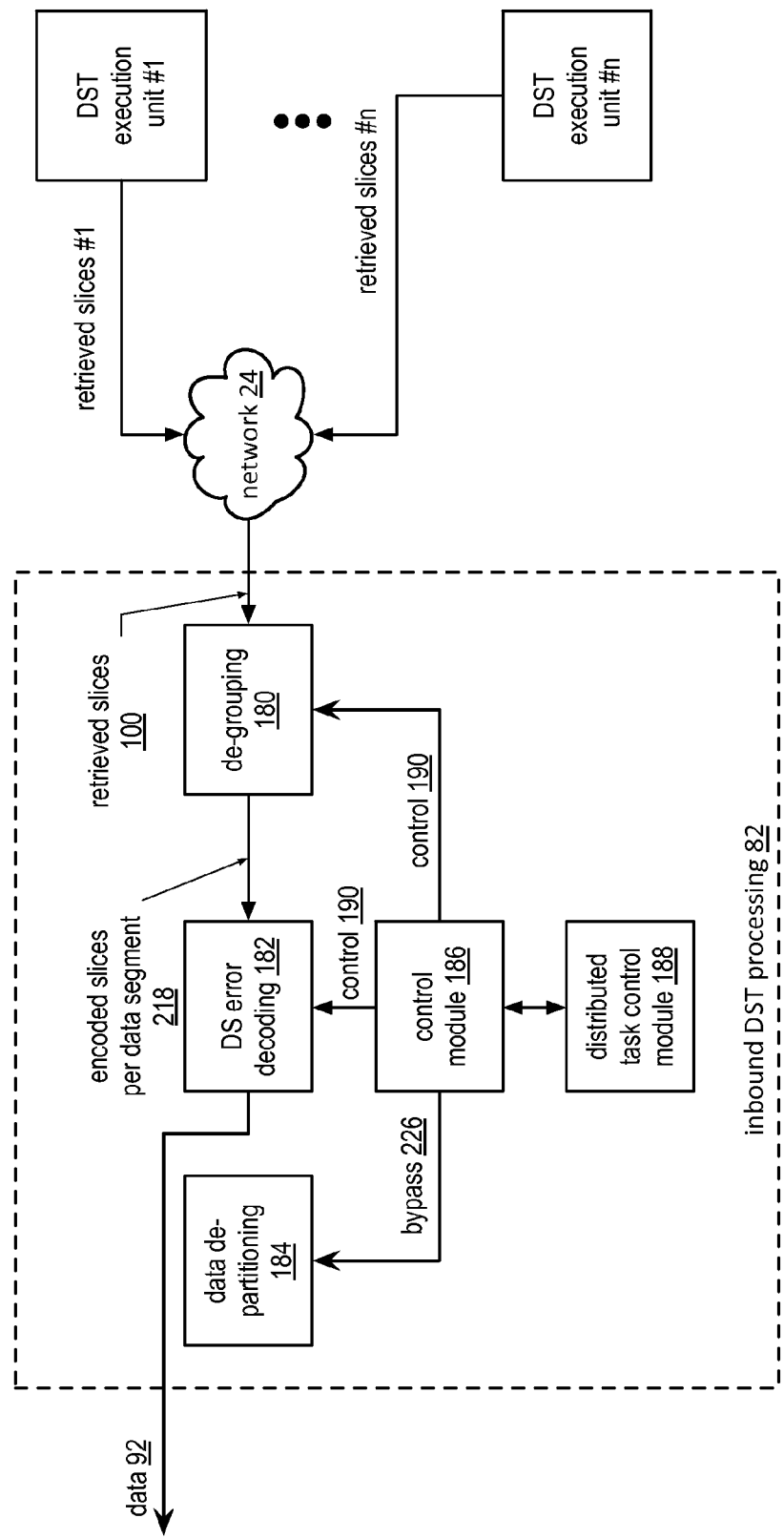
FIG. 25 is a schematic block diagram of an example of operation of inbound distributed storage and/or task (DST)
Figure 26:
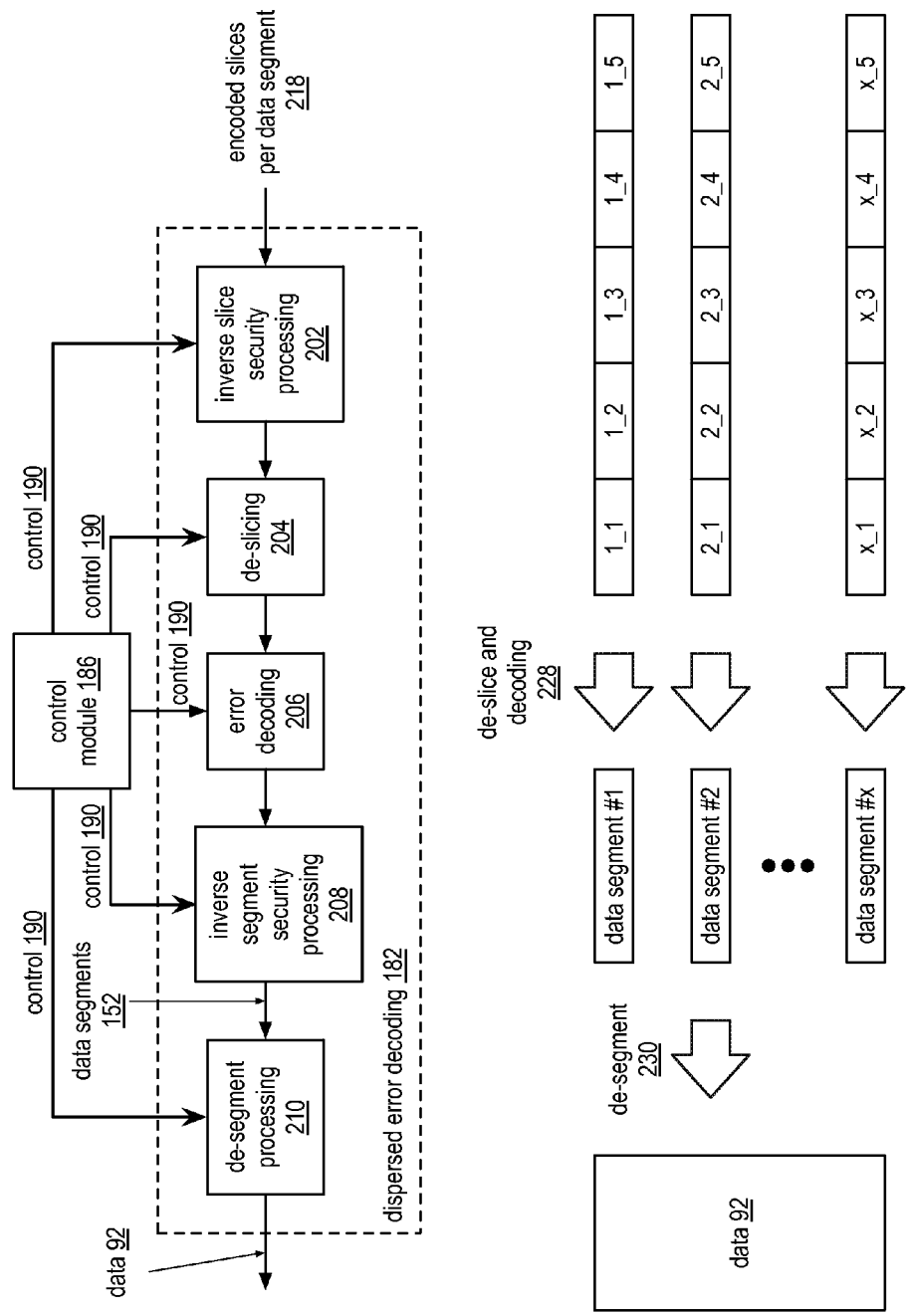
Figure 27:
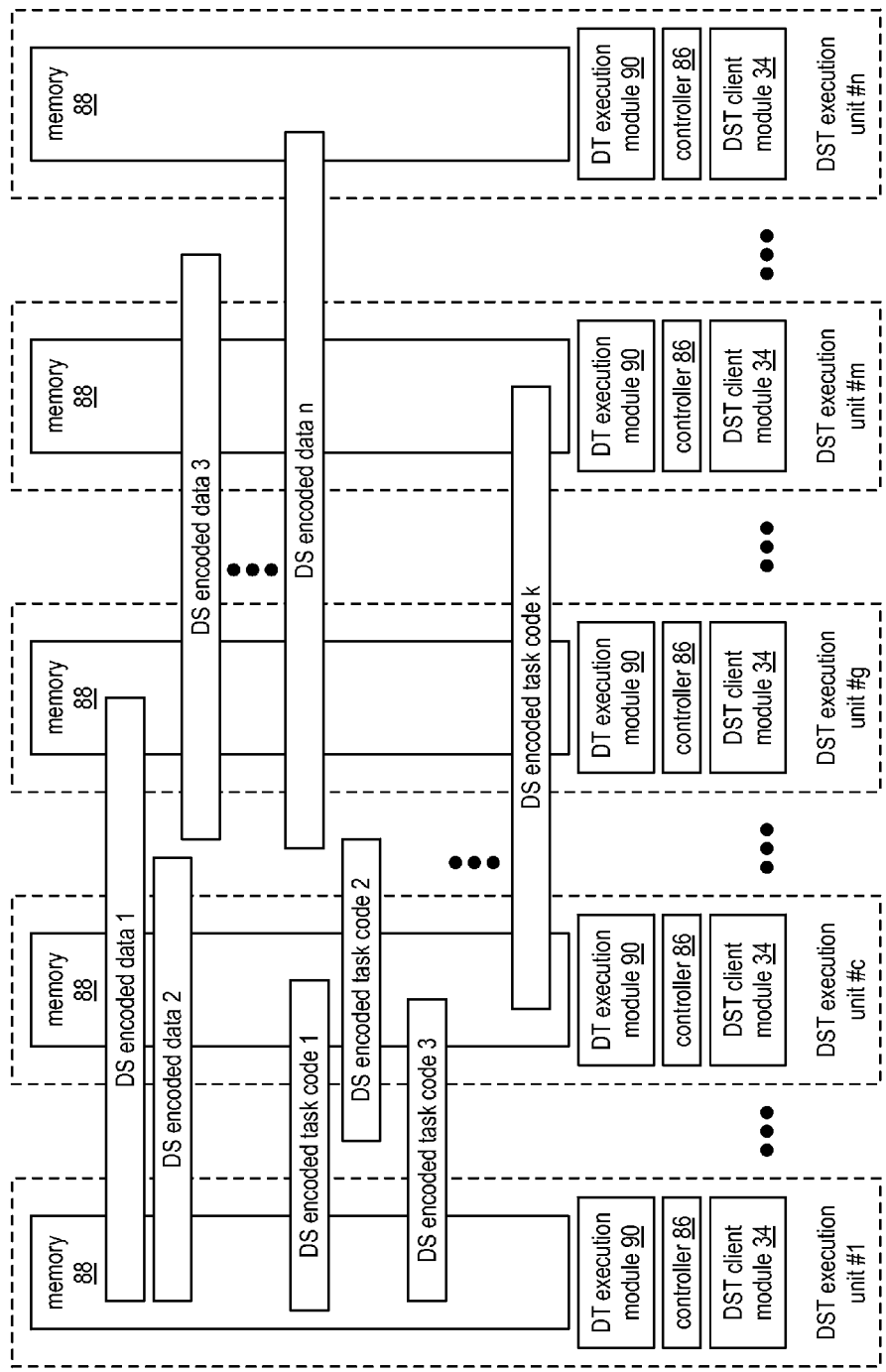
Figure 28:
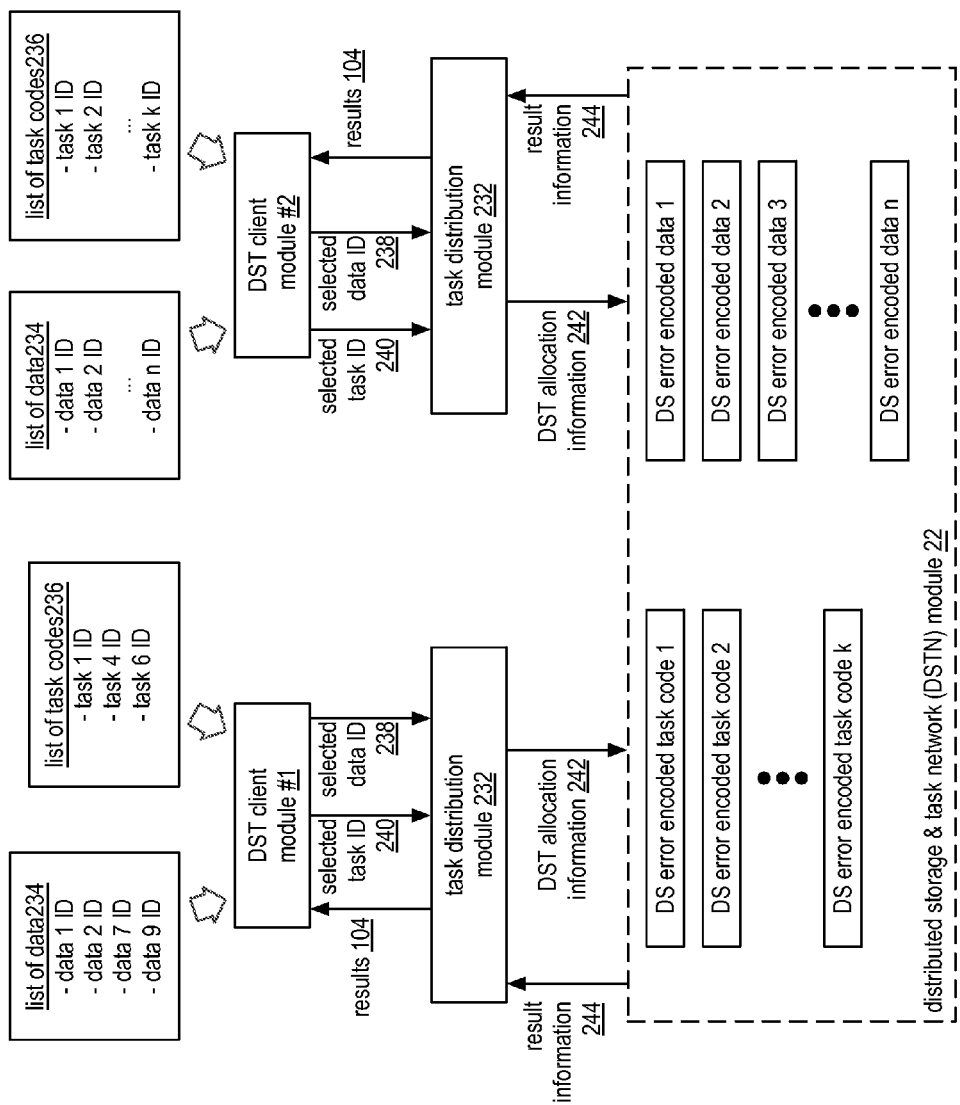
Figure 29:
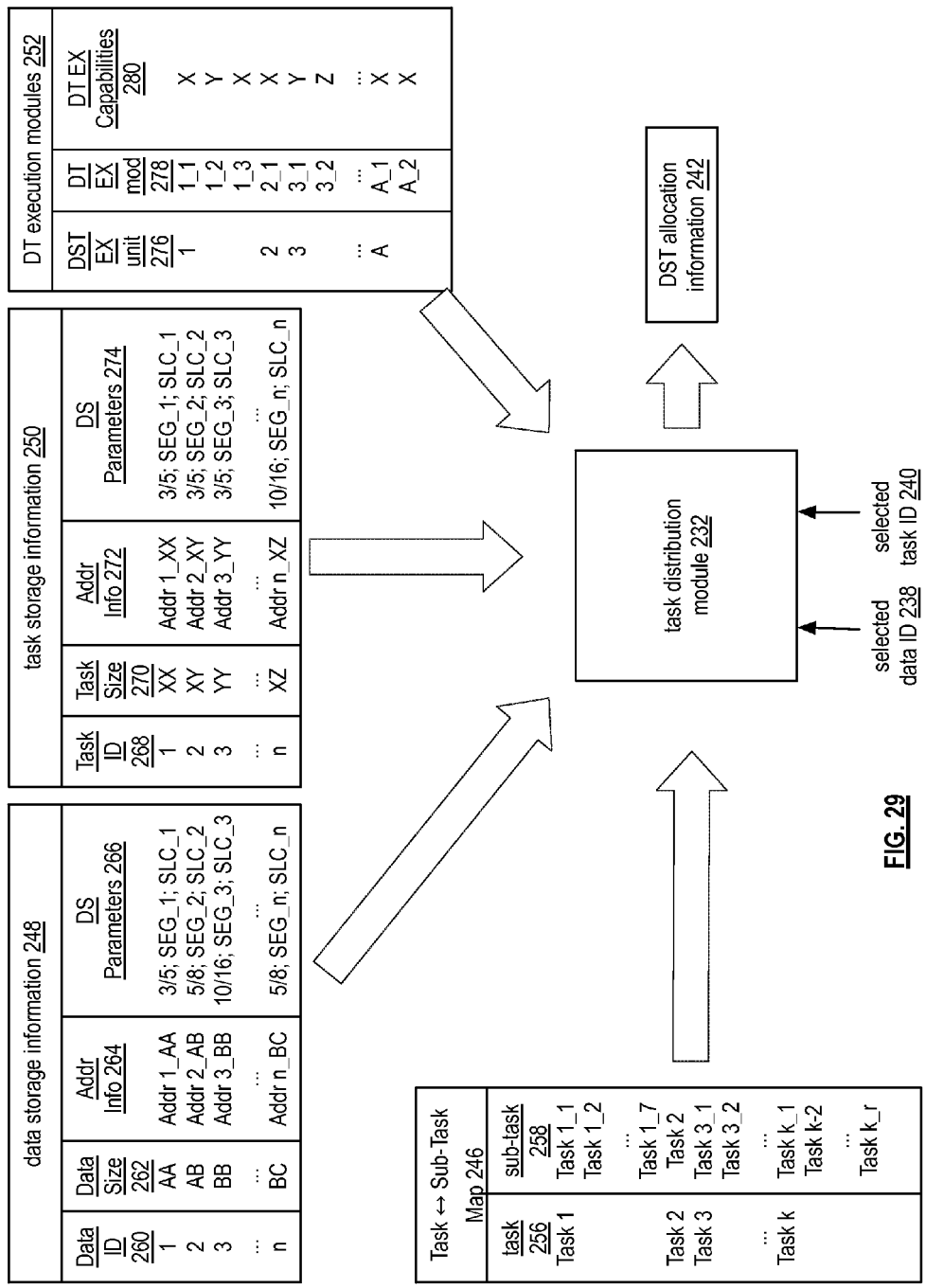
Figure 30:
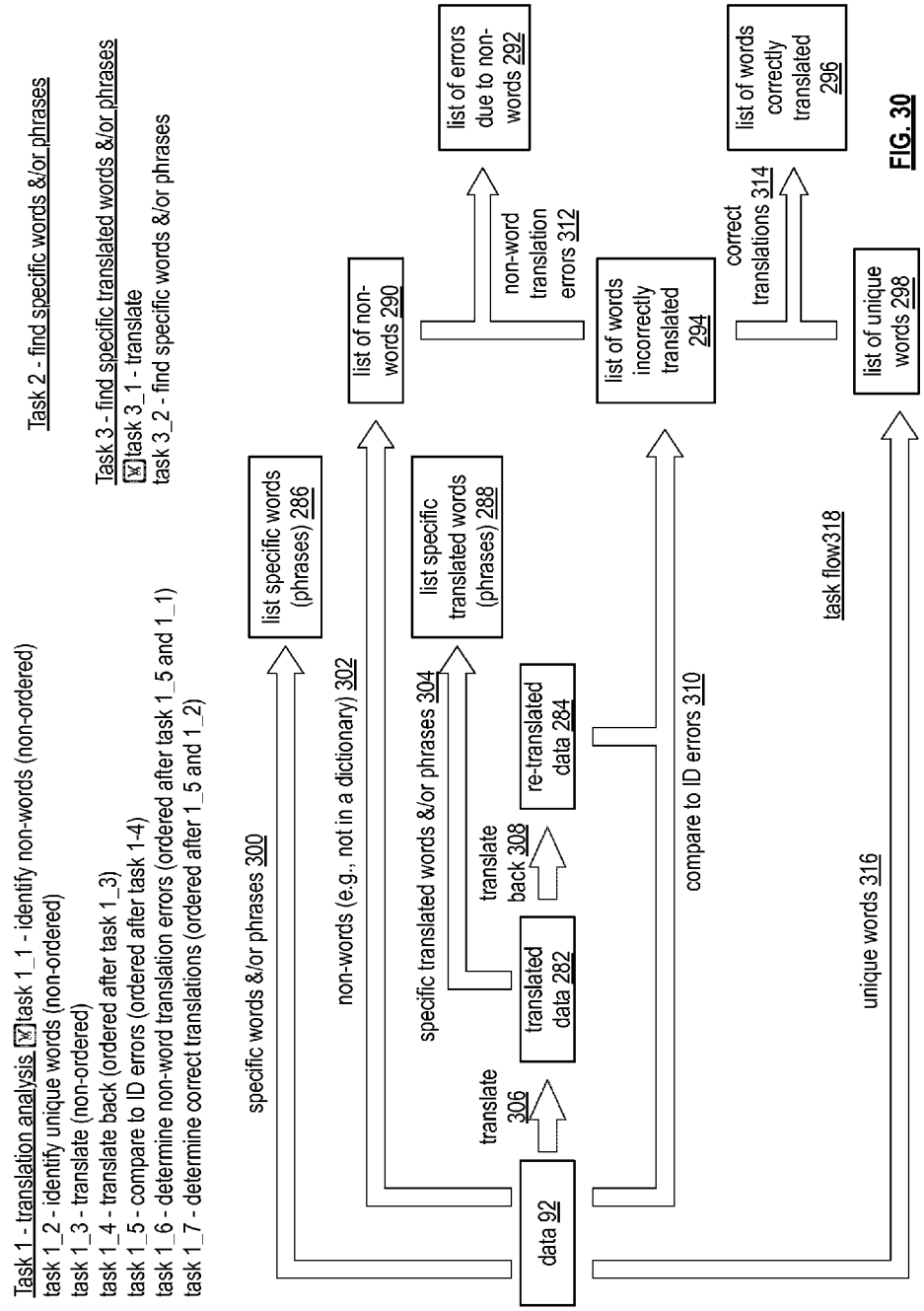
Figure 31:
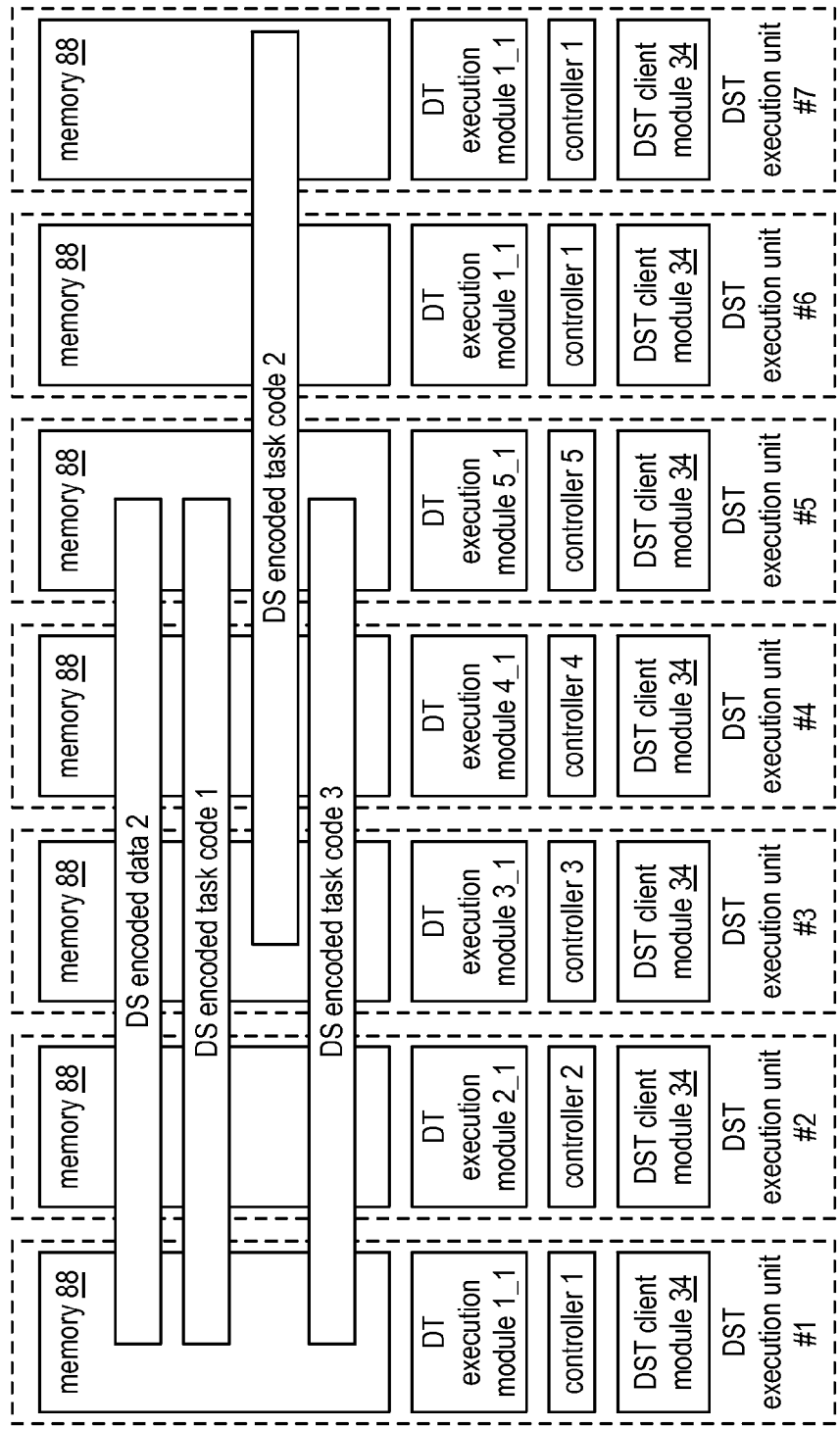
Figure 40A:
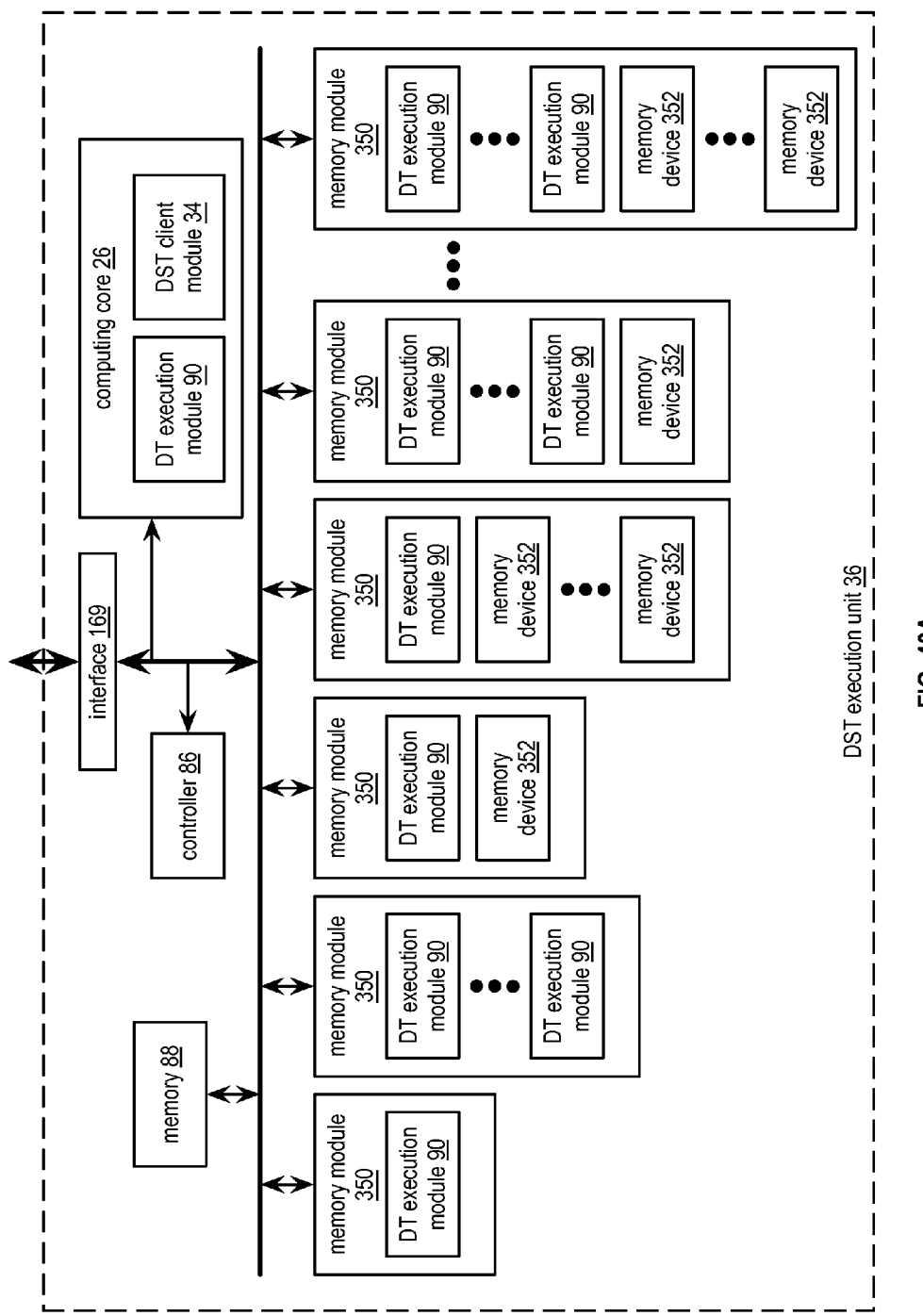
Figure 40B:
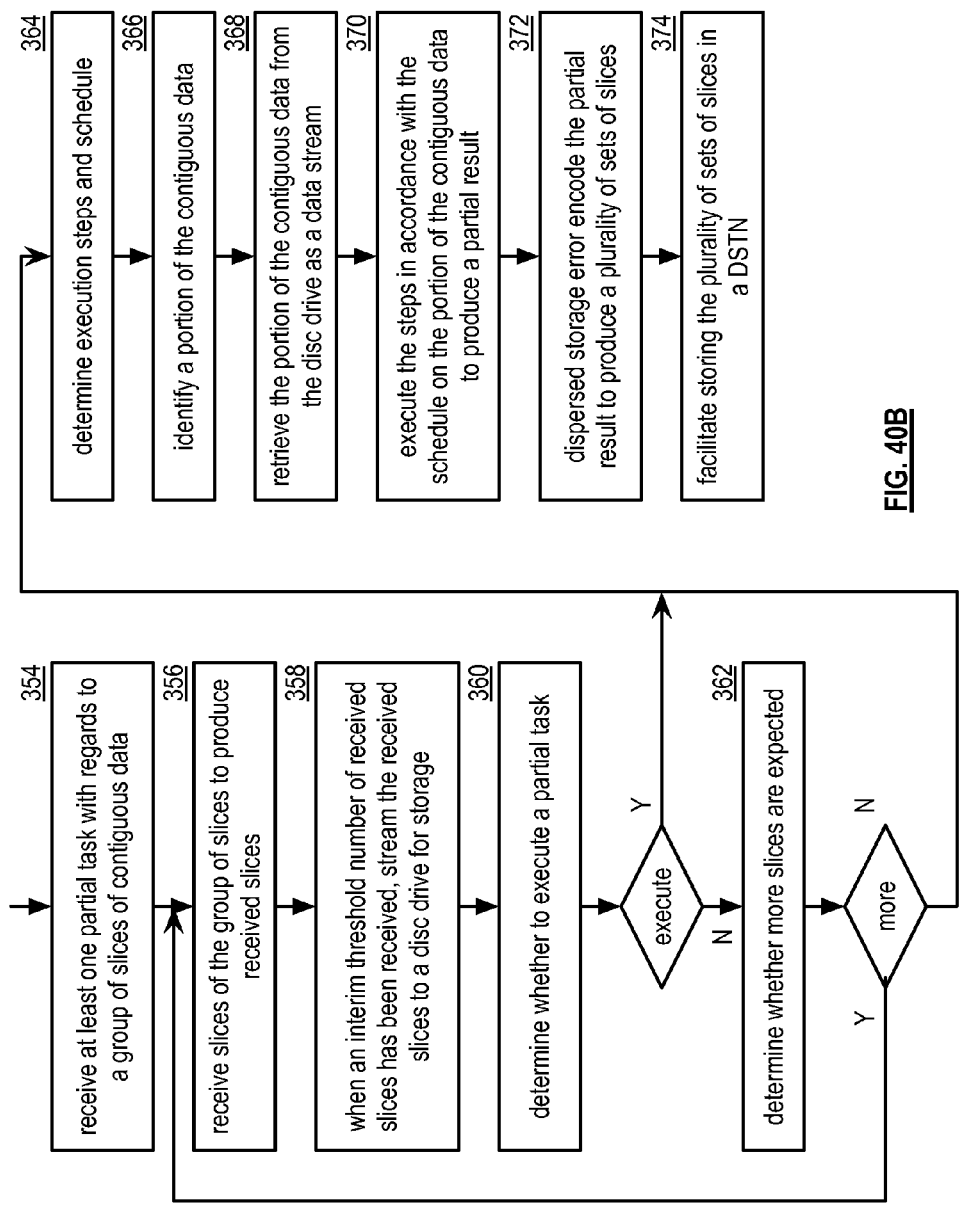

processing for retrieving dispersed error encoded data in accordance with the present invention;

FIG. 26 is a schematic block diagram of an example of a dispersed error decoding for the example of FIG. 25 in accordance with the present invention;

FIG. 27 is a schematic block diagram of an example of a distributed storage and task processing network (DSTN) module storing a plurality of data and a plurality of task codes in accordance with the present invention;

FIG. 28 is a schematic block diagram of an example of the distributed computing system performing tasks on stored data in accordance with the present invention;

FIG. 29 is a schematic block diagram of an embodiment of a task distribution module facilitating the example of FIG. 28 in accordance with the present invention;

FIG. 30 is a diagram of a specific example of the distributed computing system performing tasks on stored data in accordance with the present invention;

FIG. 31 is a schematic block diagram of an example of a distributed storage and task processing network (DSTN) module storing data and task codes for the example of FIG. 30 in accordance with the present invention;

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 40A is a diagram of an example embodiment of a dispersed storage and task execution unit in accordance with the present invention;

FIG. 40B is a flowchart illustrating an example of storing and processing a group of slices in accordance with the present invention.

Figure 41:
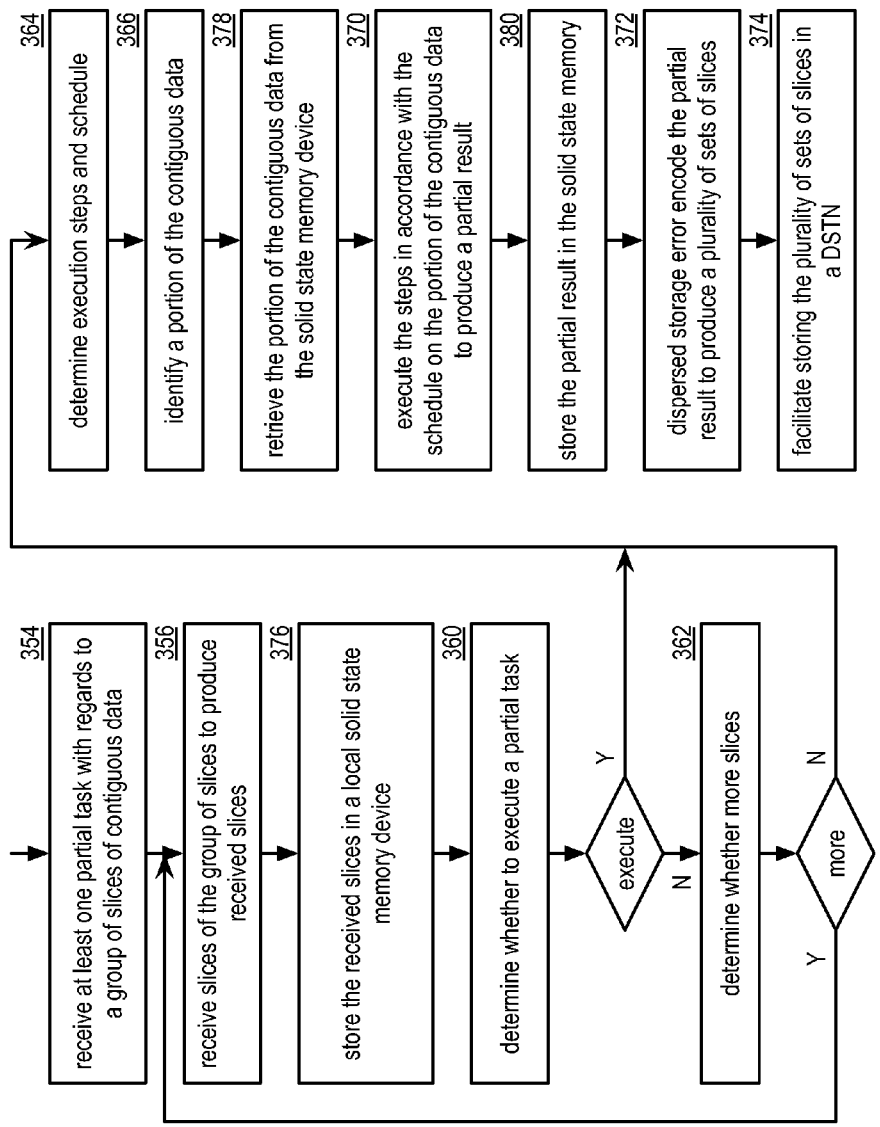
Figure 42A:
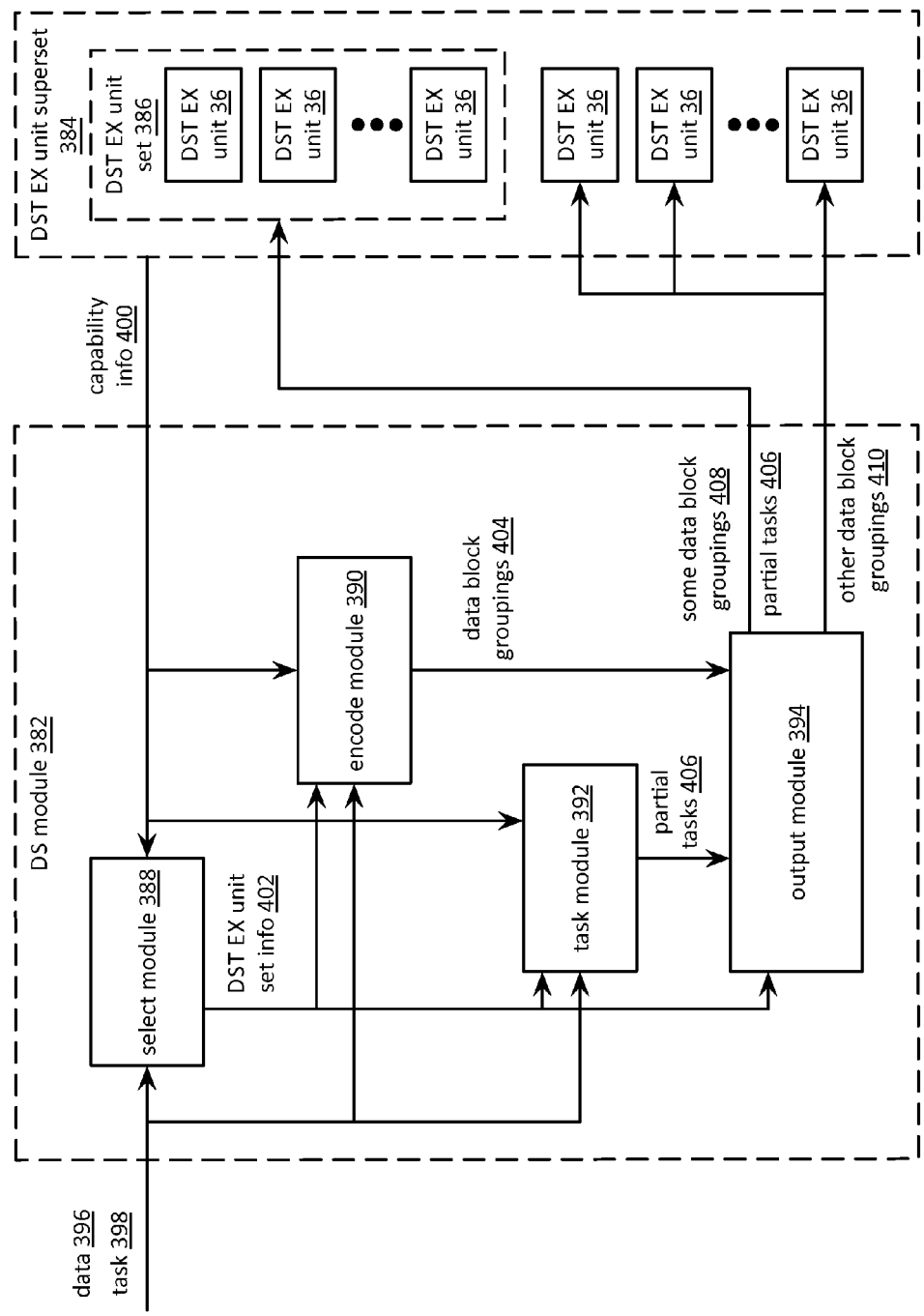
Figure 42B:
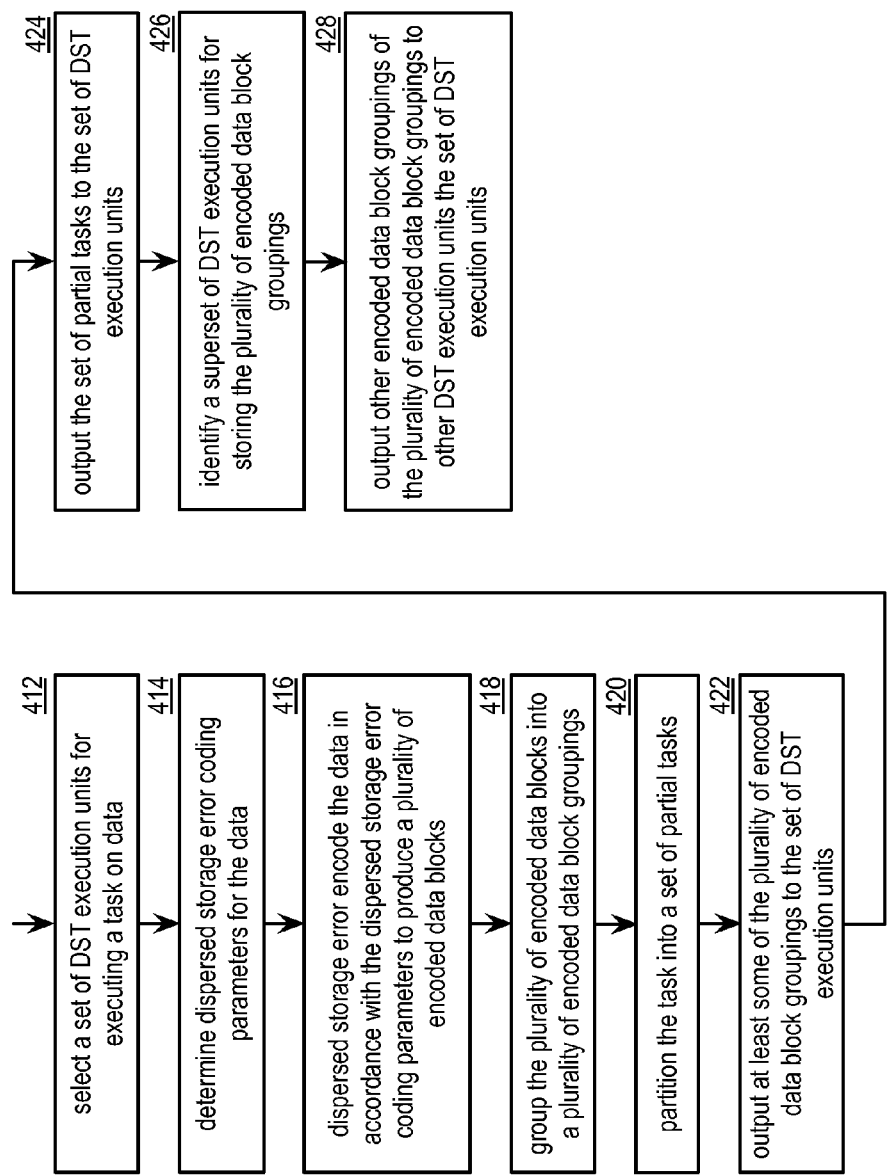
Figure 42C:
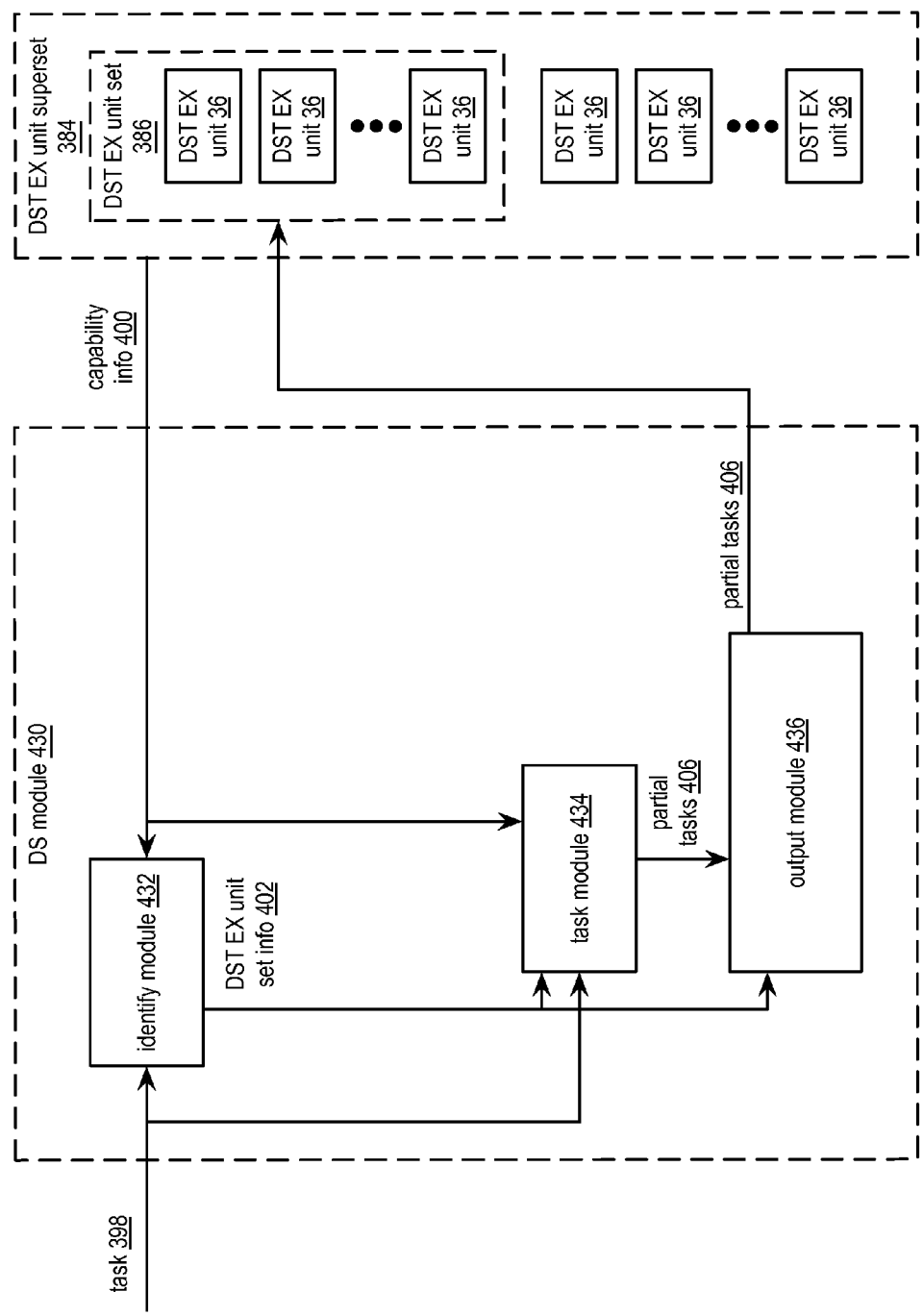
Figure 42D:
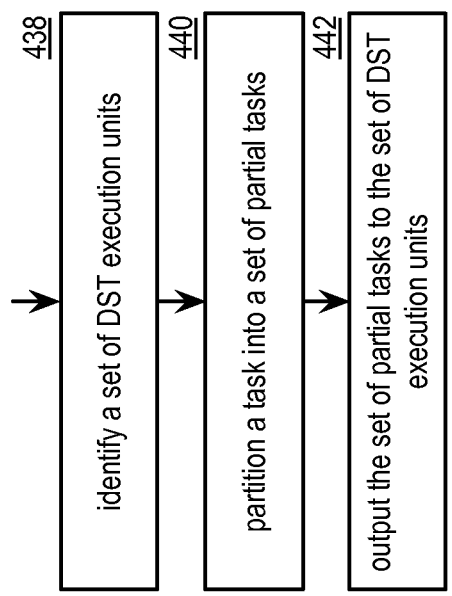
Figure 43A:
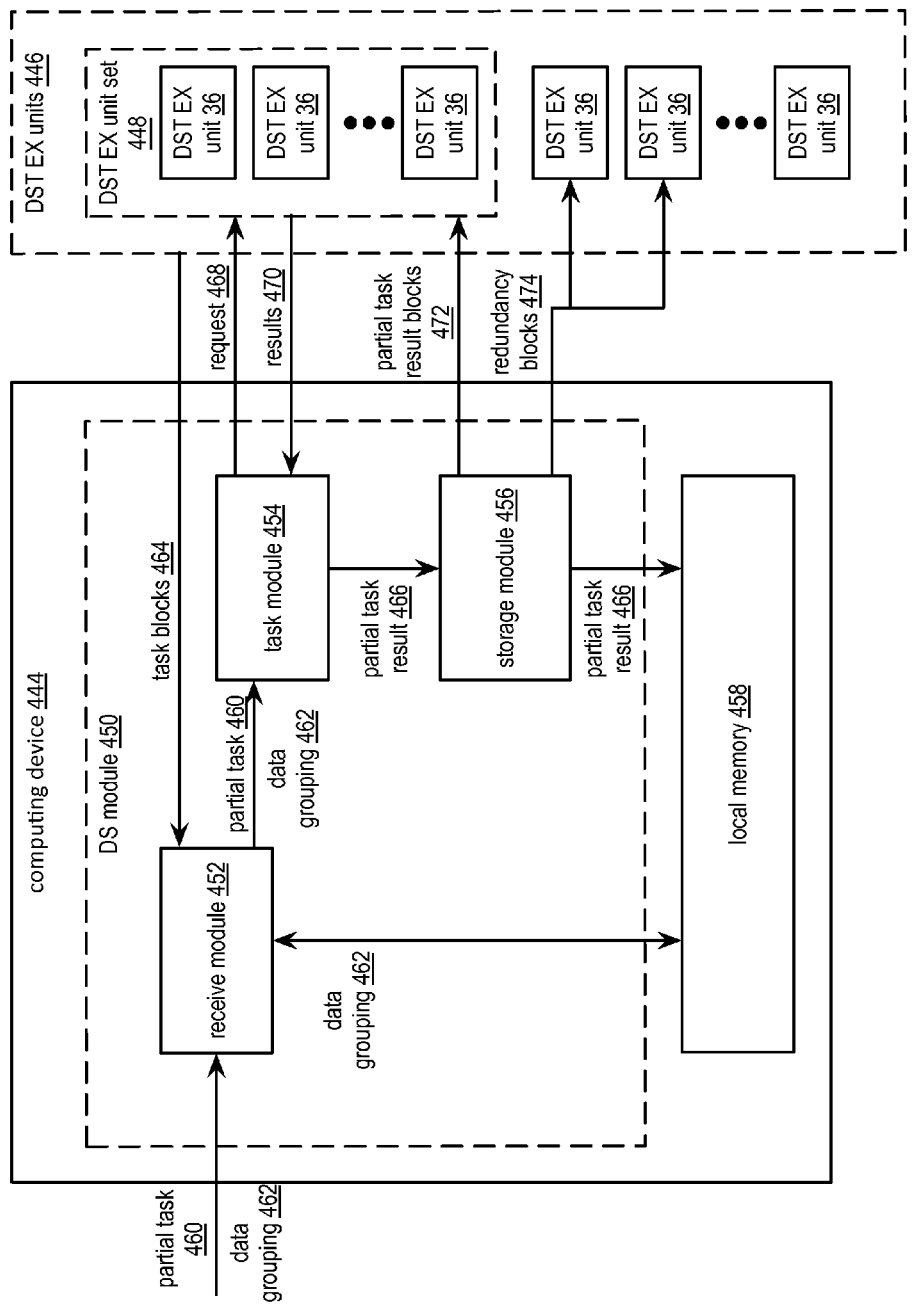
Figure 43B:
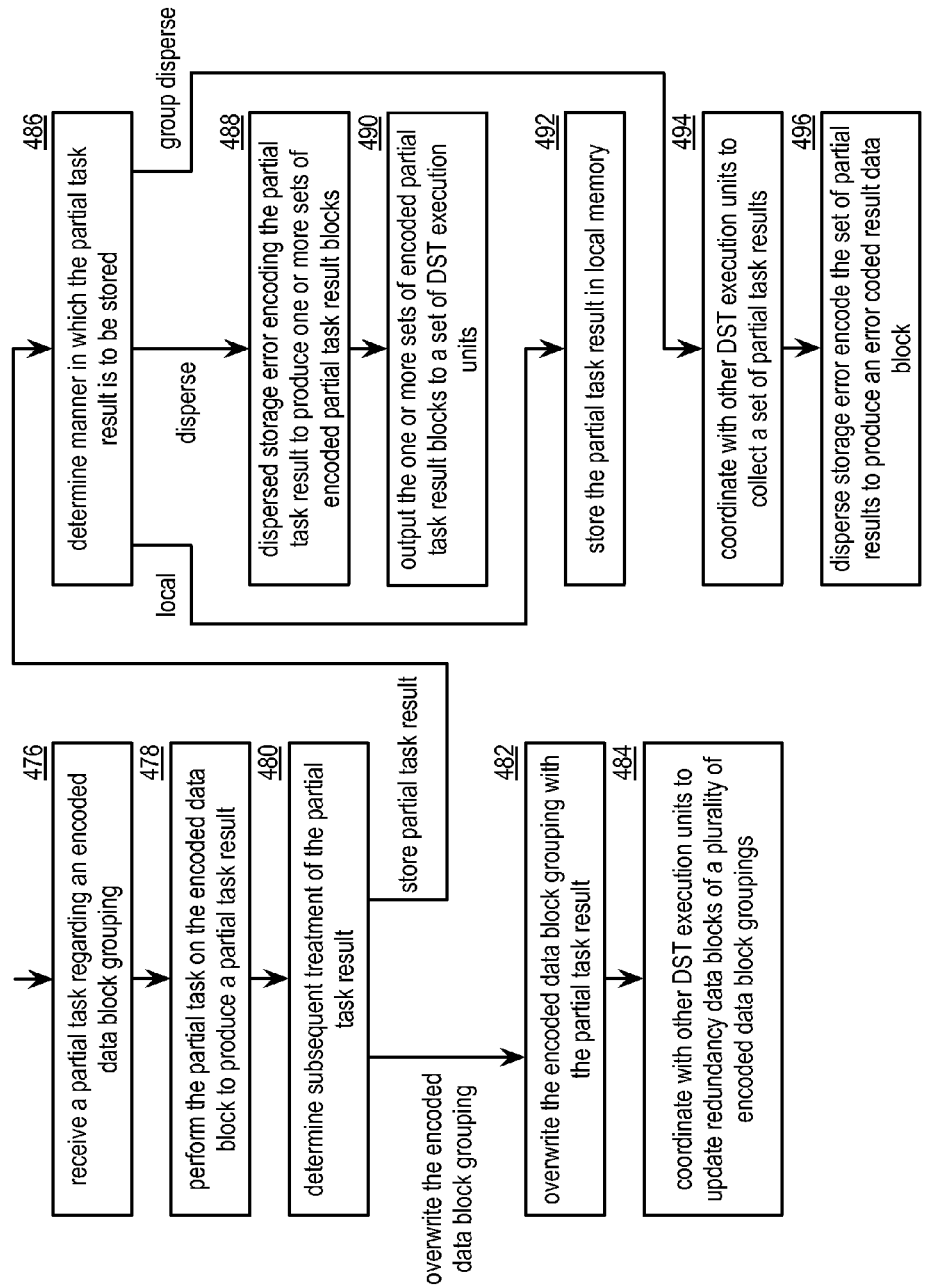
Figure 44A:
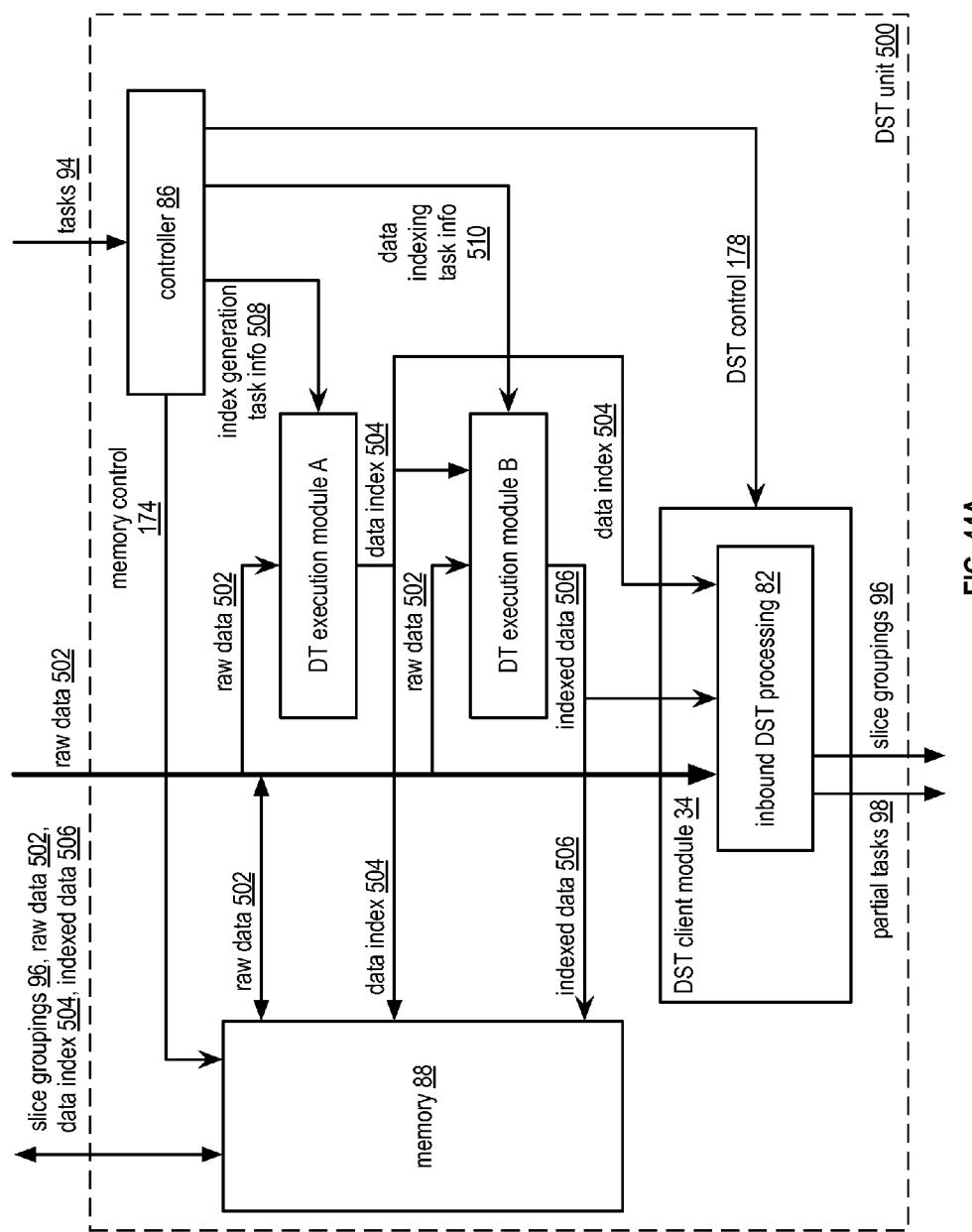
Figure 44B:
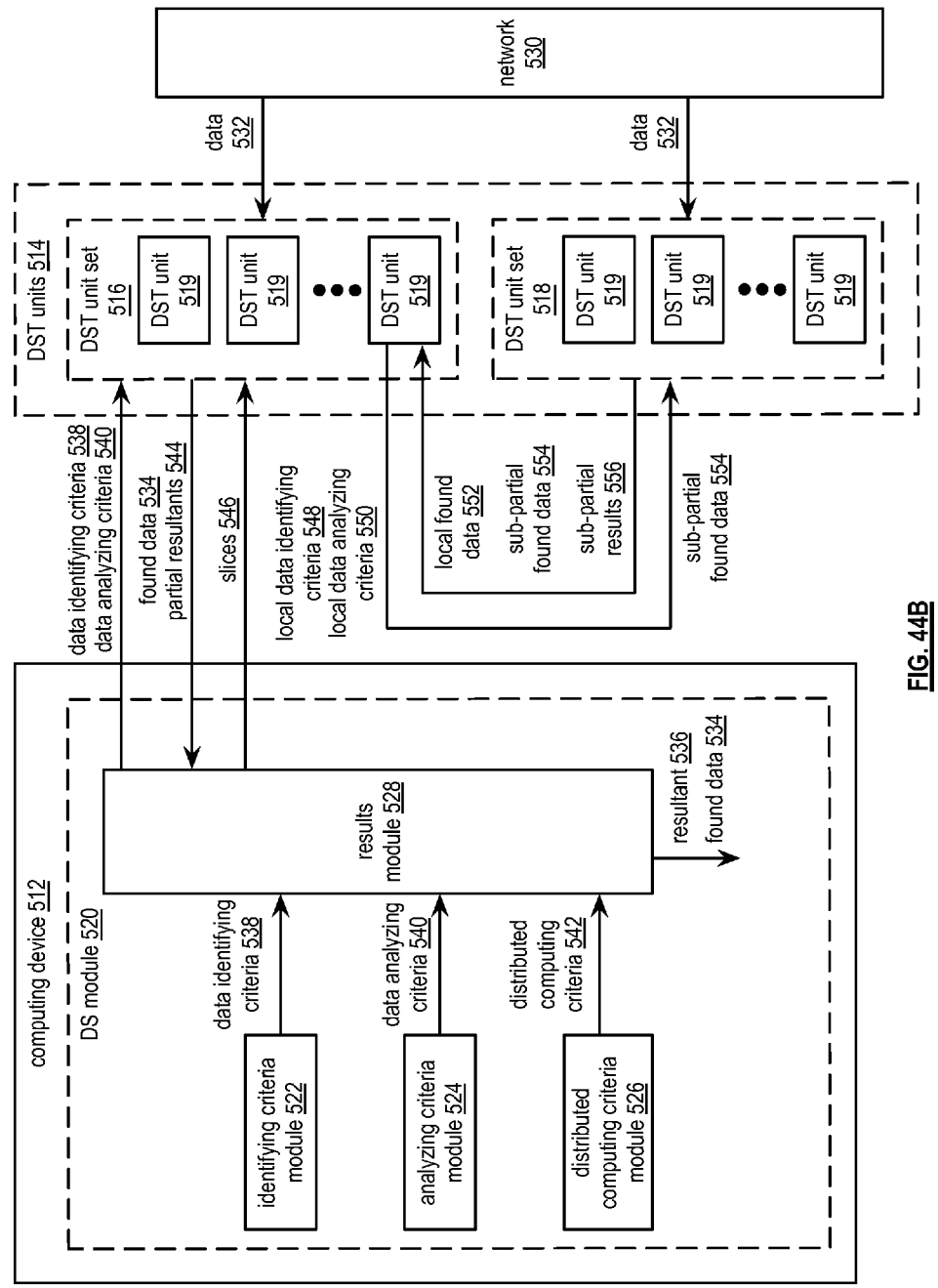
Figure 44C:
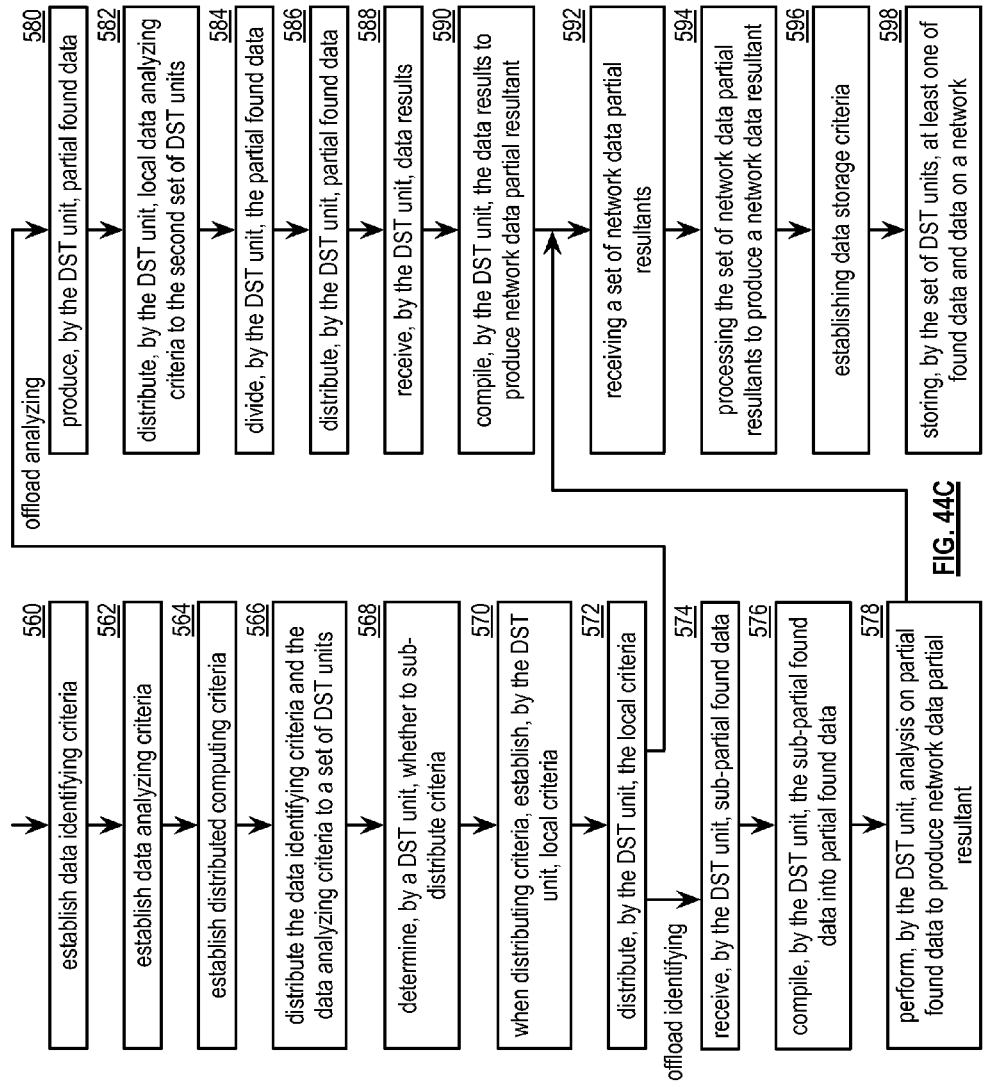
Figure 45:
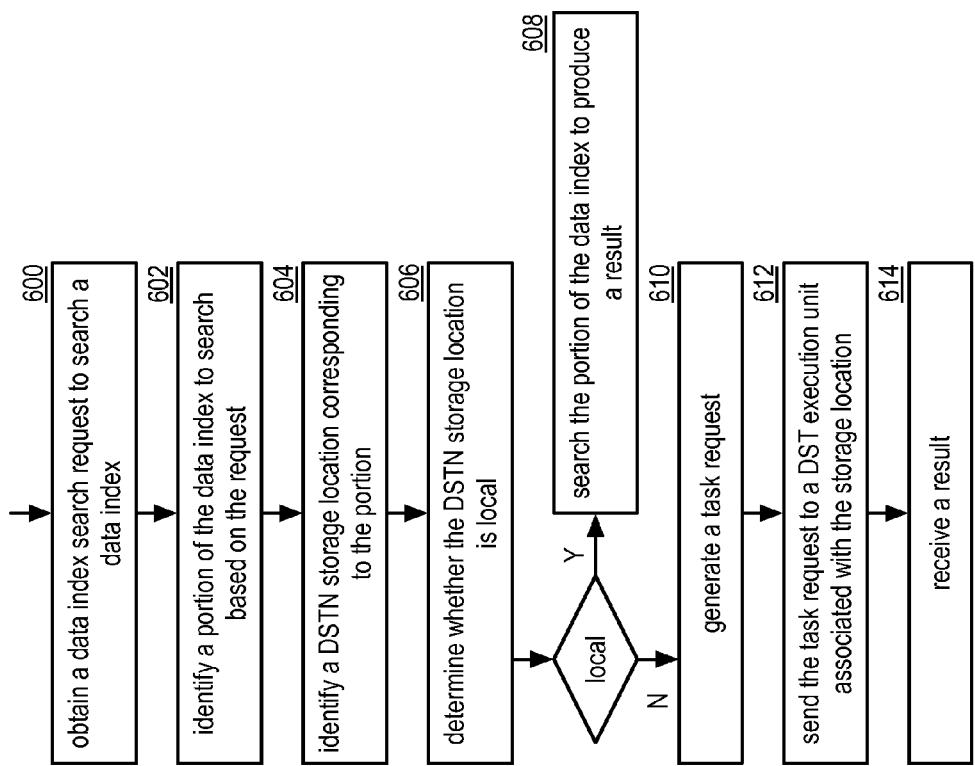
Figure 46:
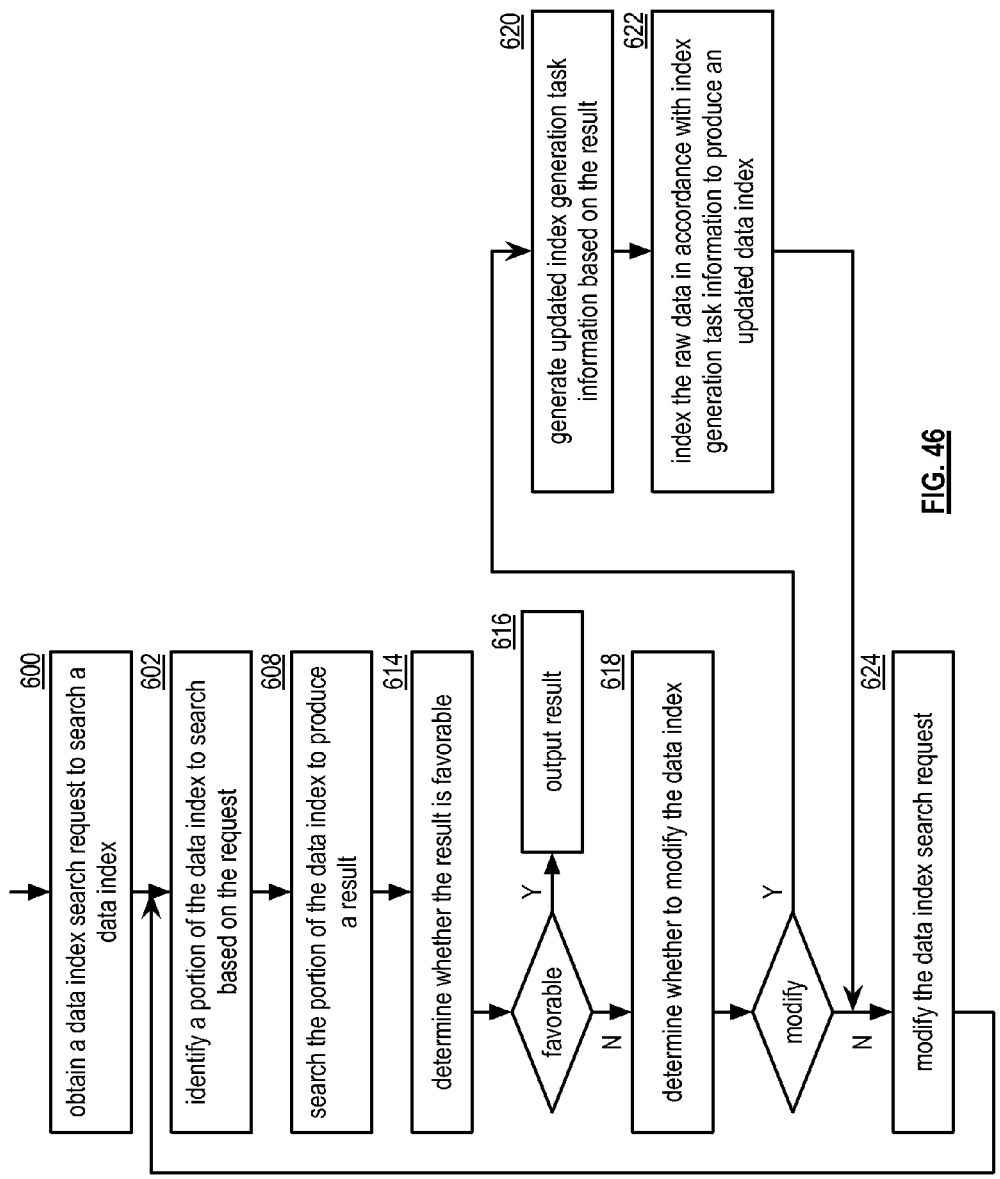
Figure 47A:
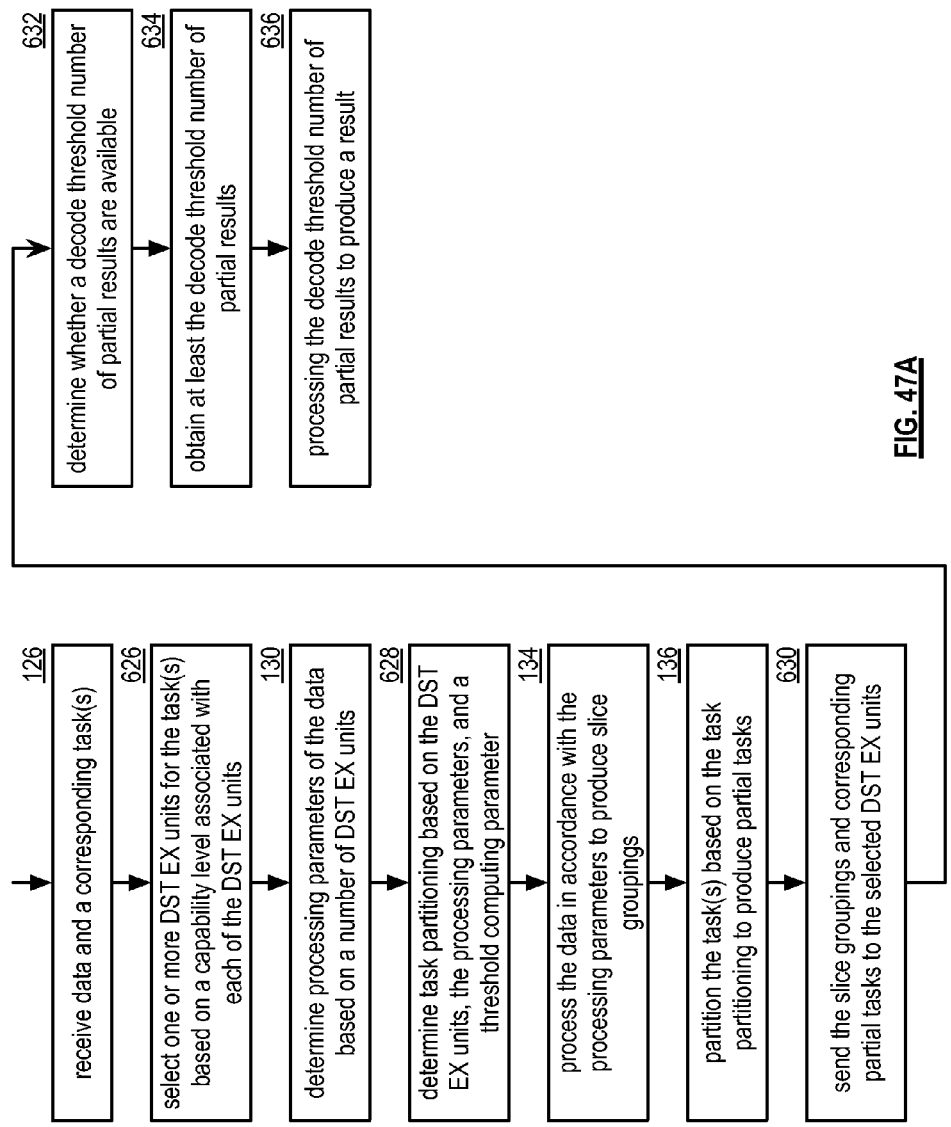
Figure 47B:
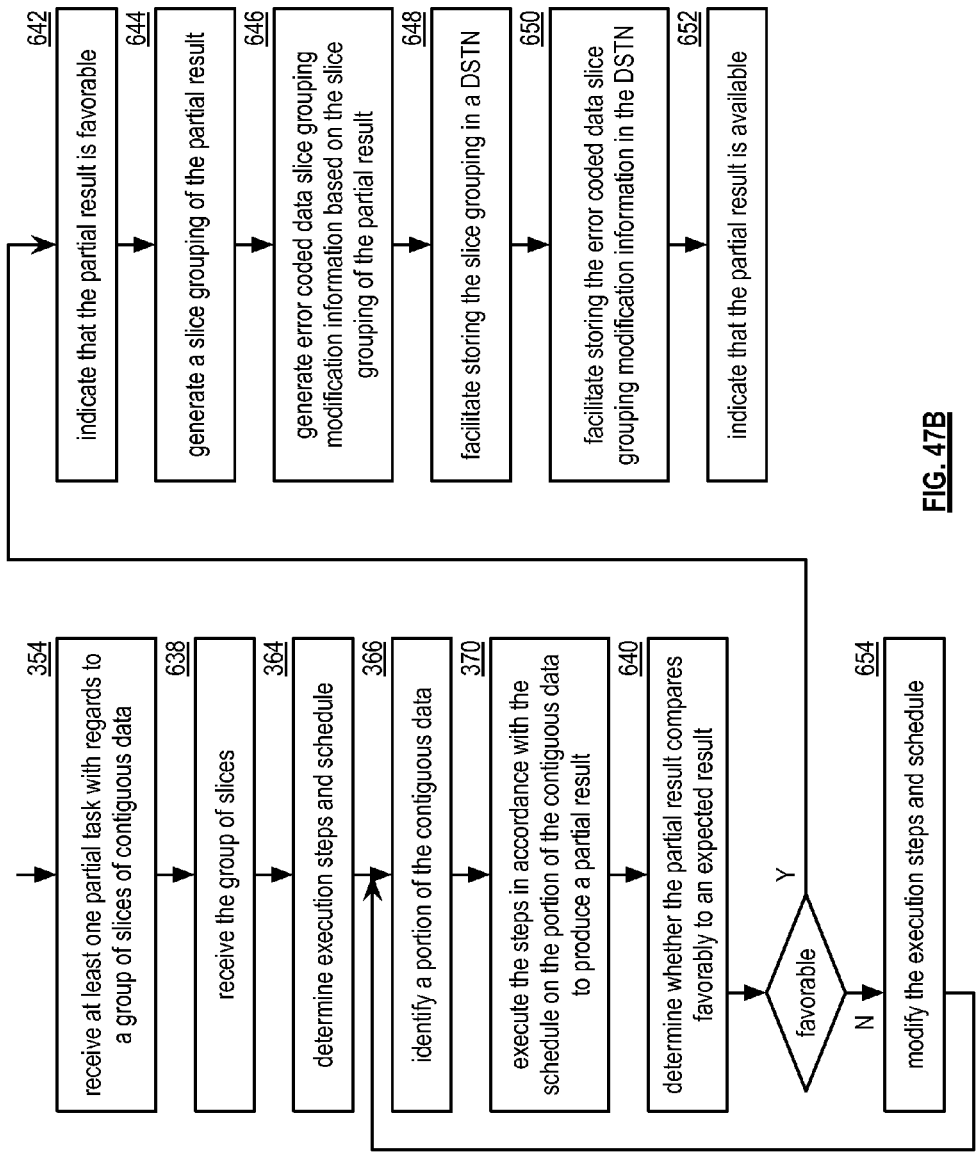
Figure 48A:
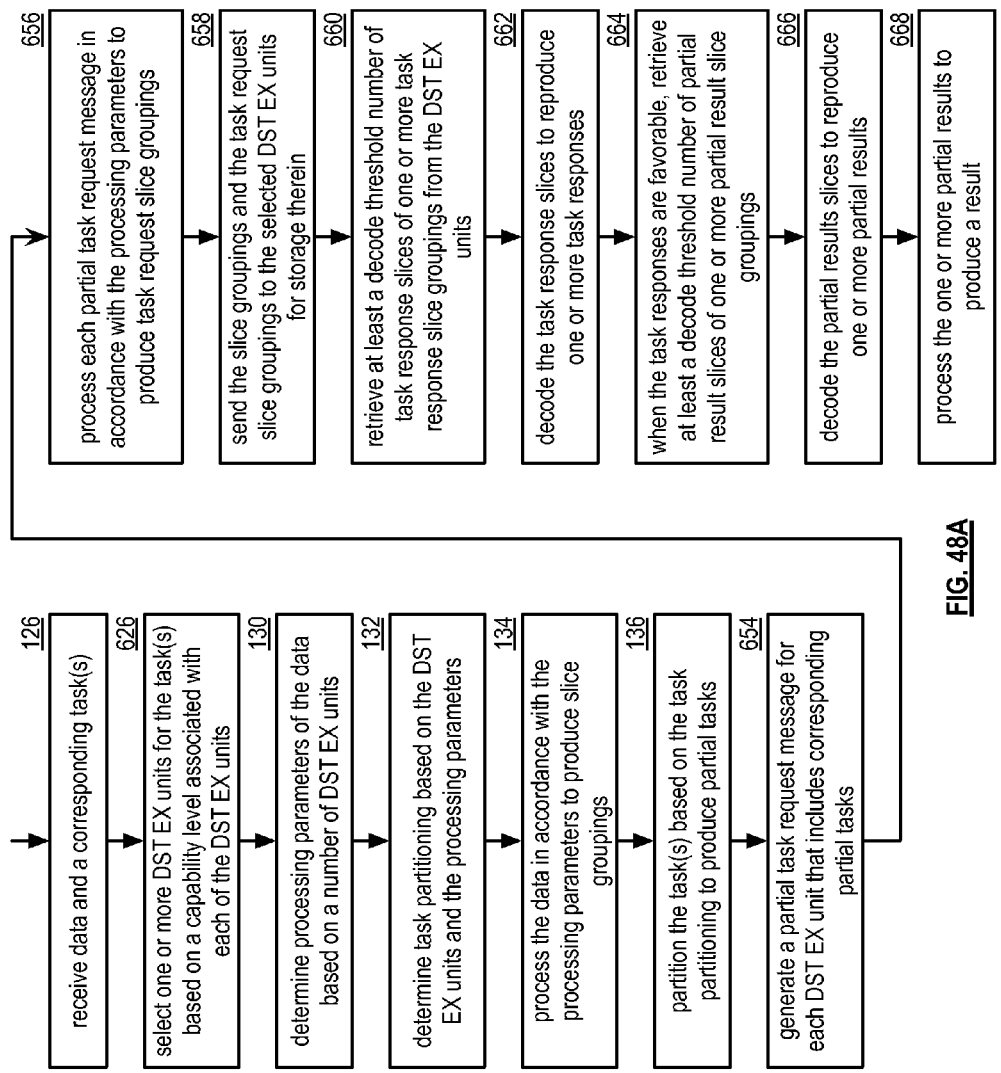
Figure 48B:
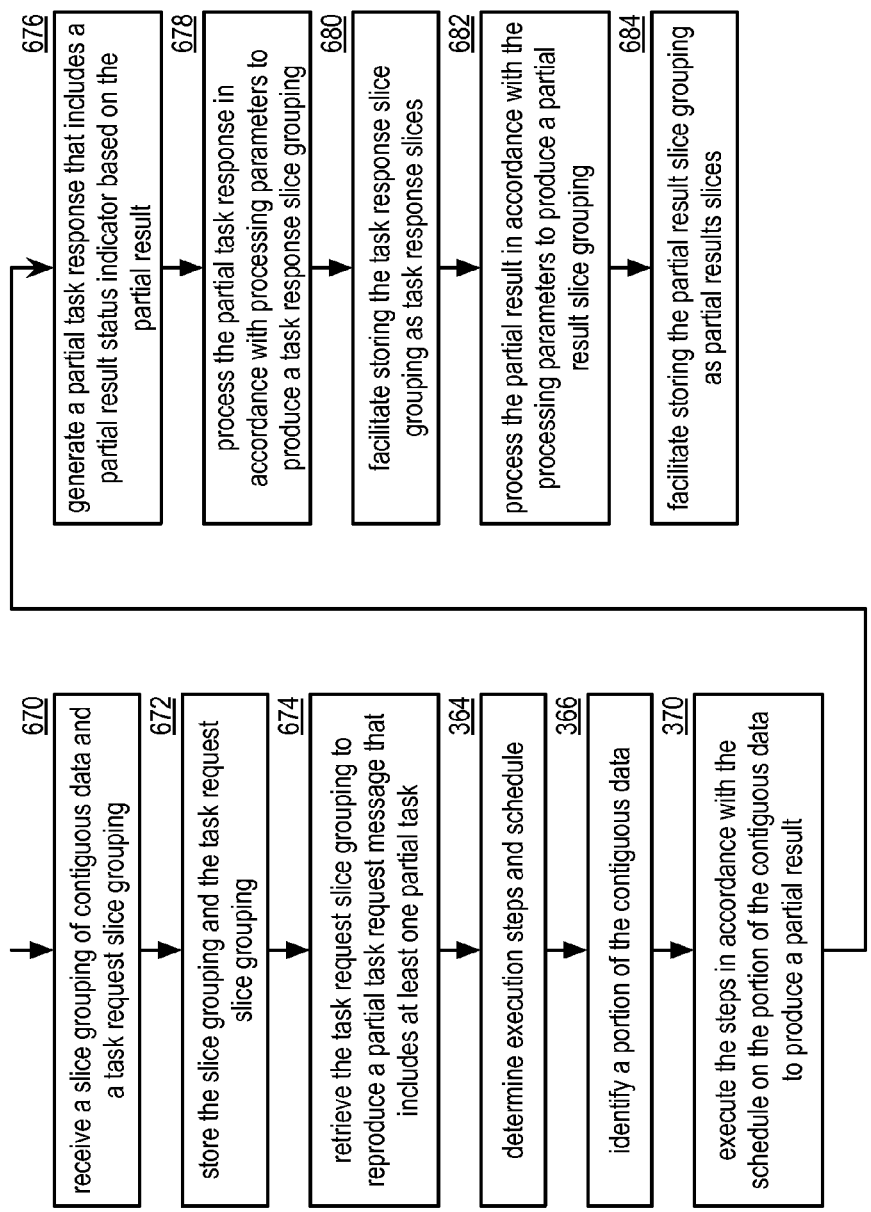
Figure 49:
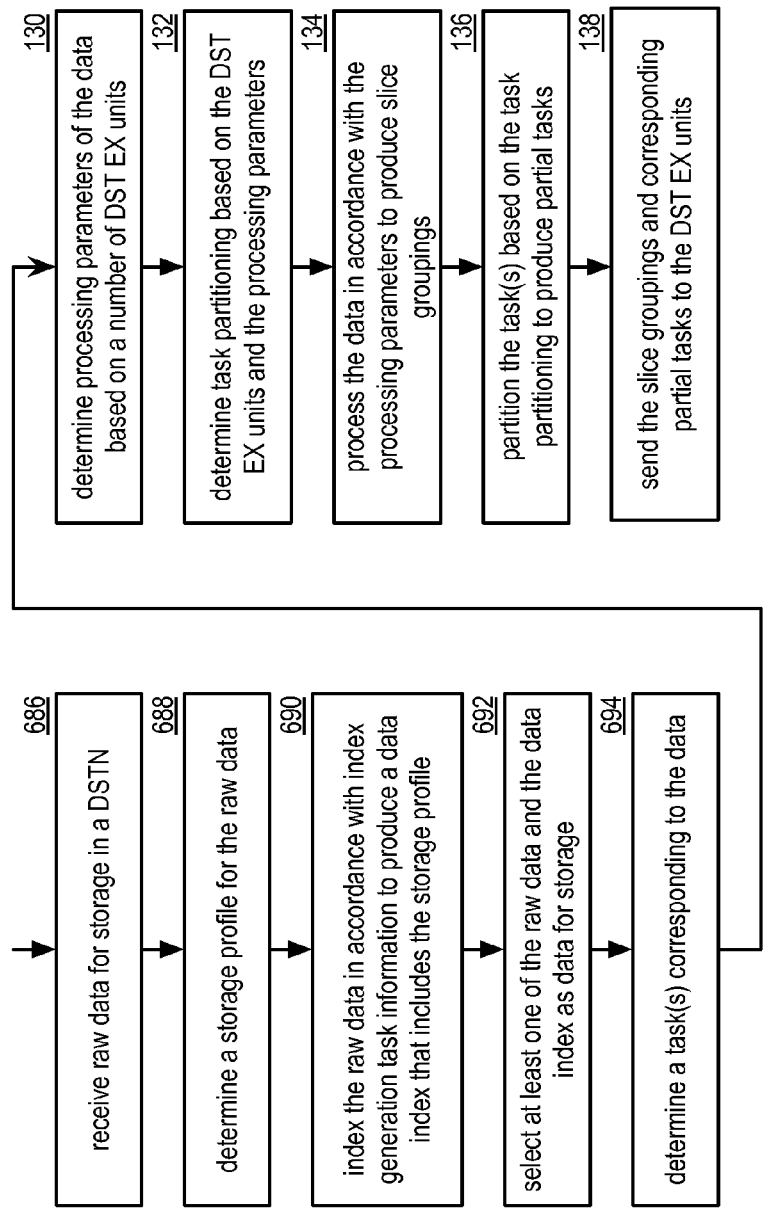
Figure 50:
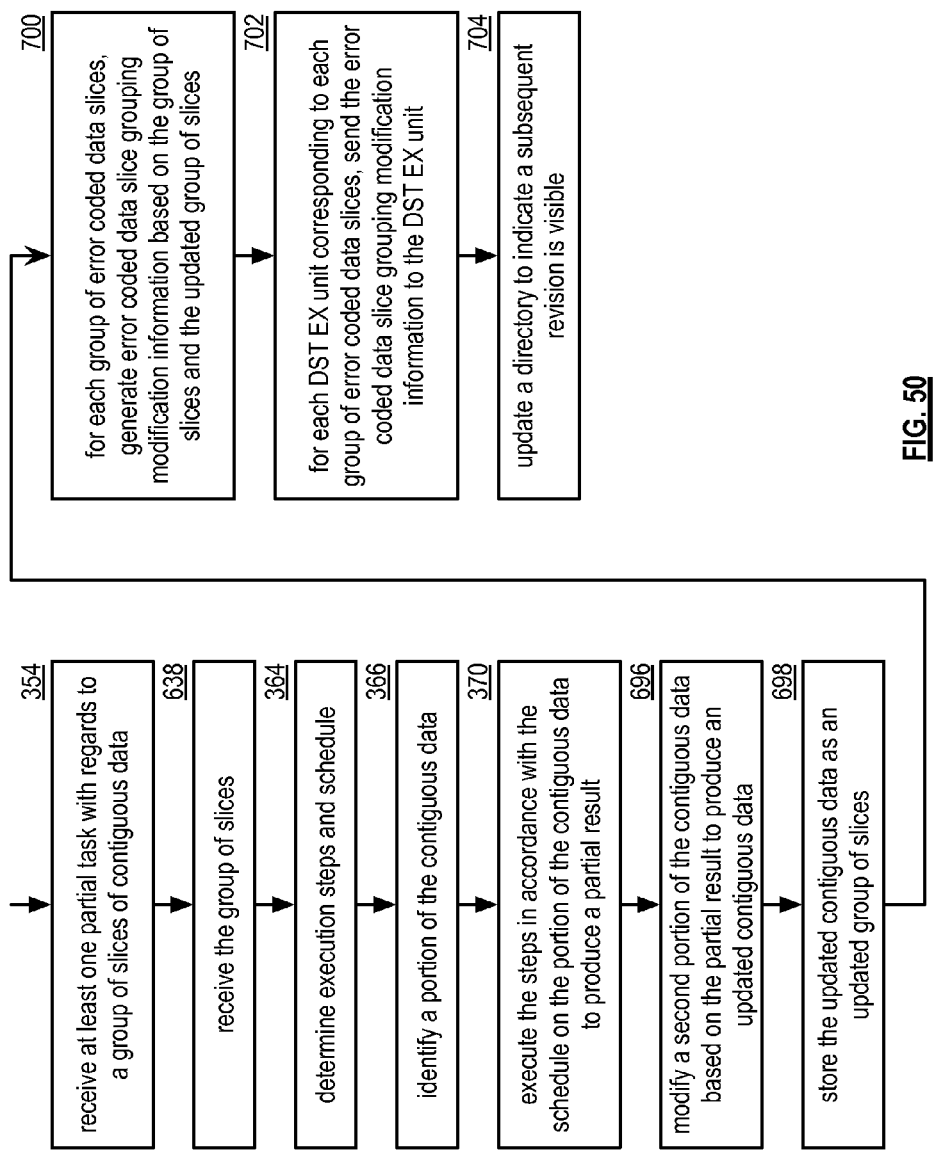
Figure 51:
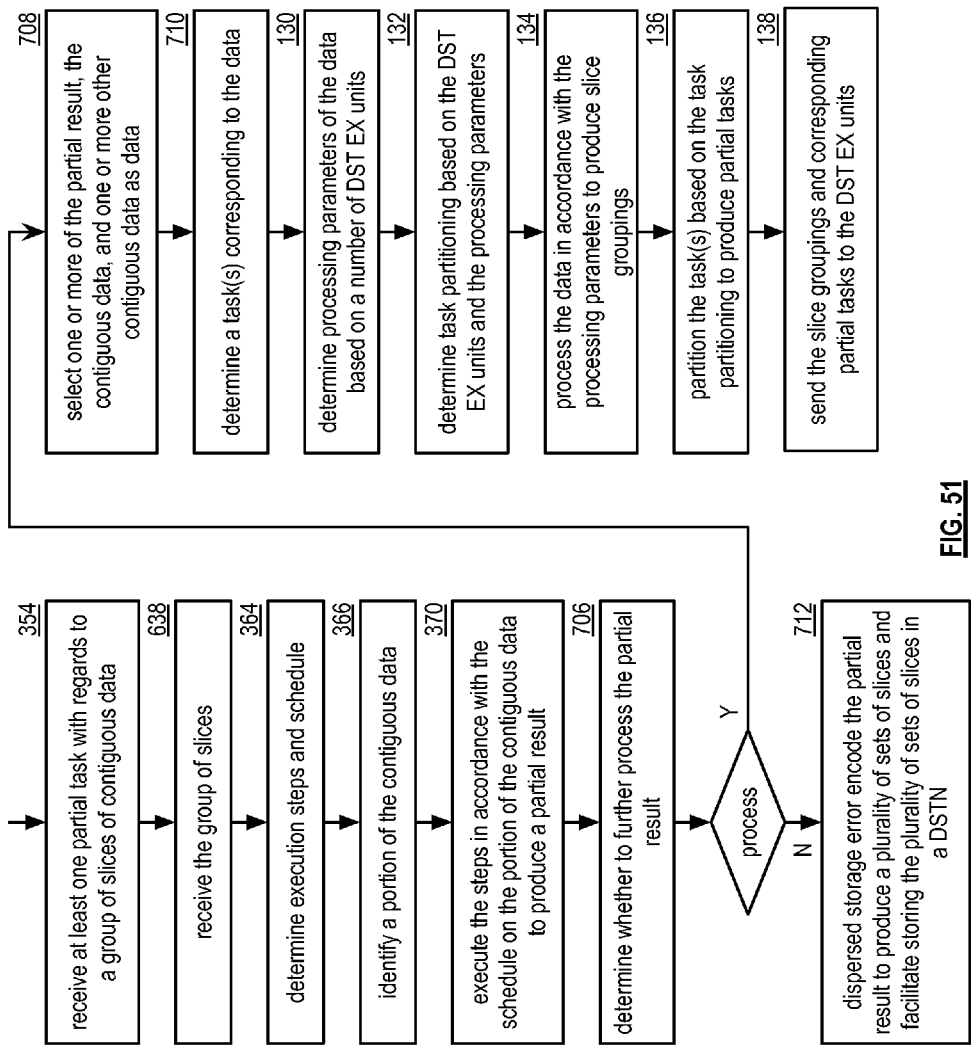
Figure 52:
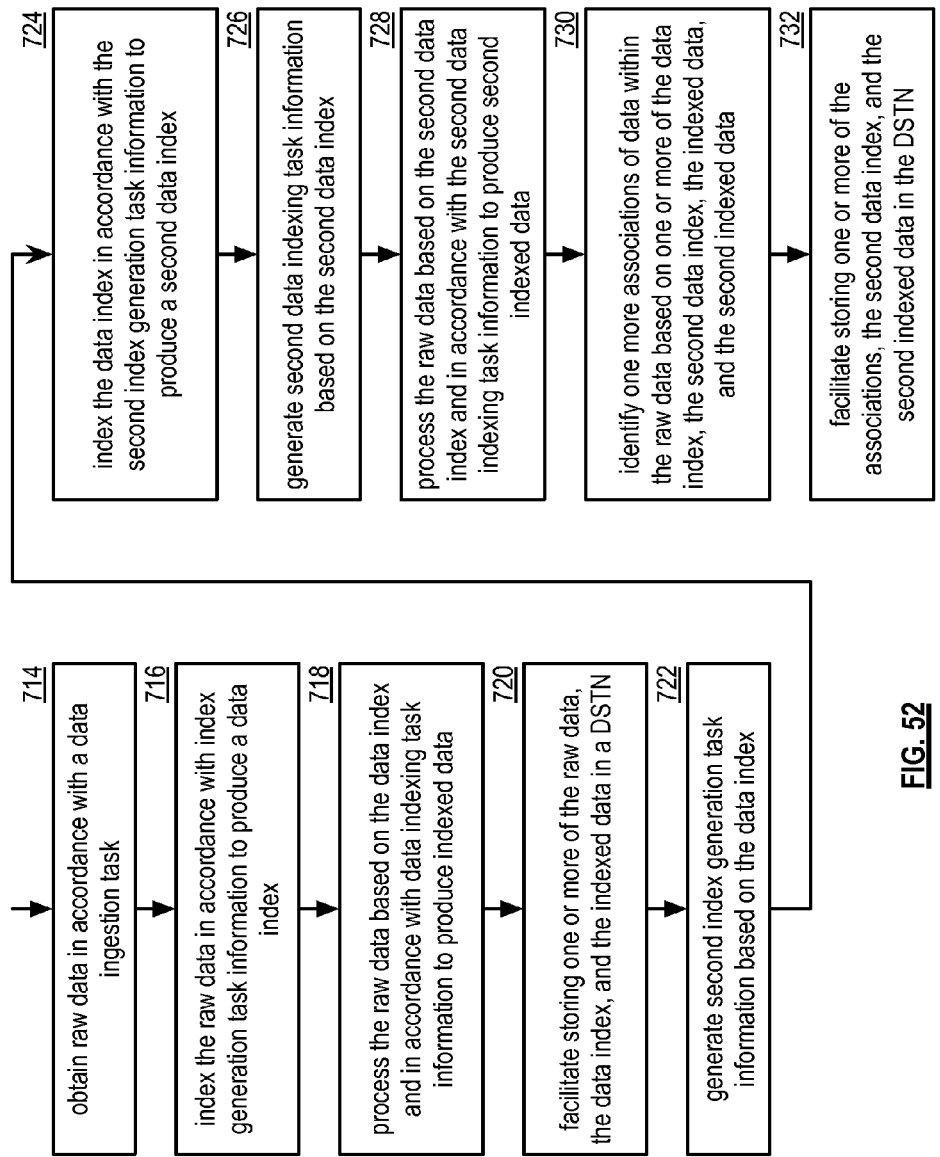
Figure 53A:
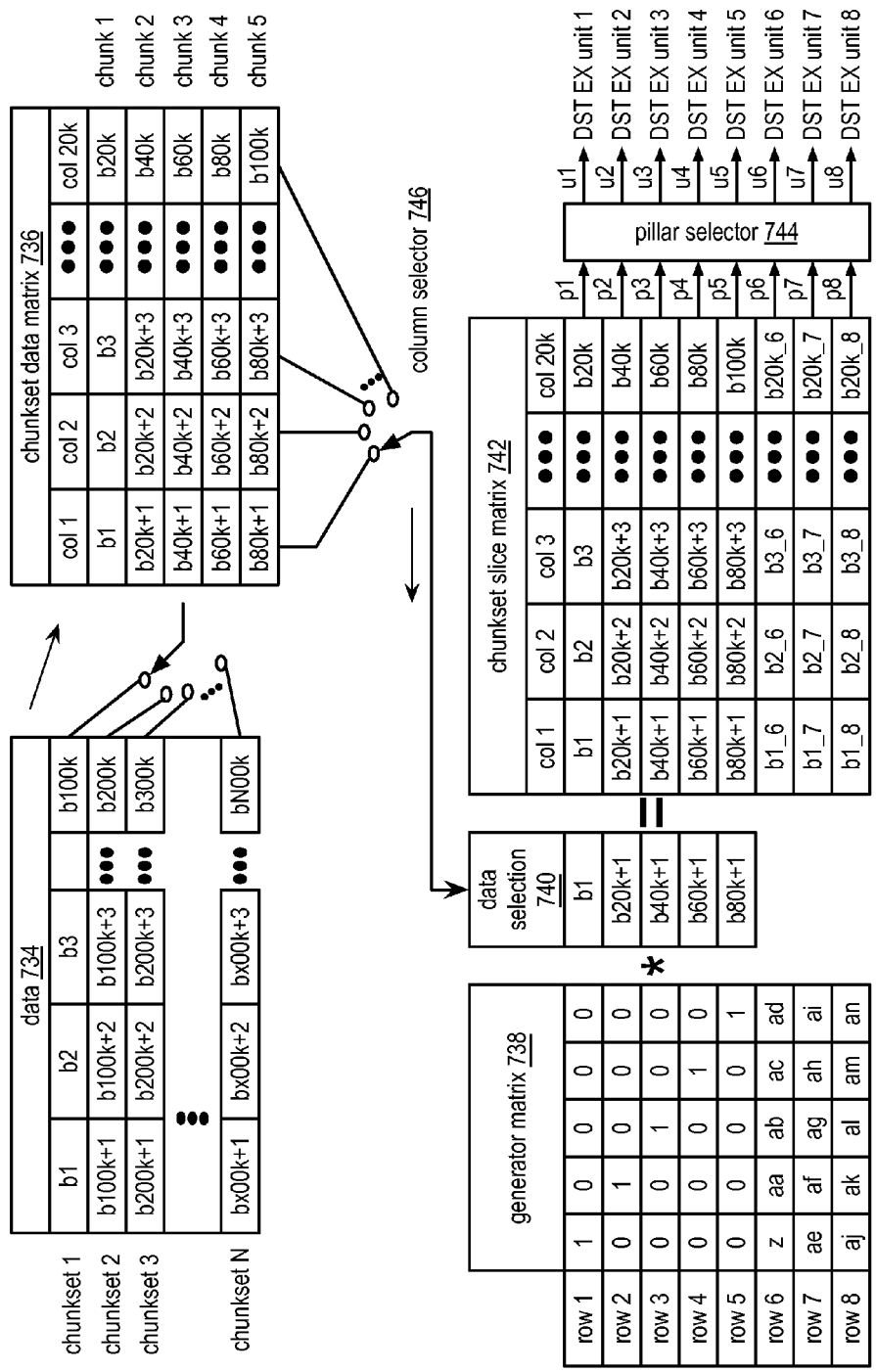
Figure 53B:
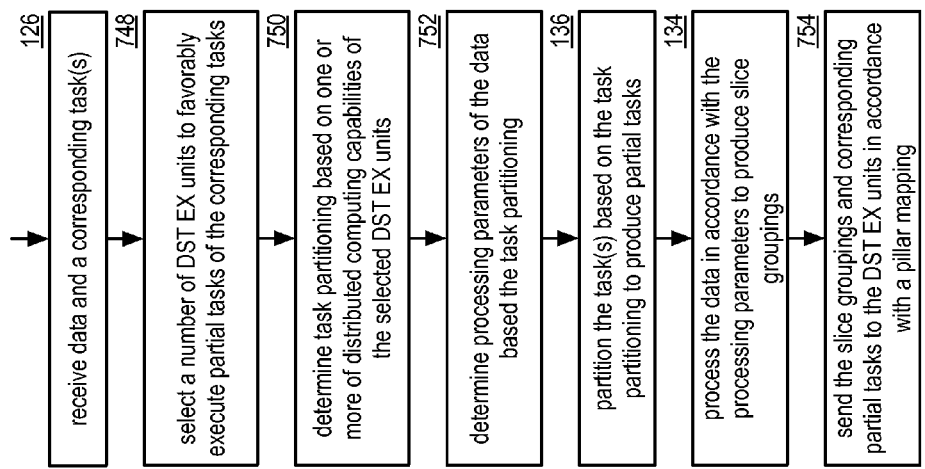
Figure 54:
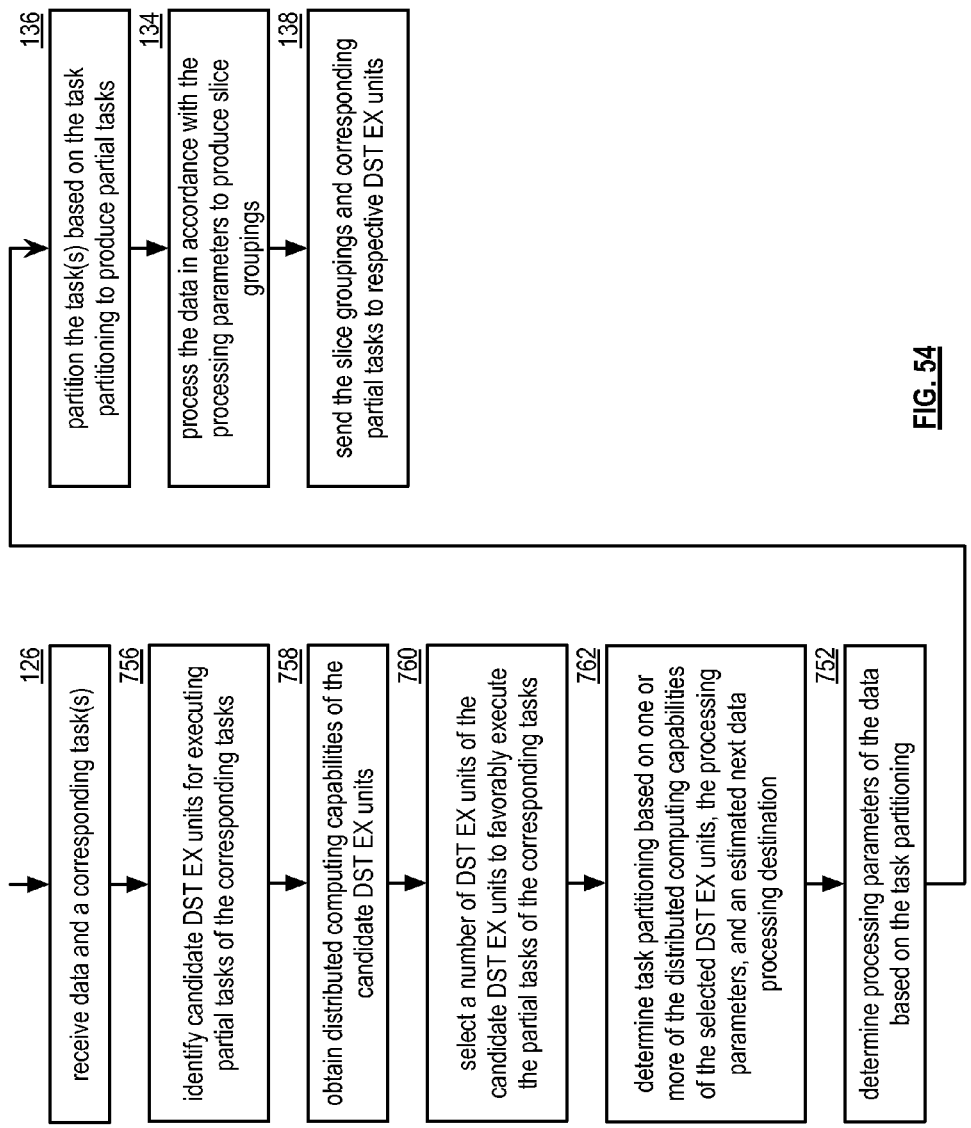
Figure 55:
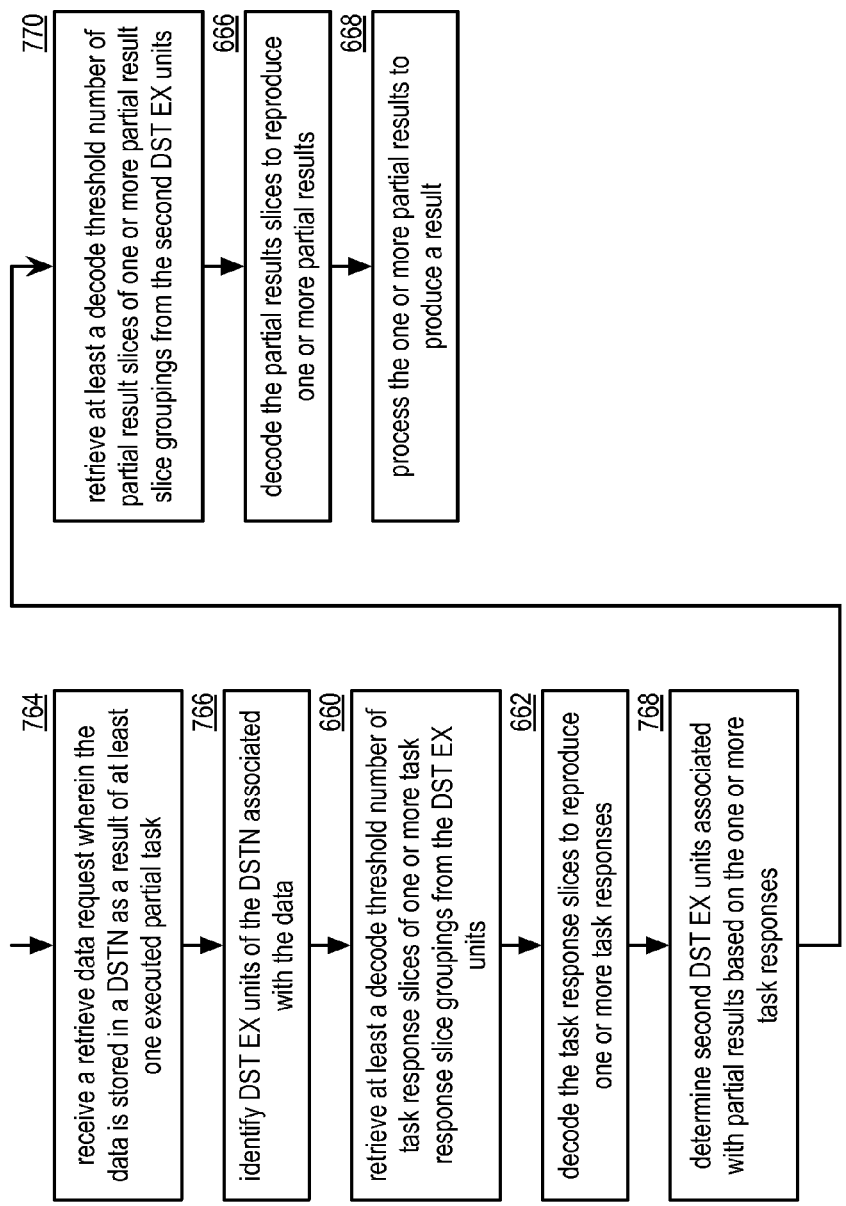
Figure 56:
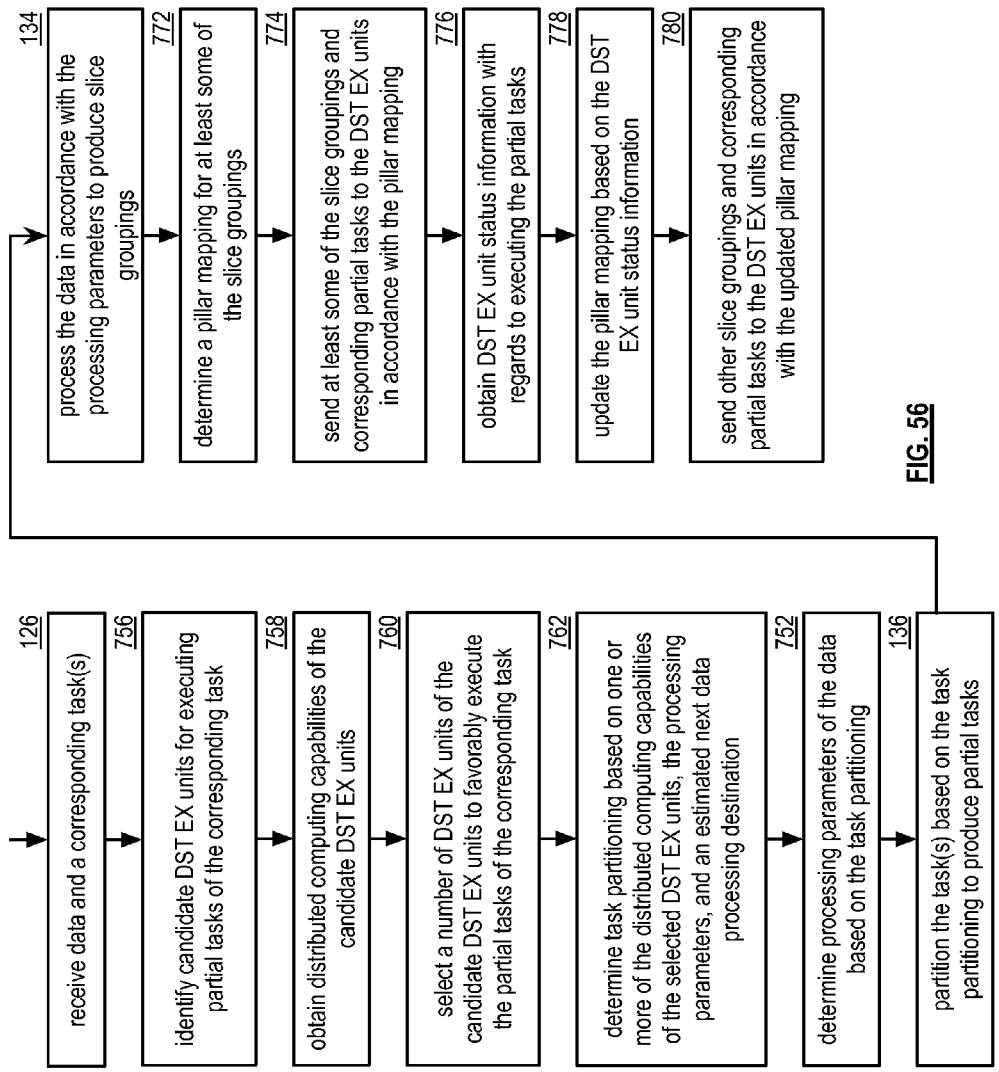
Figure 57:
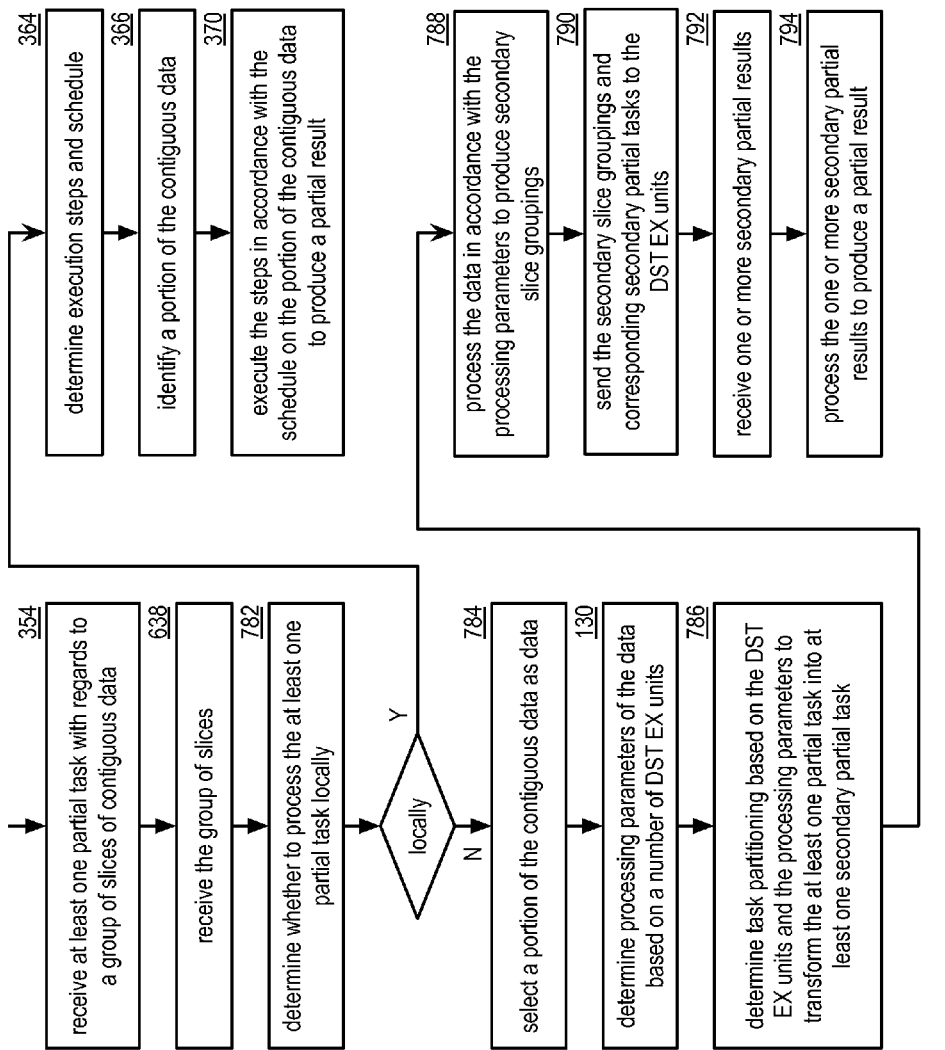
Figure 58A:
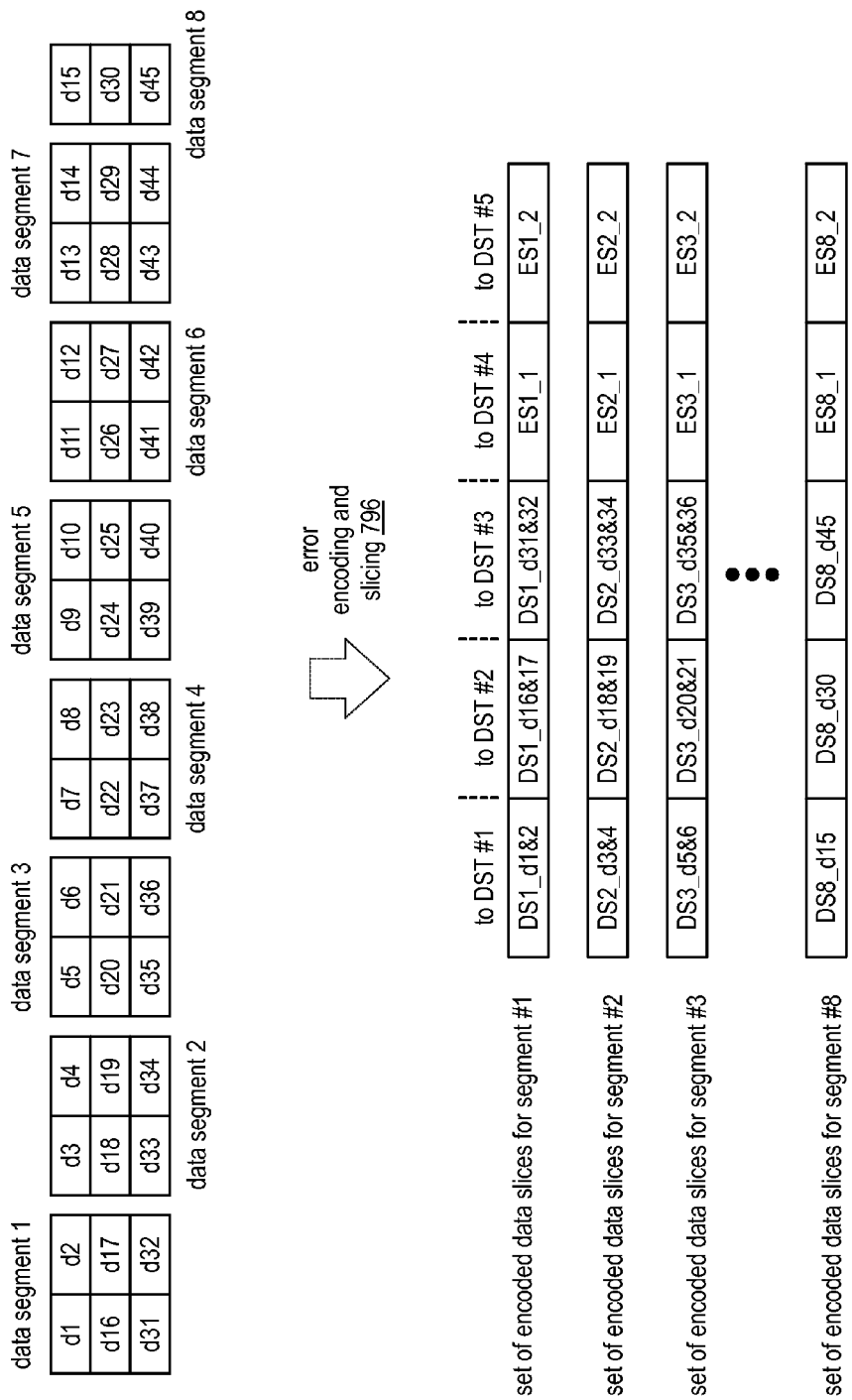
Figure 58B:
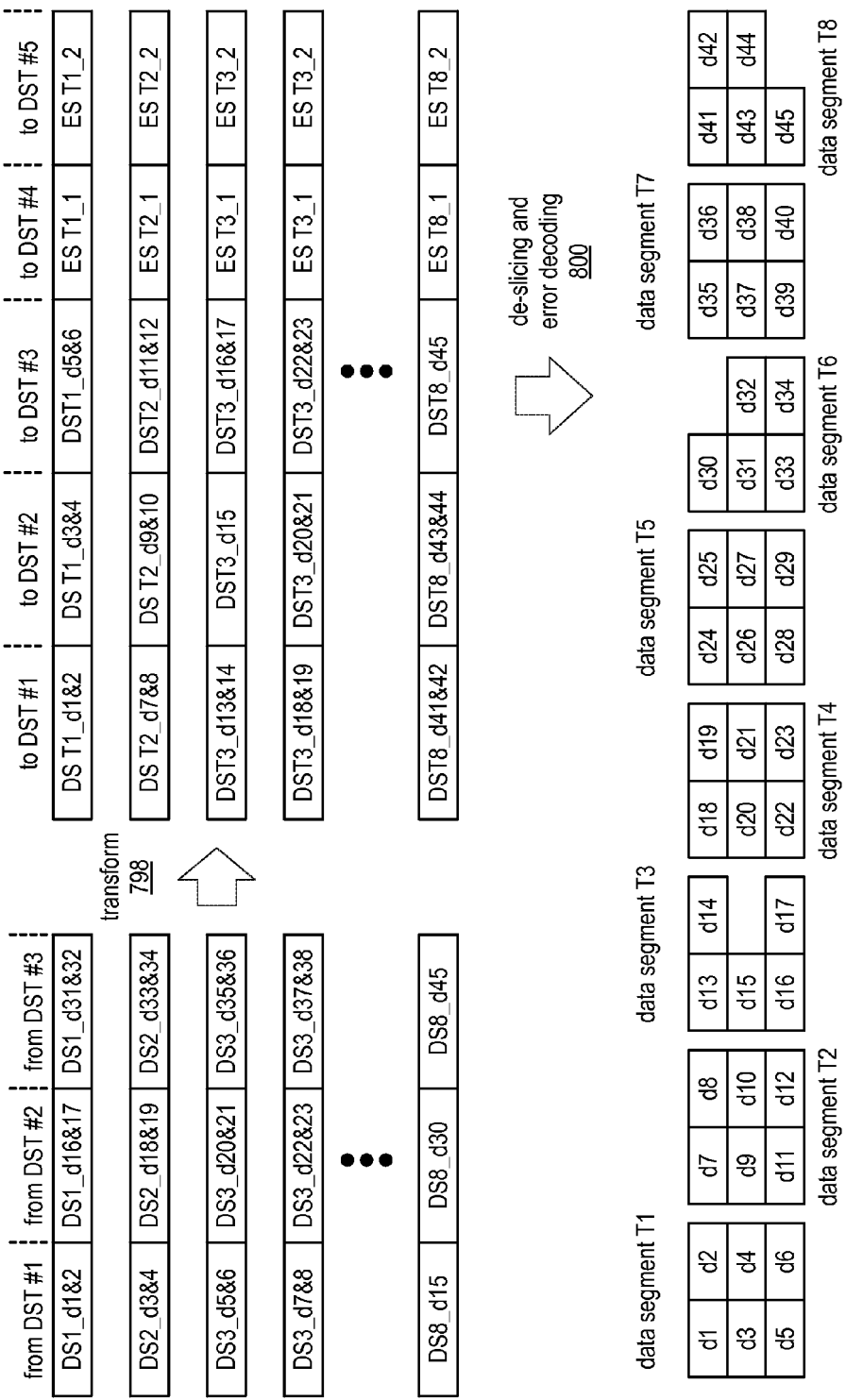
Figure 58C:
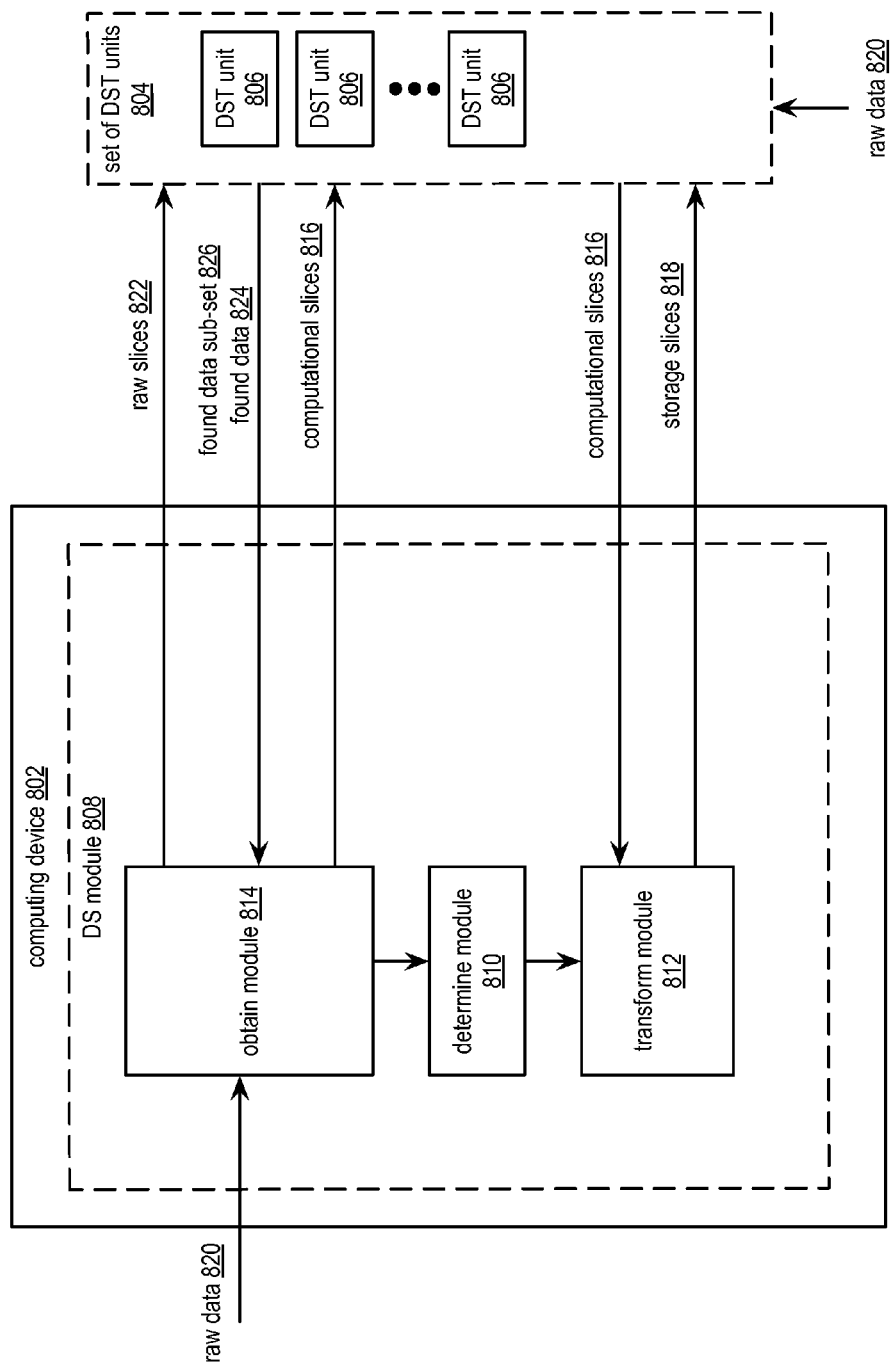
Figure 58D:
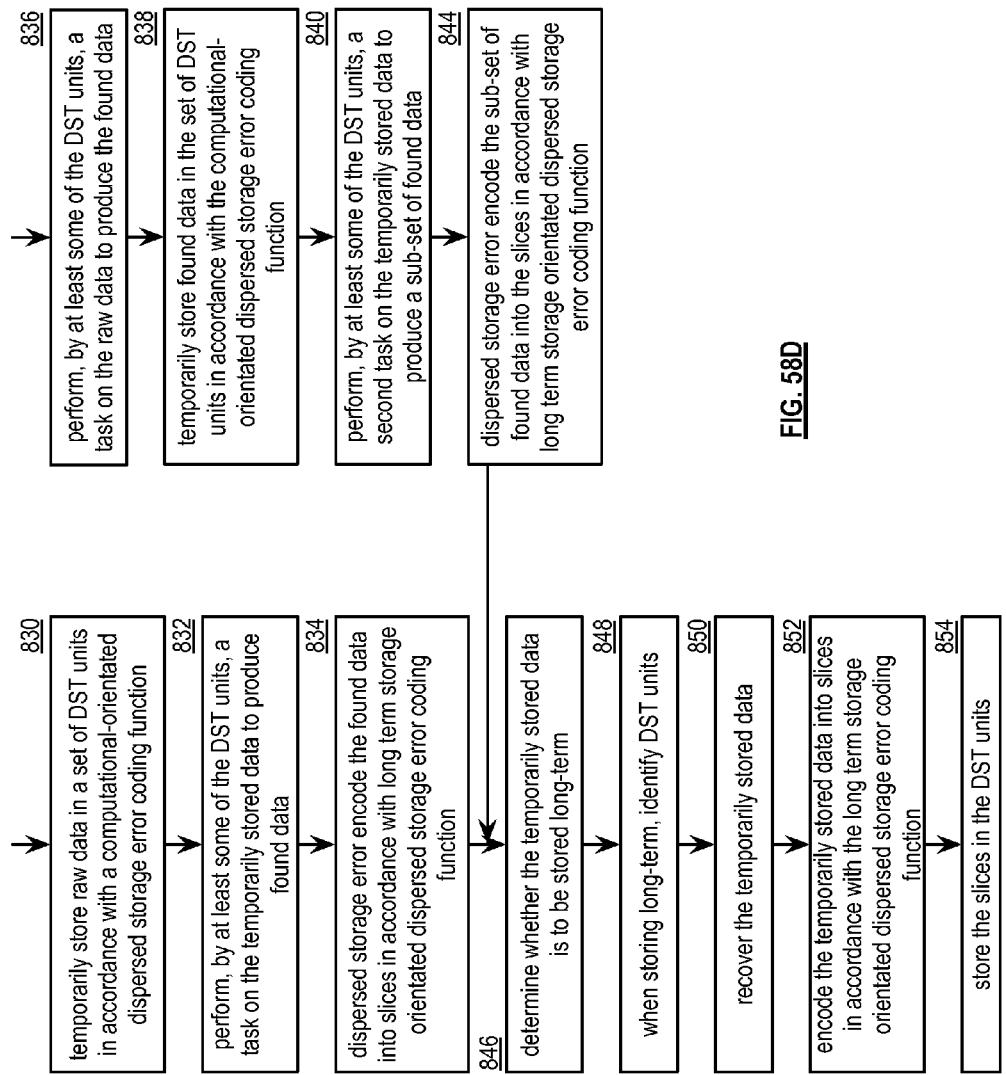
Figure 58E:
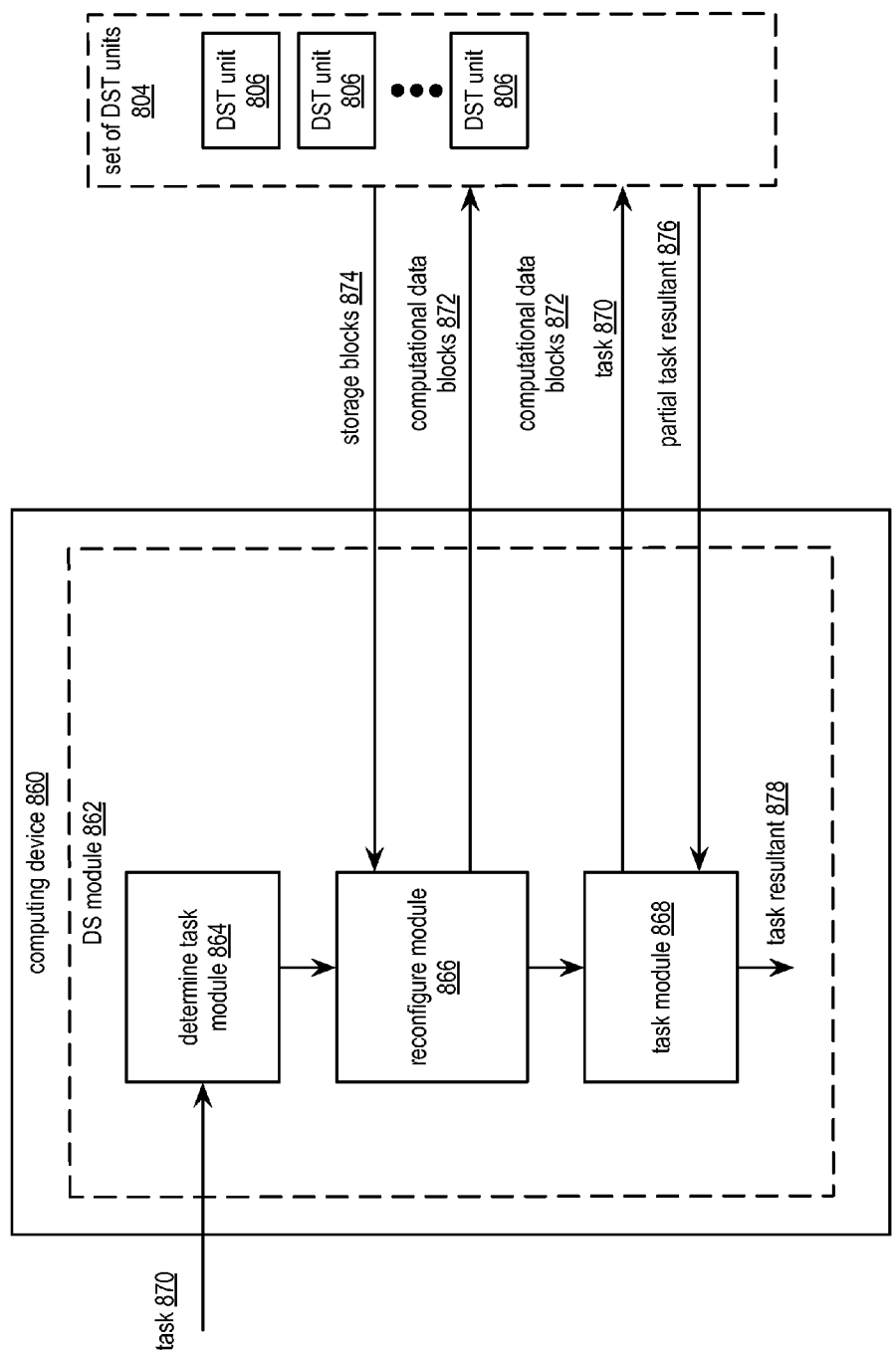
Figure 58F:
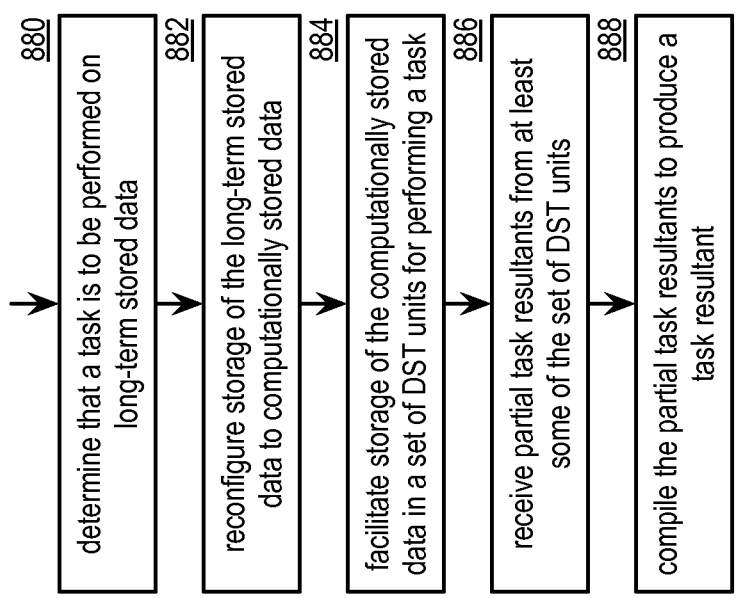
Figure 59:
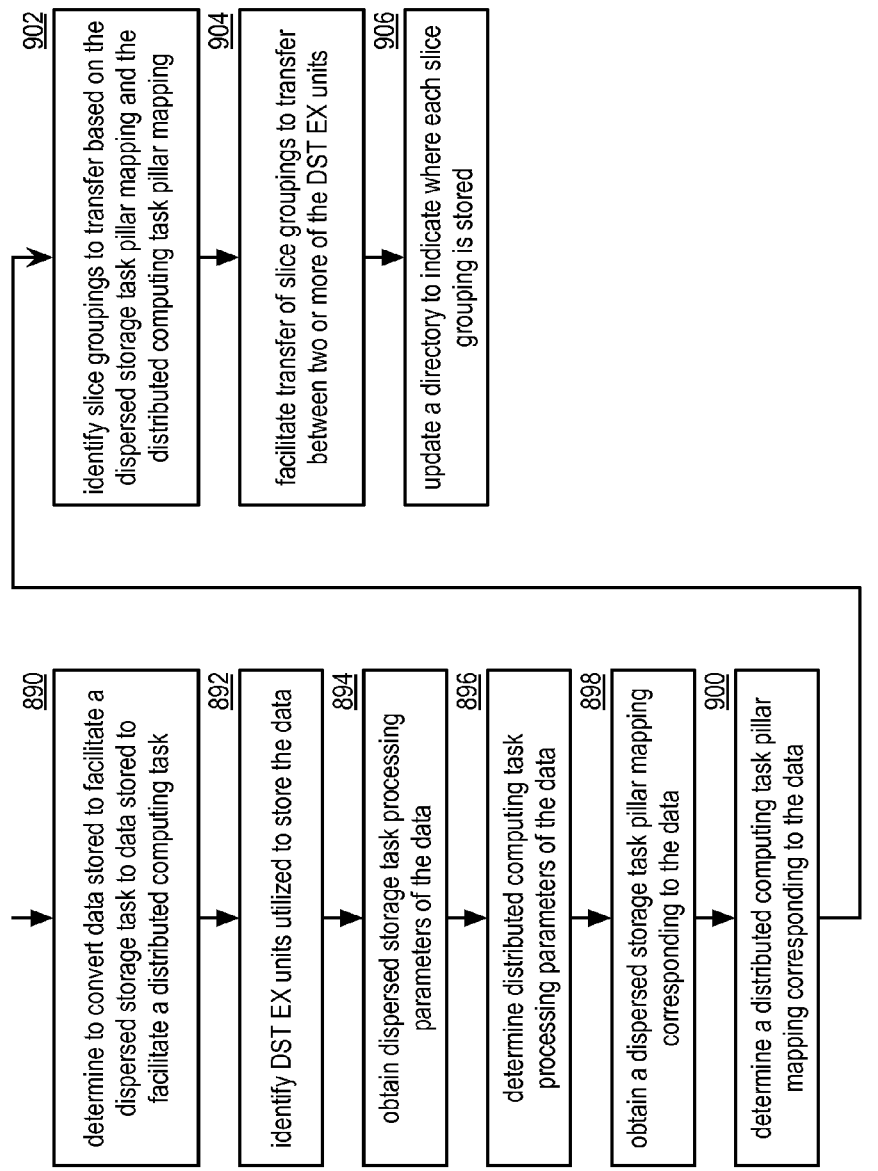
Figure 60A:
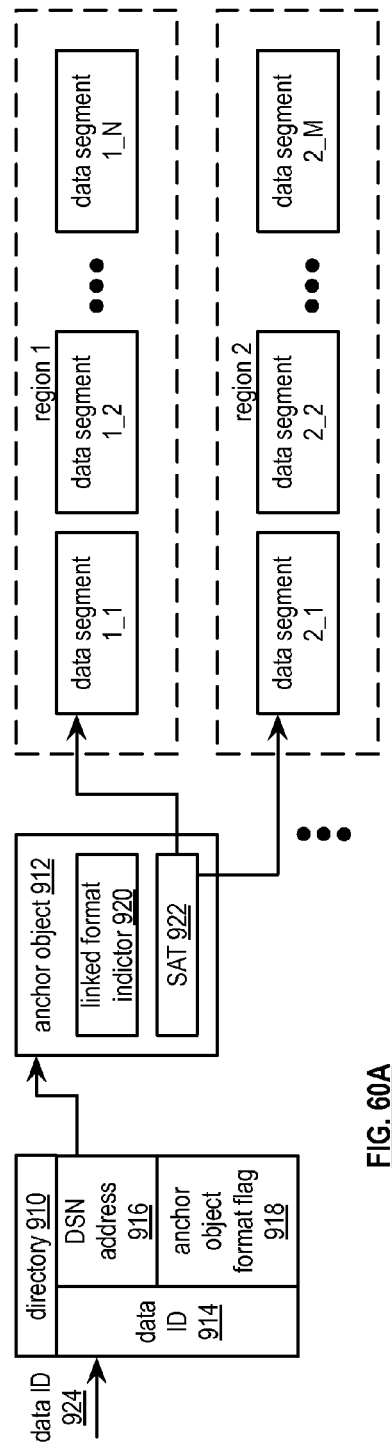
Figure 60B:
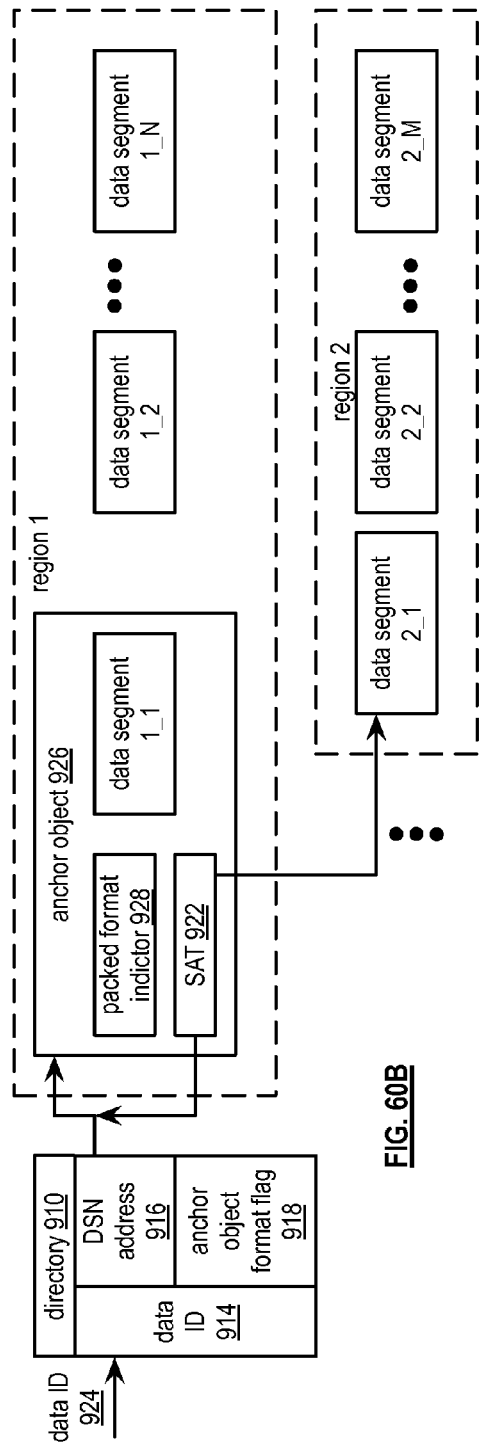
Figure 60C:
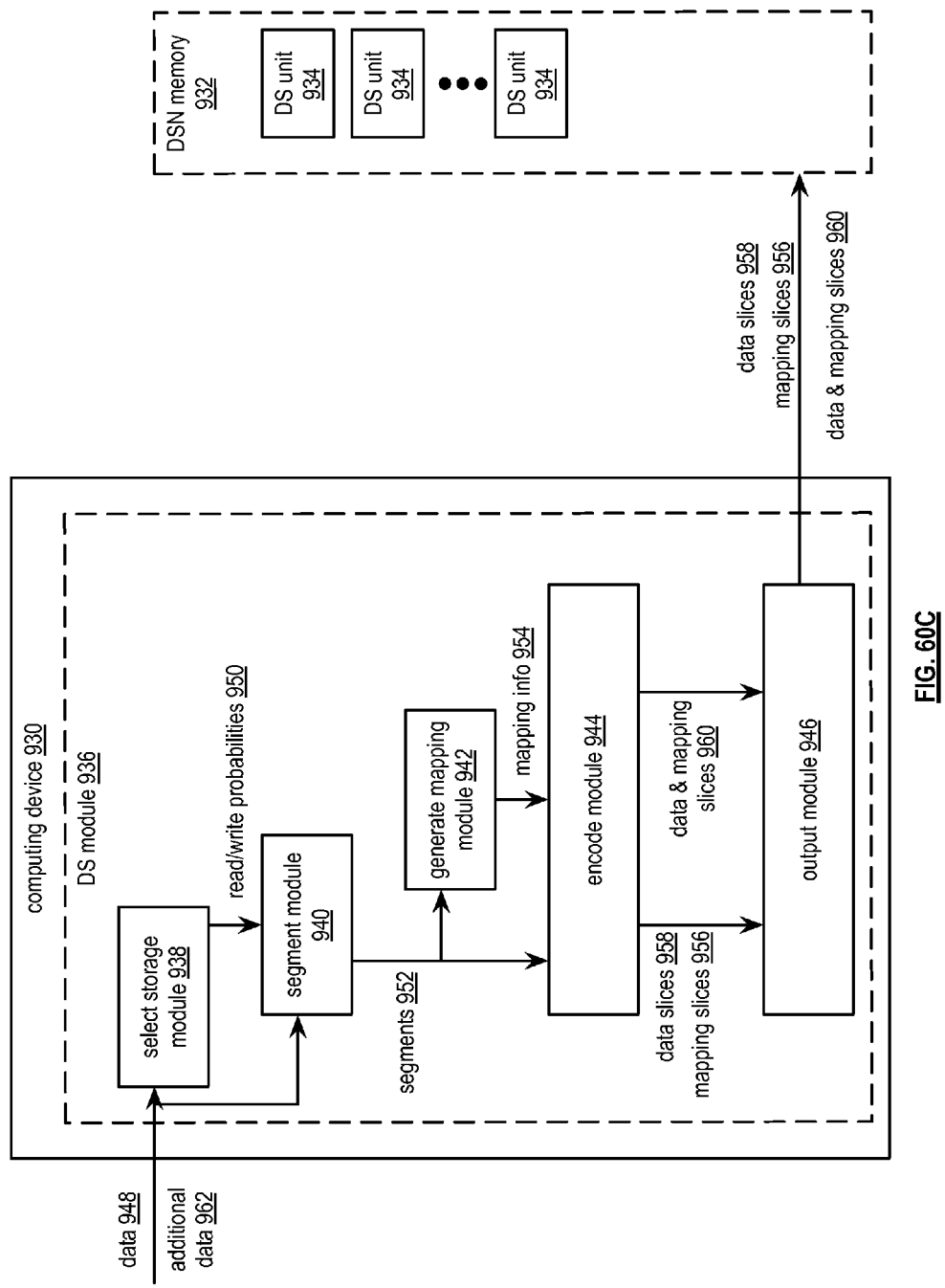
Figure 60D:
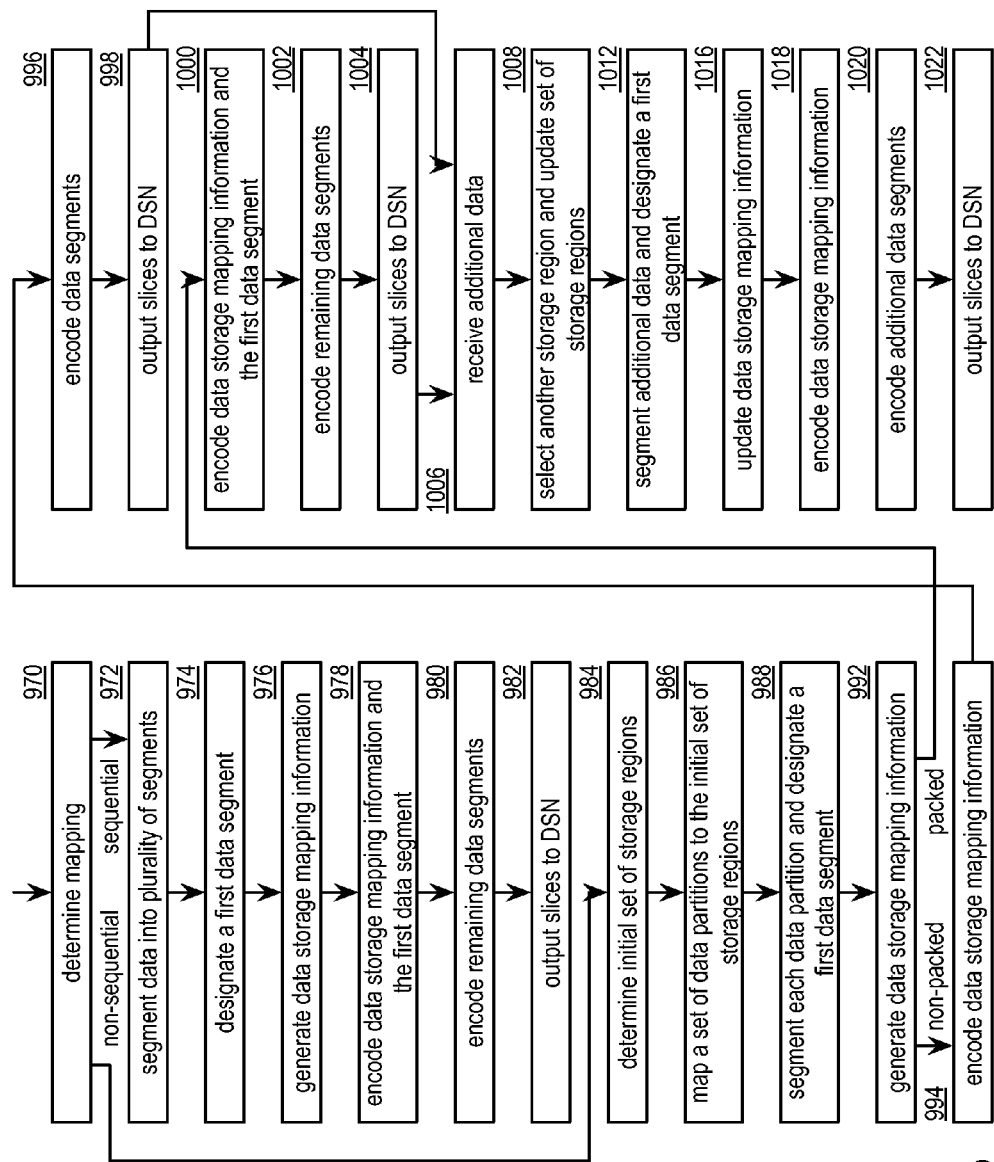
Figure 60E:
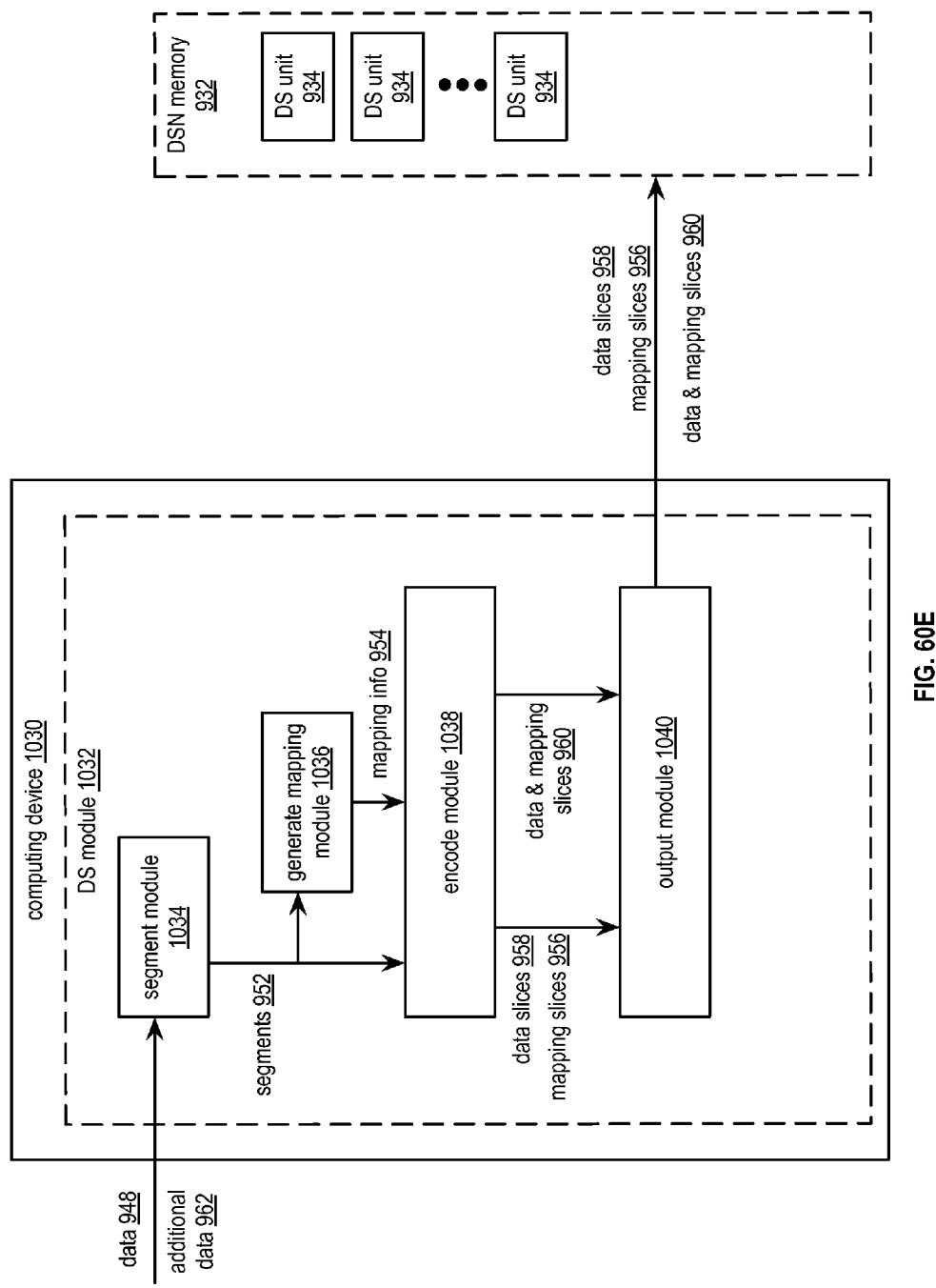
Figure 60F:
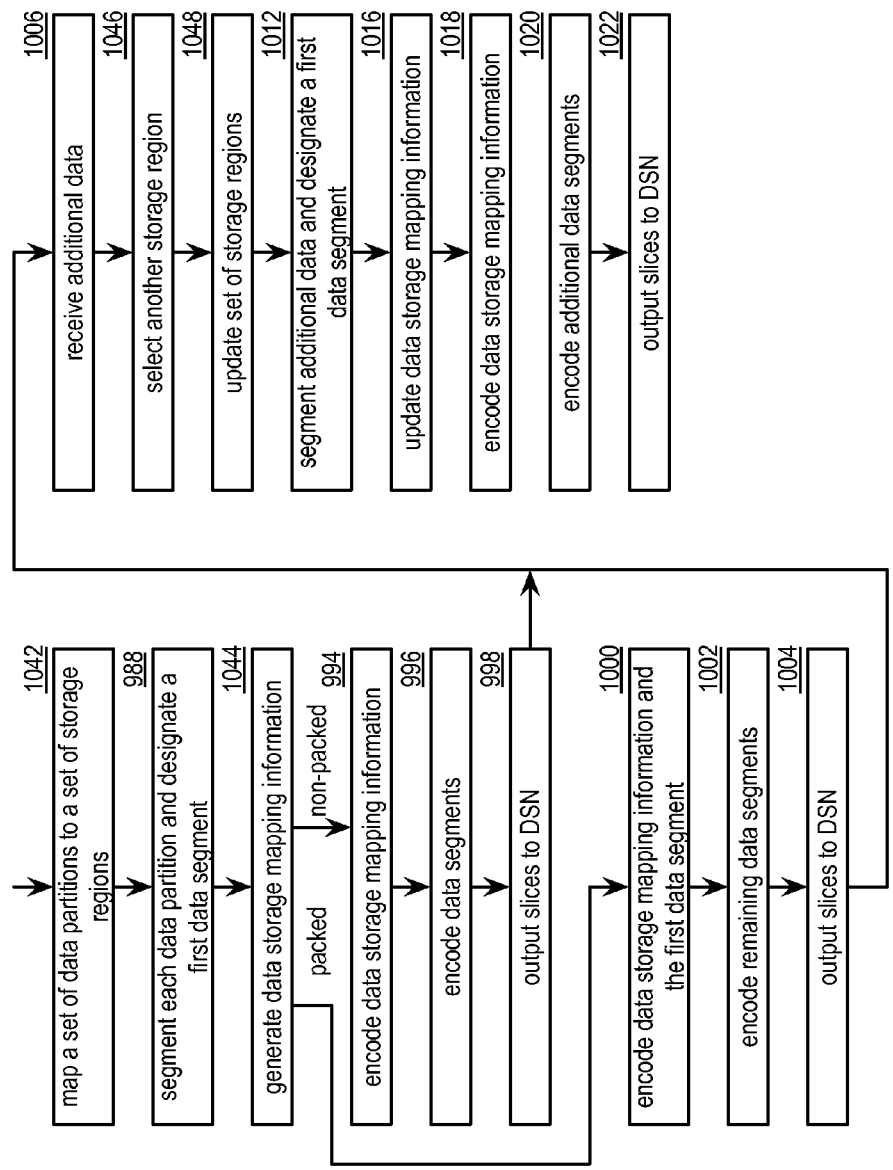
Figure 61A:
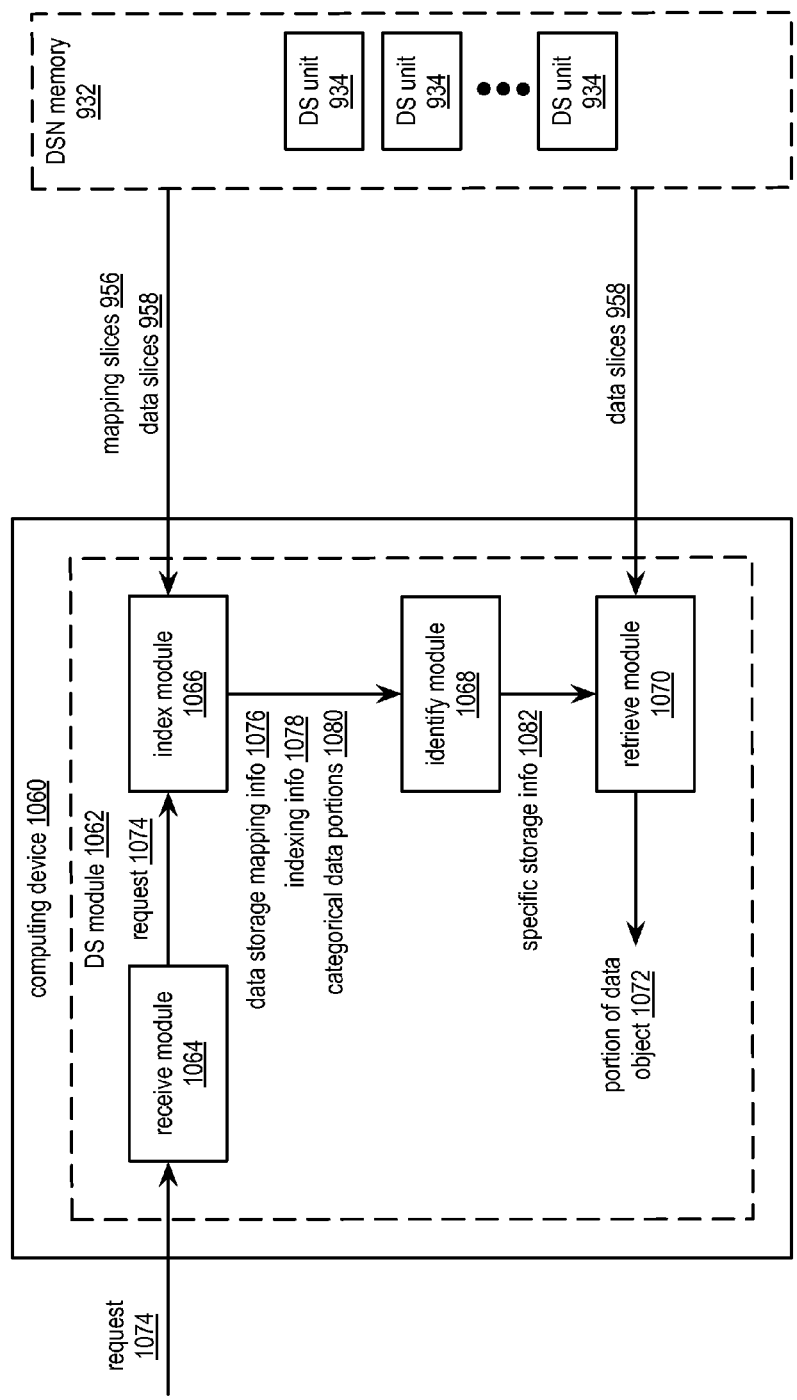
Figure 61B:
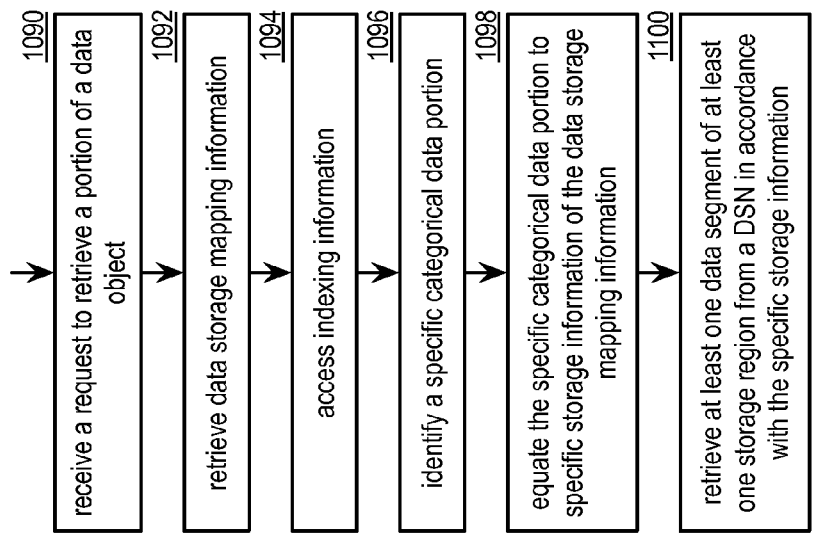
Figure 62:
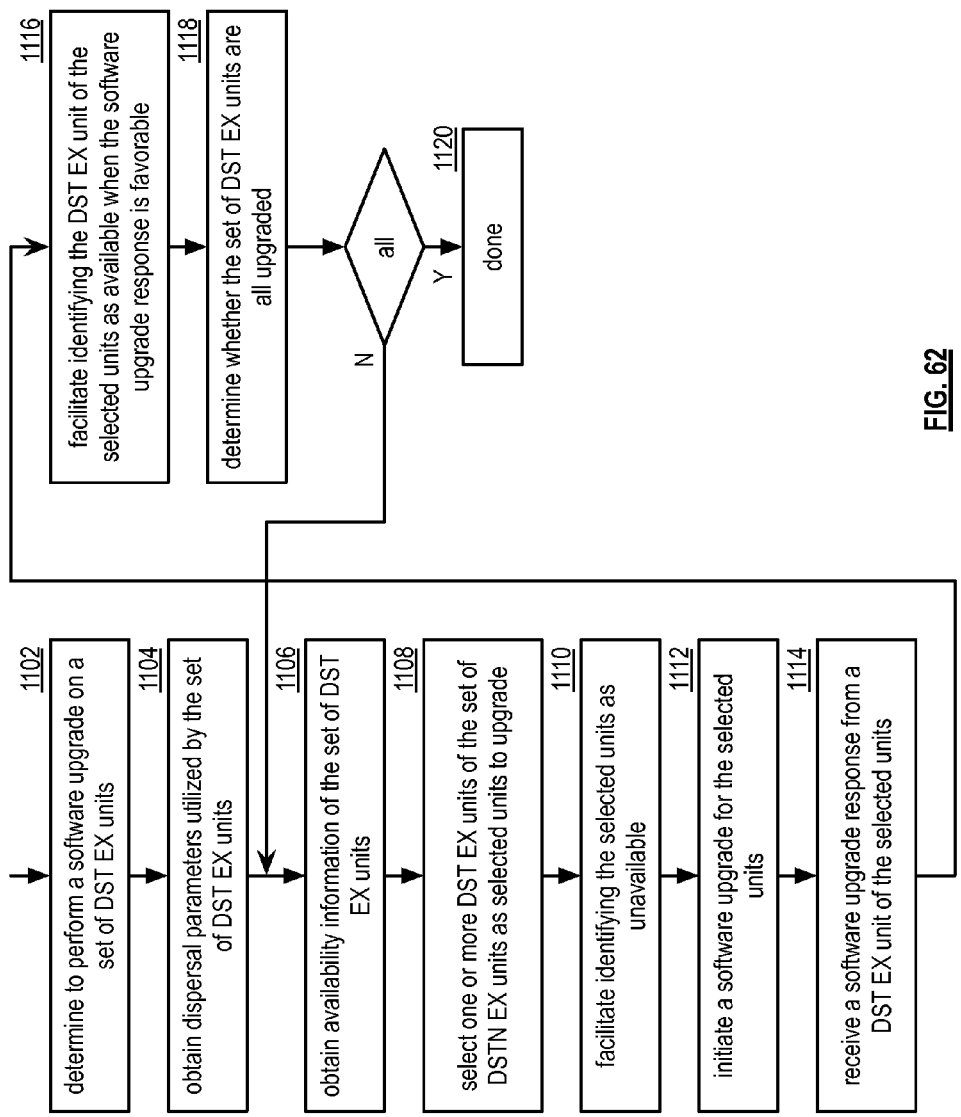

FIG. 41 is a flowchart illustrating another example of storing and processing a group of slices in accordance with the present invention;

FIG. 42A is a schematic block diagram of another embodiment of a distributed computing system in accordance with the present invention;

FIG. 42B is a flowchart illustrating an example of distributed computing of a task on data in accordance with the present invention;

FIG. 42C is a schematic block diagram of another embodiment of a distributed computing system in accordance with the present invention;

FIG. 42D is a flowchart illustrating an example of distributed computing of a task on stored data in accordance with the present invention;

FIG. 43A is a schematic block diagram of another embodiment of a distributed computing system in accordance with the present invention;

FIG. 43B is a flowchart illustrating an example of performing a partial task in accordance with the present invention;

FIG. 44A is a diagram of an example embodiment of a dispersed storage and task unit in accordance with the present invention;

FIG. 44B is a schematic block diagram of another embodiment of a distributed computing system in accordance with the present invention;

FIG. 44C is a flowchart illustrating an example of analyzing data in accordance with the present invention;

FIG. 45 is a flowchart illustrating an example of searching a data index in accordance with the present invention;

FIG. 46 is a flowchart illustrating another example of searching a data index in accordance with the present invention;

FIG. 47A is a flowchart illustrating an example of initiating threshold computing in accordance with the present invention;

FIG. 47B is a flowchart illustrating an example of processing a threshold computing task in accordance with the present invention;

FIG. 48A is a flowchart illustrating an example of generating a task in accordance with the invention;

FIG. 48B is a flowchart illustrating an example of initiating a task in accordance with the present invention;

FIG. 49 is a flowchart illustrating another example of ingesting data in accordance with the present invention;

FIG. 50 is a flowchart illustrating an example of modifying a slice grouping in accordance with the present invention;

FIG. 51 is a flowchart illustrating an example of further processing of a group of slices in accordance with the present invention;

FIG. 52 is a flowchart illustrating an example of identifying data associations in accordance with the present invention;

FIG. 53A is a diagram illustrating encoding of data in accordance with the present invention;

FIG. 53B is a flowchart illustrating an example of generating a slice grouping in accordance with the present invention;

FIG. 54 is a flow chart illustrating an example of selecting distributed computing resources in accordance with the present invention;

FIG. 55 is a flowchart illustrating an example of retrieving distributed computed data in accordance with the present invention;

FIG. 56 is a flowchart illustrating an example of load-balancing distributed computing resources in accordance with the present invention;

FIG. 57 is a flowchart illustrating an example of transforming a task into sub-tasks in accordance with the present invention;

FIG. 58A is a diagram of another example of error encoding and slicing processing of dispersed error encoding in accordance with the present invention;

FIG. 58B is a diagram of an example of transforming data blocks in accordance with the present invention;

FIG. 58C is a schematic block diagram of another embodiment of a distributed computing system in accordance with the present invention;

FIG. 58D is a flowchart illustrating an example of transforming data in accordance with the present invention;

FIG. 58E is a schematic block diagram of another embodiment of a distributed computing system in accordance with the present invention;

FIG. 58F is a flowchart illustrating another example of transforming data in accordance with the present invention;

FIG. 59 is a flowchart illustrating another example of transforming store data in accordance with the present invention;

FIG. 60A is a diagram illustrating an example of non-sequential data segment storage mapping in accordance with the present invention;

FIG. 60B is a diagram illustrating an example of sequential data segment storage mapping in accordance with the present invention;

FIG. 60C is a schematic block diagram of an embodiment of a distributed storage network in accordance with the present invention;

FIG. 60D is a flowchart illustrating another example of storing data in accordance with the present invention;

FIG. 60E is a schematic block diagram of another embodiment of a distributed storage network in accordance with the present invention;

FIG. 60F is a flowchart illustrating another example of storing data in accordance with the present invention;

FIG. 61A is a schematic block diagram of another embodiment of a distributed storage network in accordance with the present invention;

FIG. 61B is a flowchart illustrating an example of retrieving data in accordance with the present invention; and FIG. 62 is a flowchart illustrating an example of upgrading software in accordance with the present invention.

DETAILED DESCRIPTION OF THE INVENTION

Figure 1:
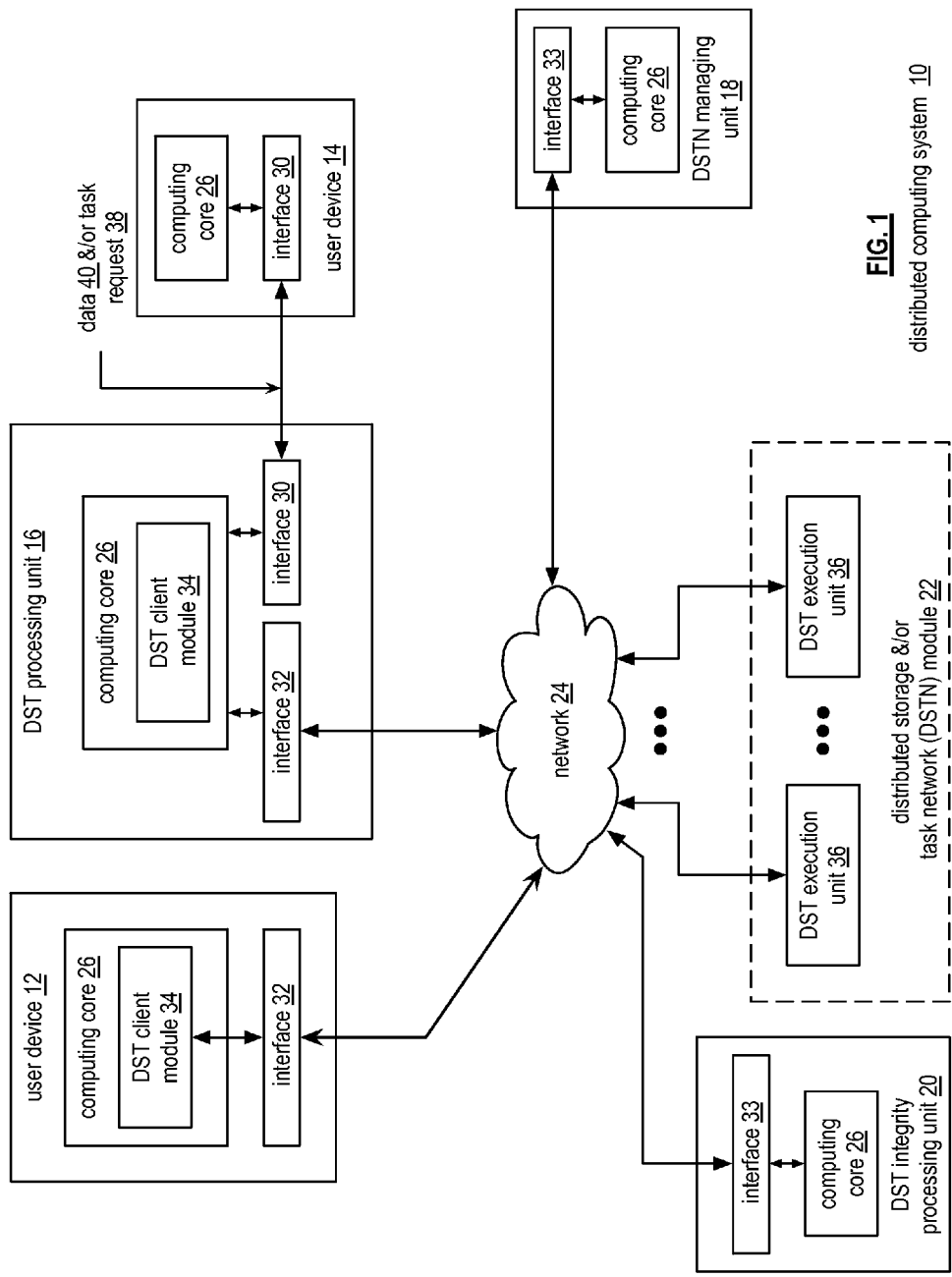
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interfaces 30 support a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g. or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing module 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
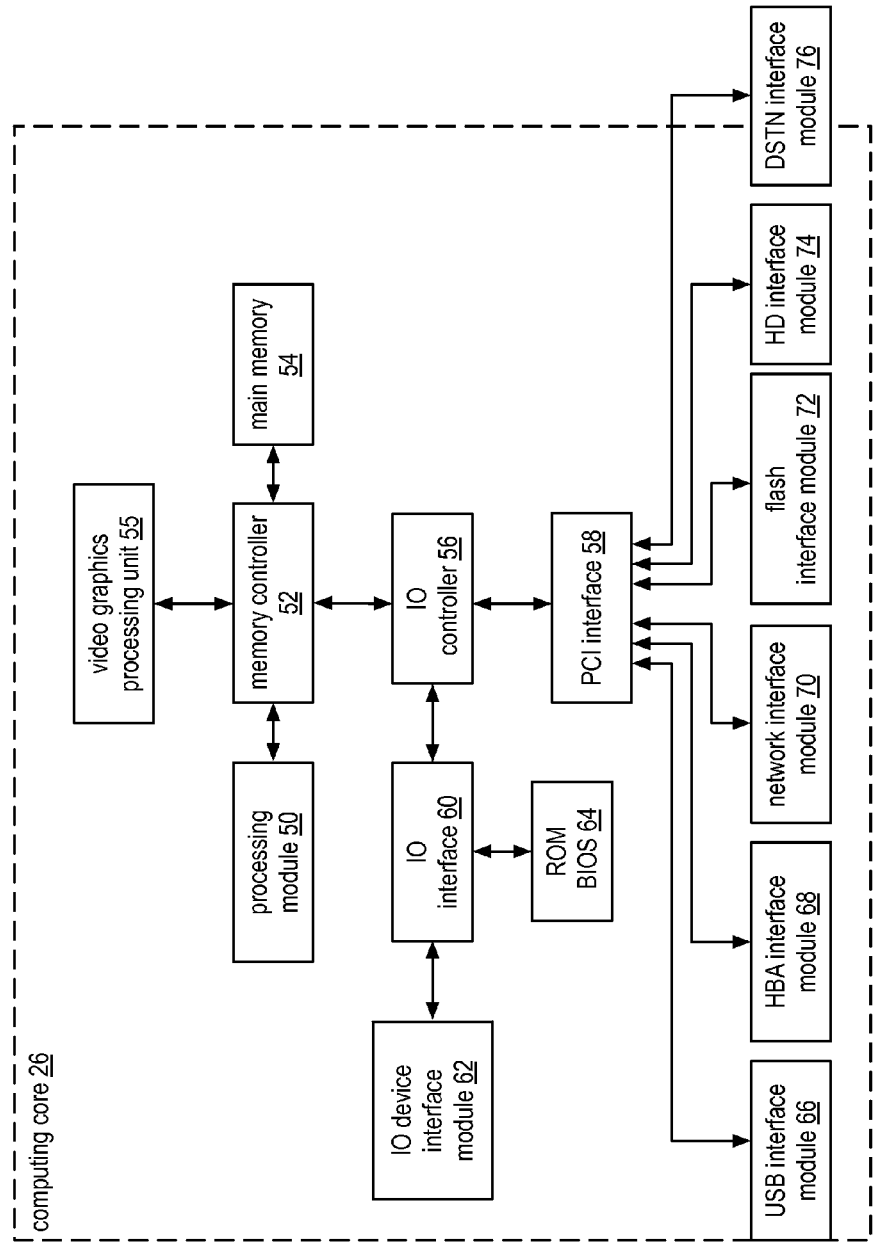
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
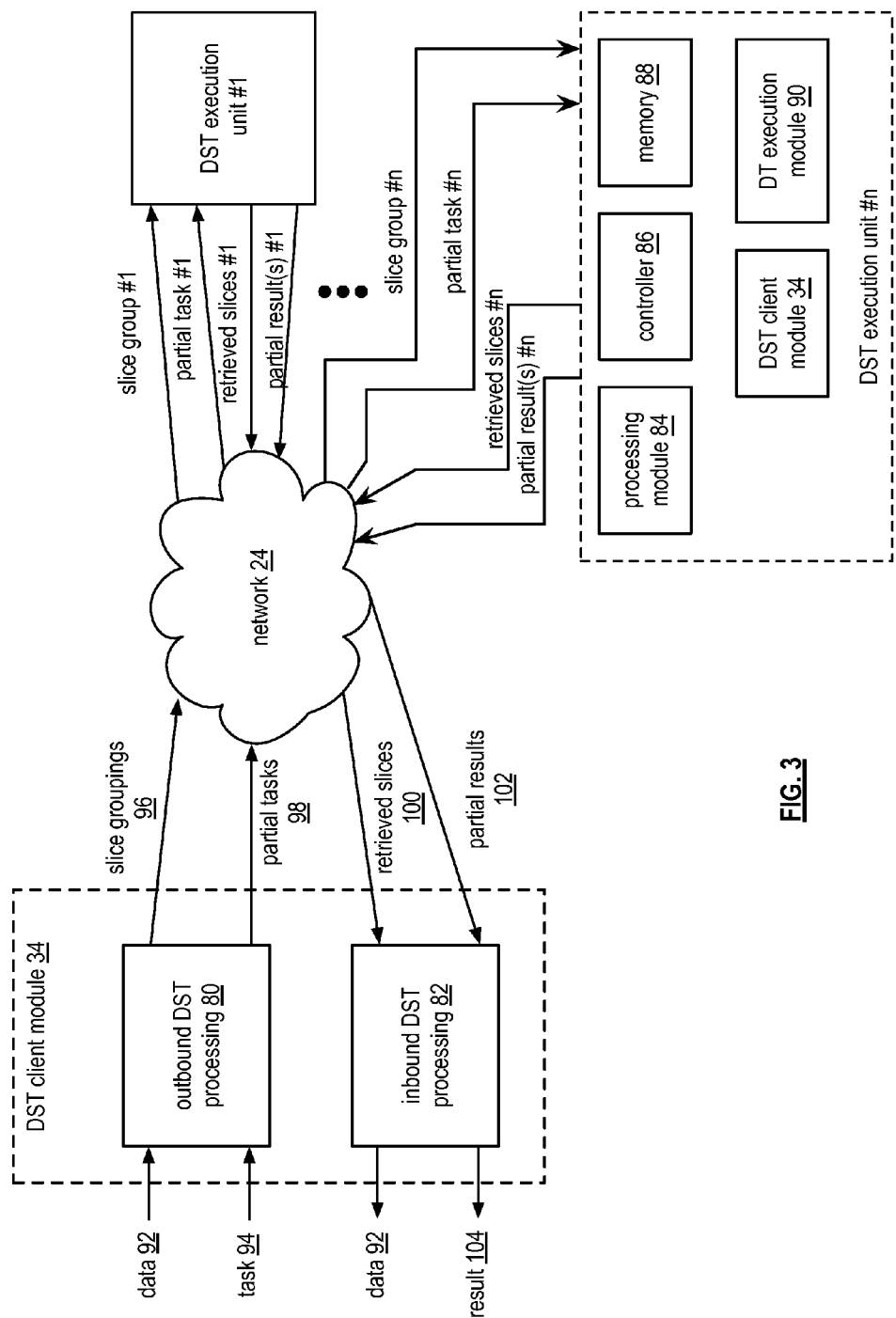
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terra-Bytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit 36 performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units 36 send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
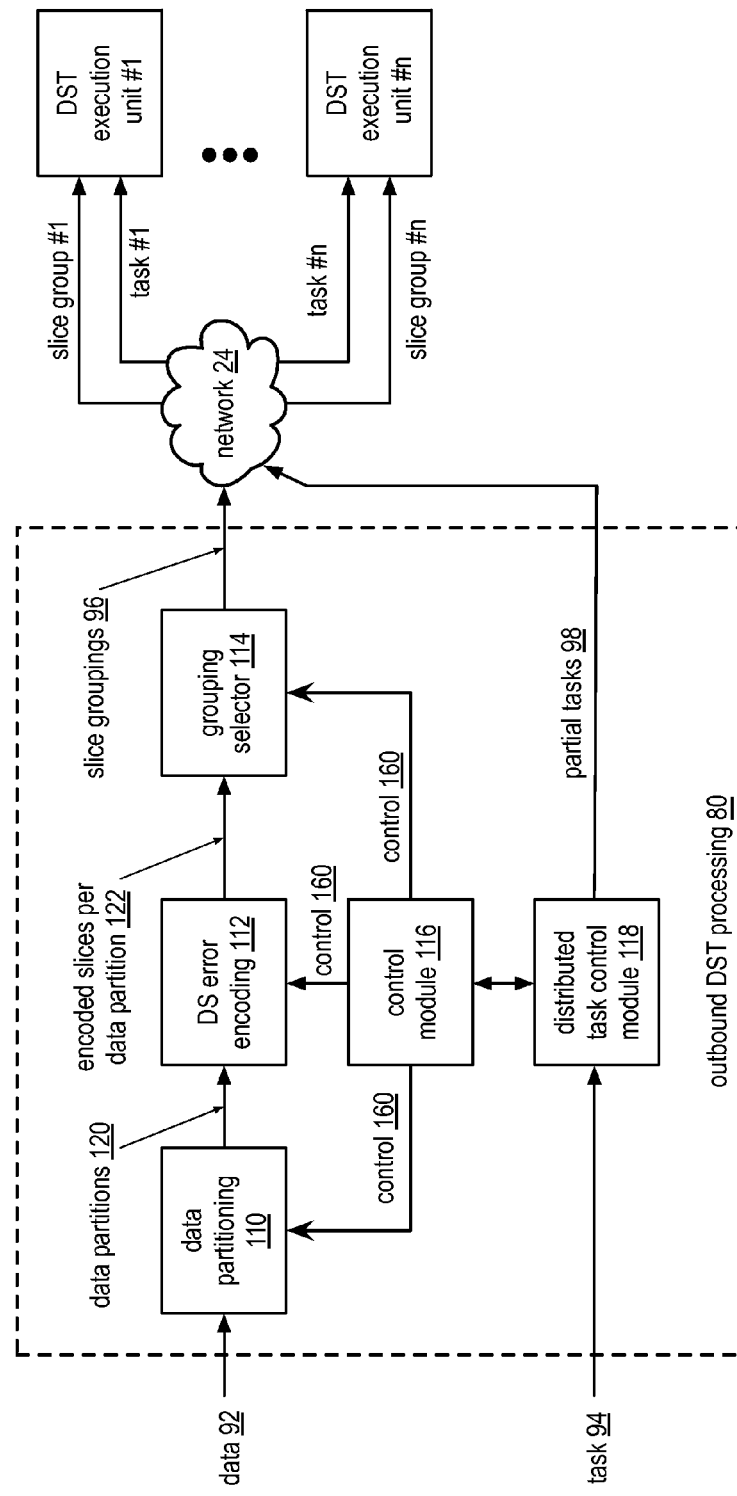
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terra-Bytes) into 100,000 data segments, each being 1 Giga-Byte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc., error encoding, slicing, and/or per slice security processing (e.g., encryption, compression, watermarking, integrity check (e.g., CRC), etc. The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the group selecting module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phase and a second set of partial tasks for finding and counting the second phrase. The distributed task control module 118 sends respective first and/or second partial tasks 98 to each DST execution unit 36.

Figure 5:
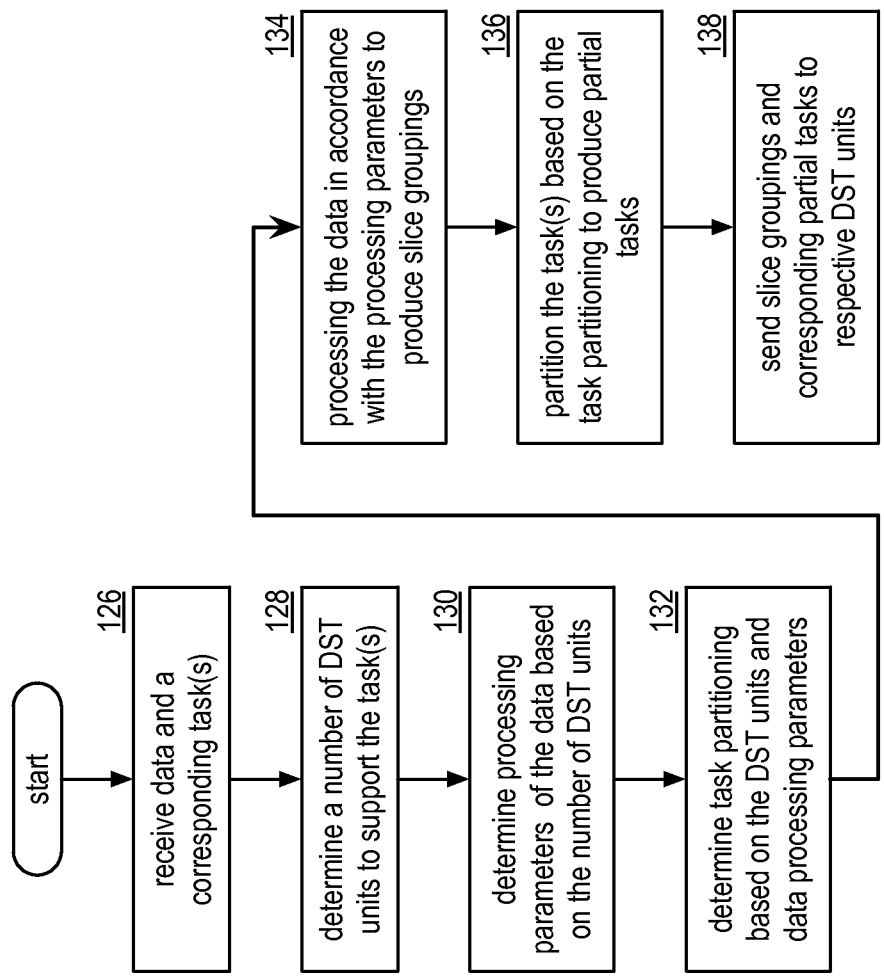
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if, the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or and the other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to the selected DST units.

Figure 6:
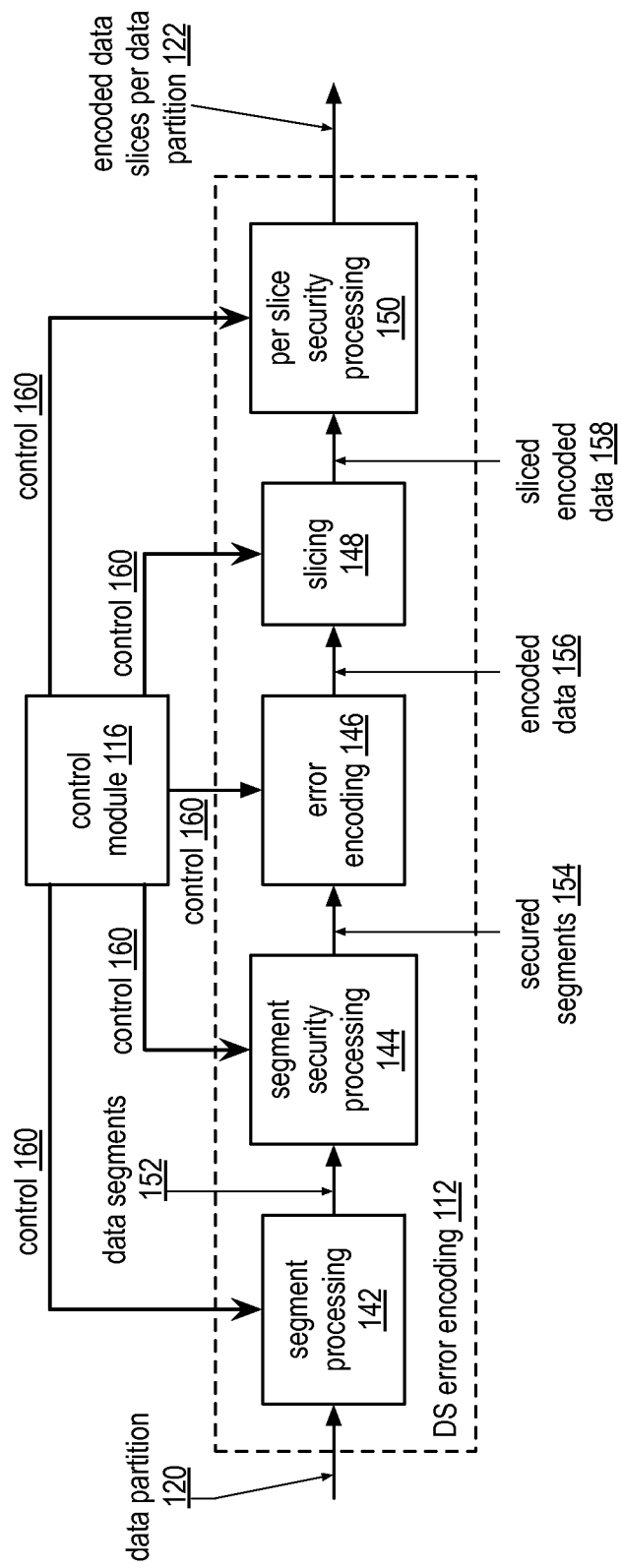
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check CRC), etc., and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC), etc., and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
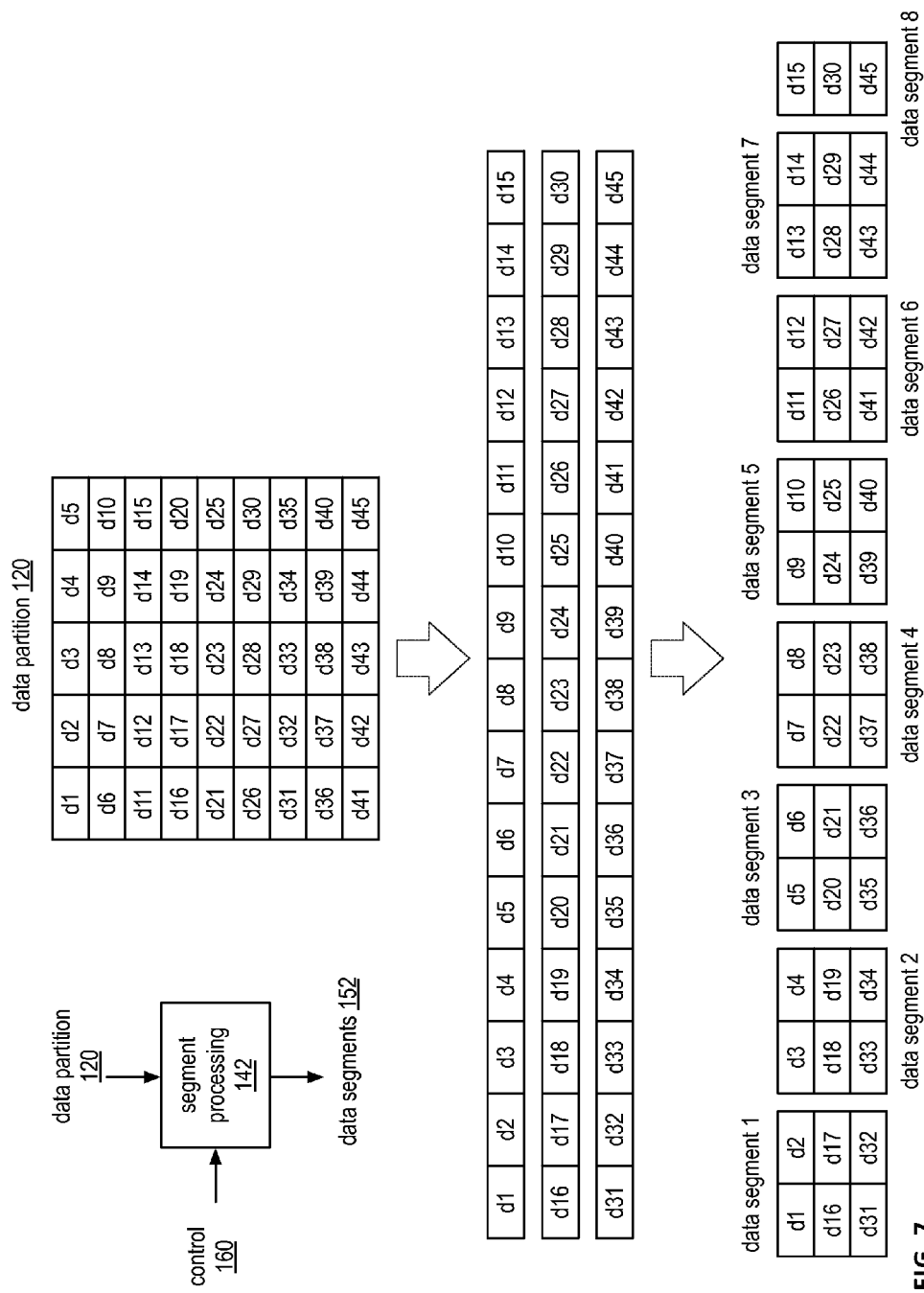
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
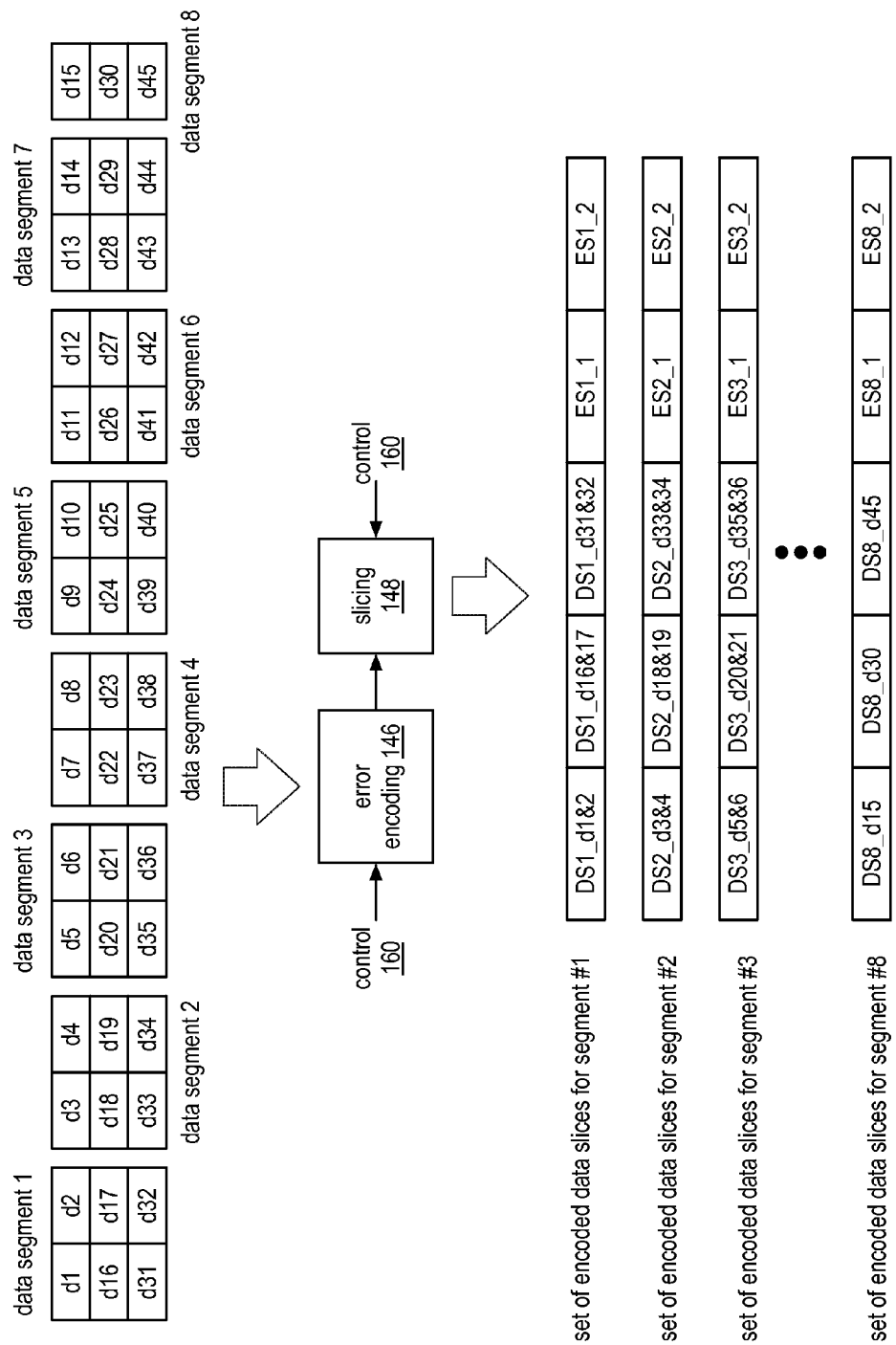
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slices of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices include error correction data based on the first-third words of the second data segment.

Figure 9:
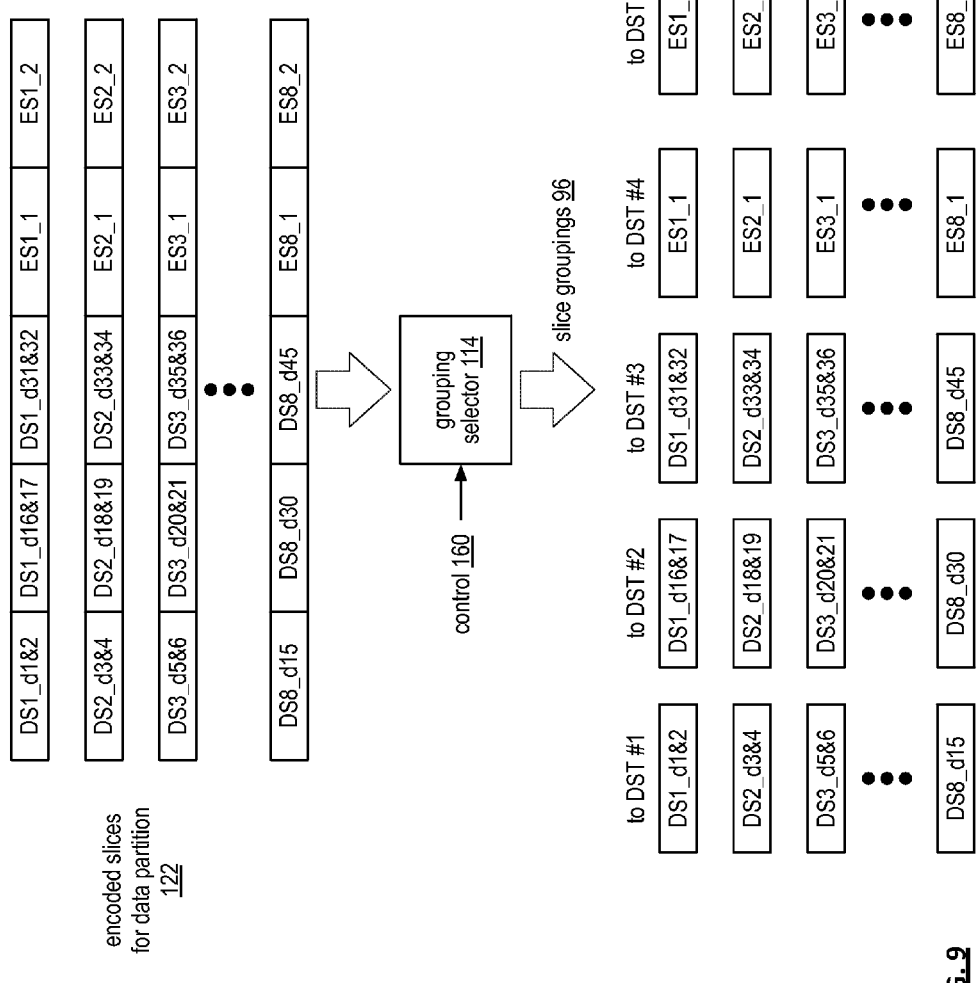
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selection module 114 organizes the encoded data slices into five slice groupings (e.g., one for each DST execution unit of a distributed storage and task network (DSTN) module). As a specific example, the grouping selection module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selection module 114 also creates a second slice grouping for a DST execution unit #2, which includes second encoded slices of each of the sets of encoded slices. As such, the second DST execution unit receives encoded data slices corresponding to data blocks 16-30. The grouping selection module 114 further creates a third slice grouping for DST execution unit #3, which includes third encoded slices of each of the sets of encoded slices. As such, the third DST execution unit receives encoded data slices corresponding to data blocks 31-45.

The grouping selection module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selection module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
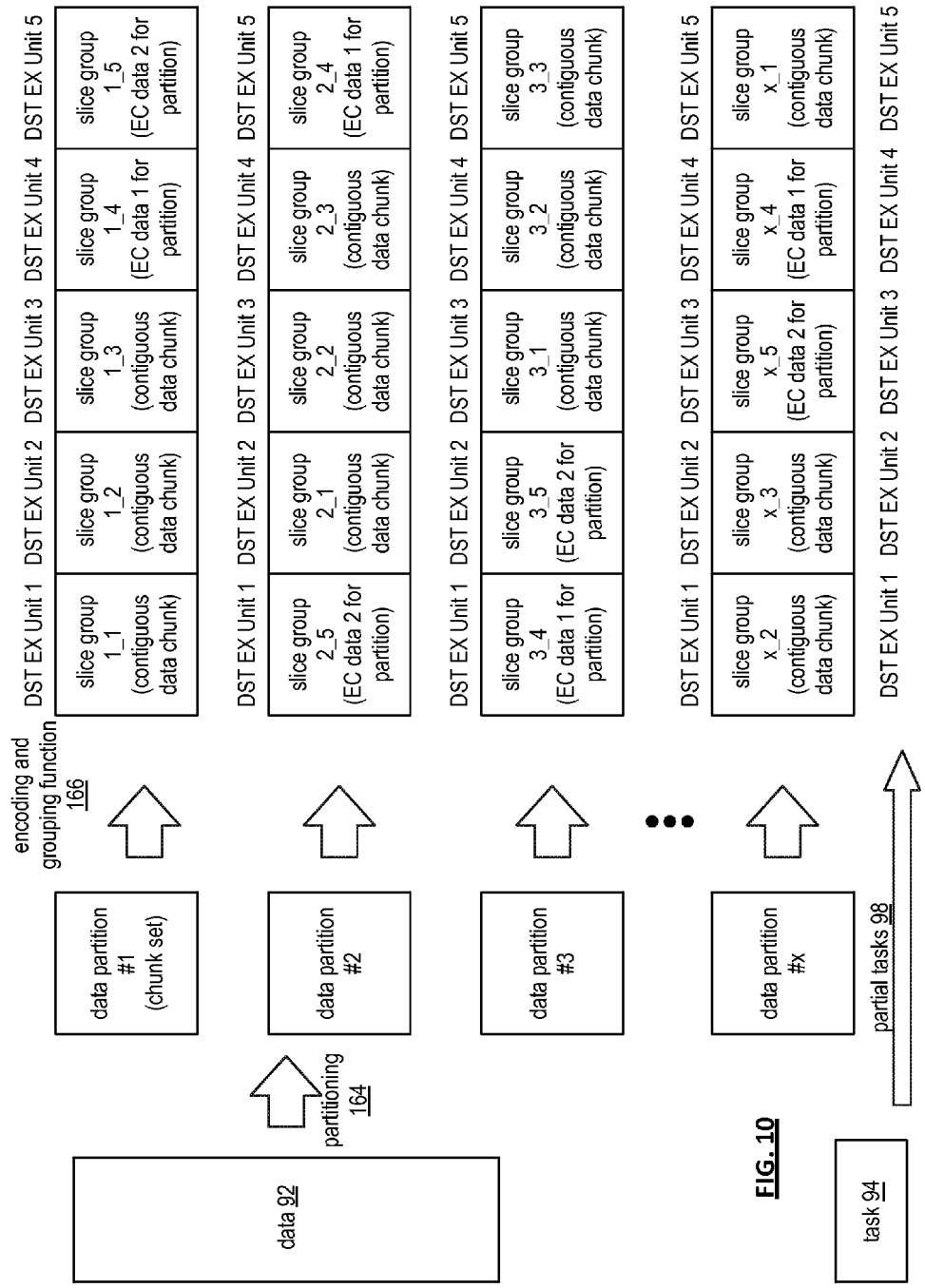
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1−x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 and the memory 88. For example, when the partial task 98 includes a retrieval request, the controller 86 outputs the memory control 174 to the memory 88 to facilitate retrieval of slices 100 and/or results 104.

Figure 12:
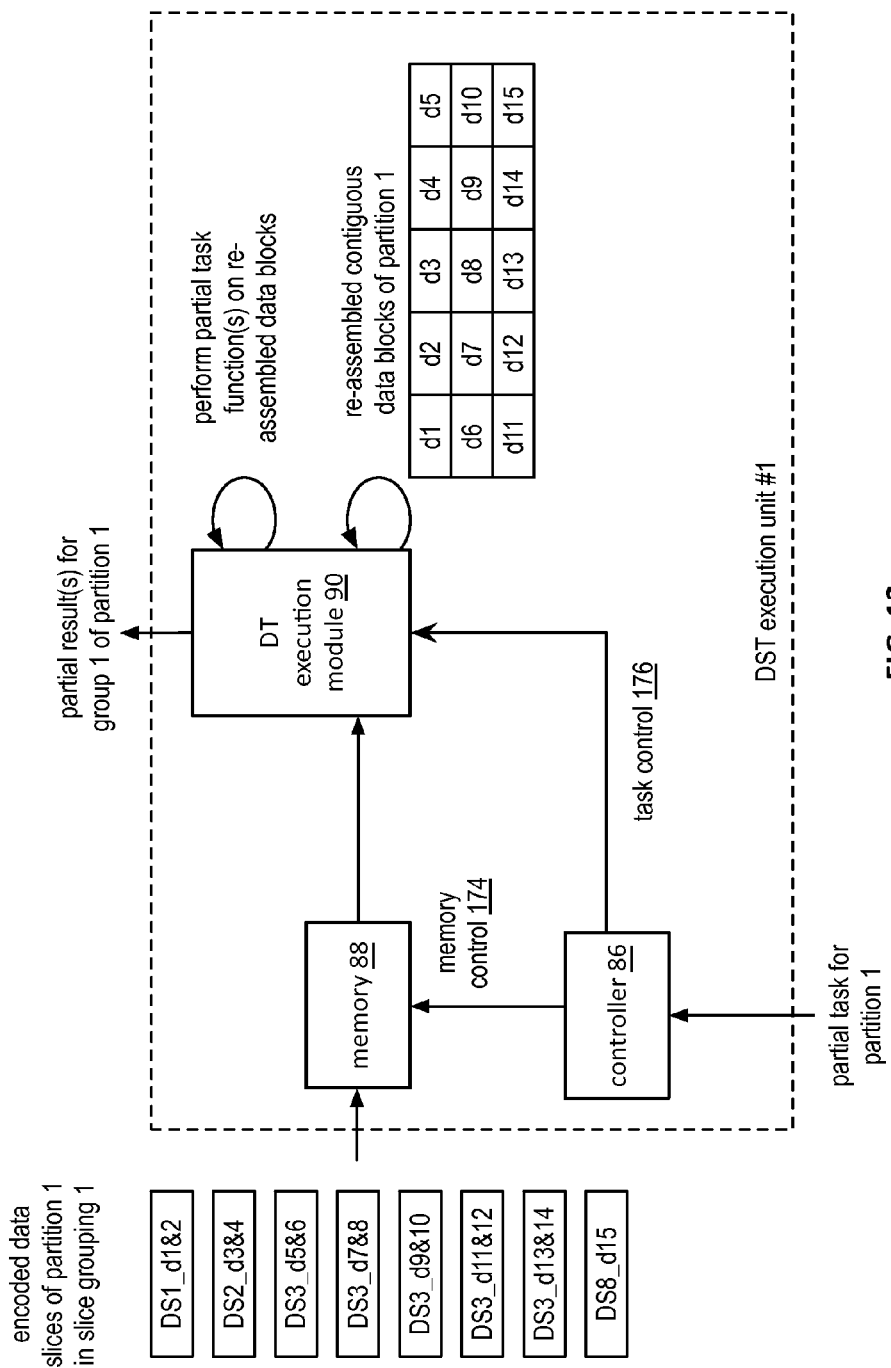
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
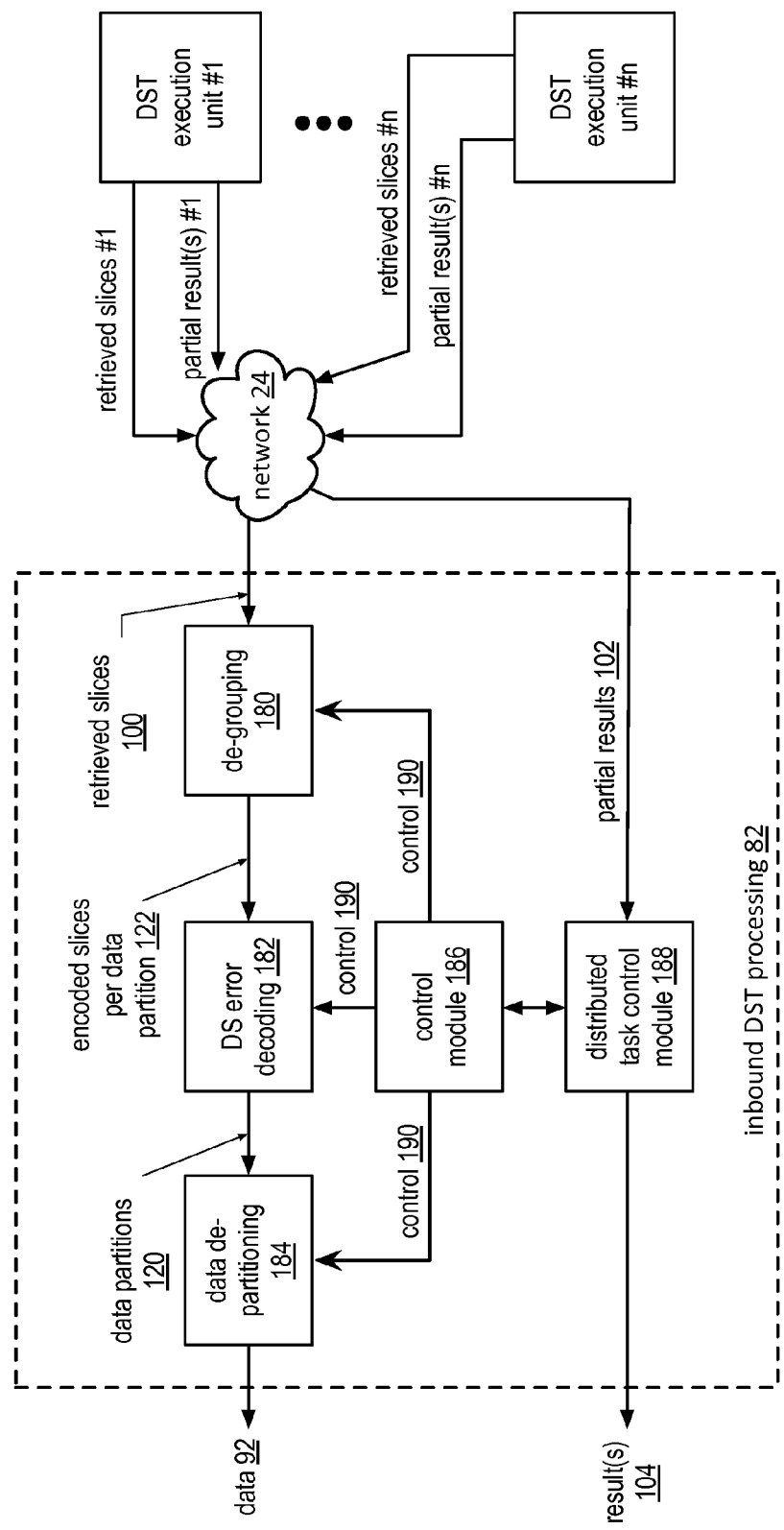
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieve slices 100 into the data 92 using control signals 190 to each of the modules. For instance, the control module 186 provides de-grouping information to the de-grouping module 180; provides the DS error encoding parameters to the DS error decoding module 182; and provides de-partitioning information to the data de-partitioning module 184.

Figure 14:
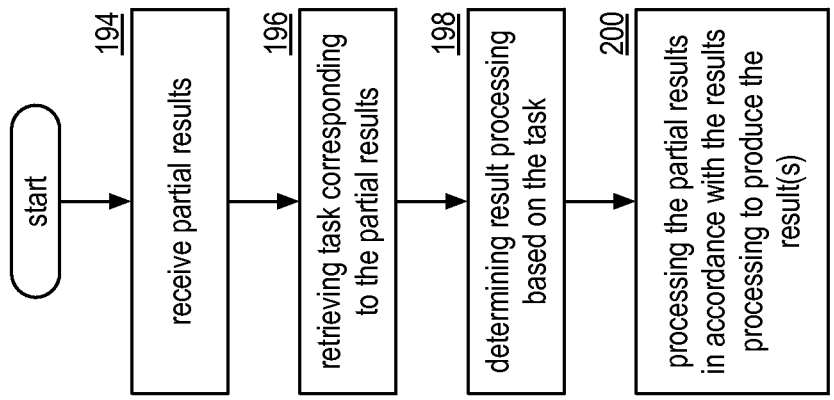
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, the results of processing information would indicate to add the partial results to produce the final results. The method continues at step 200 where the DST client module processes the partial results in accordance with the result processing information to produce the final result, or results.

Figure 15:
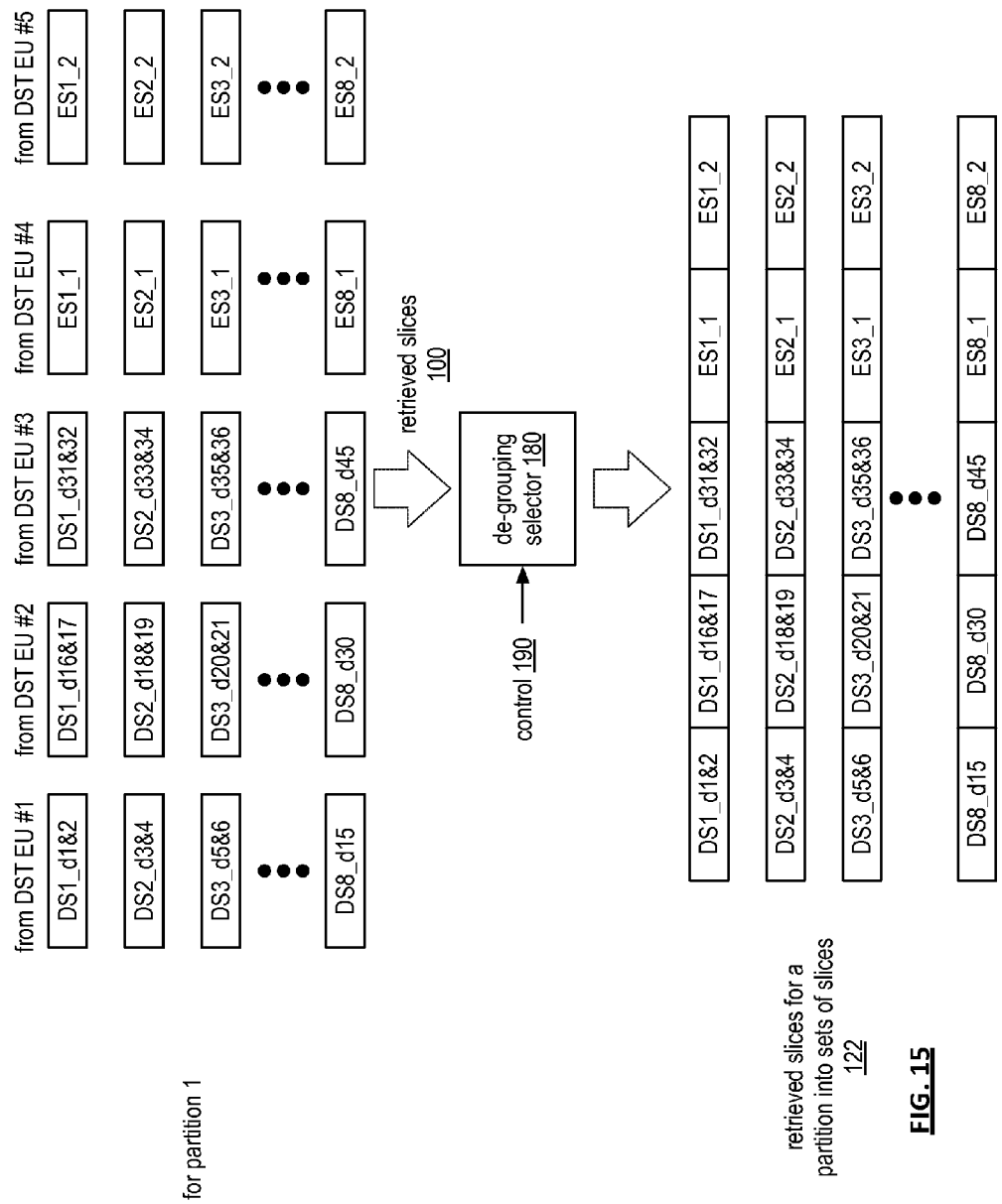
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
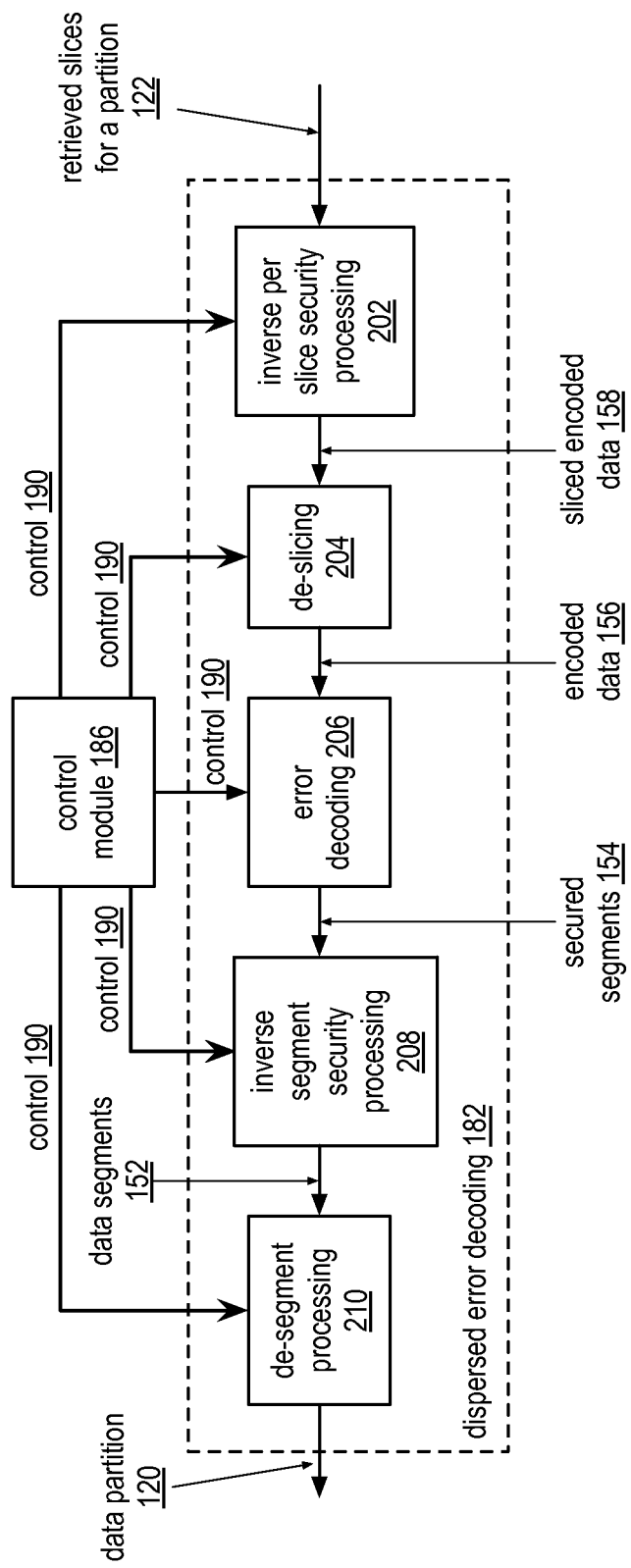
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC) verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC), etc. verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
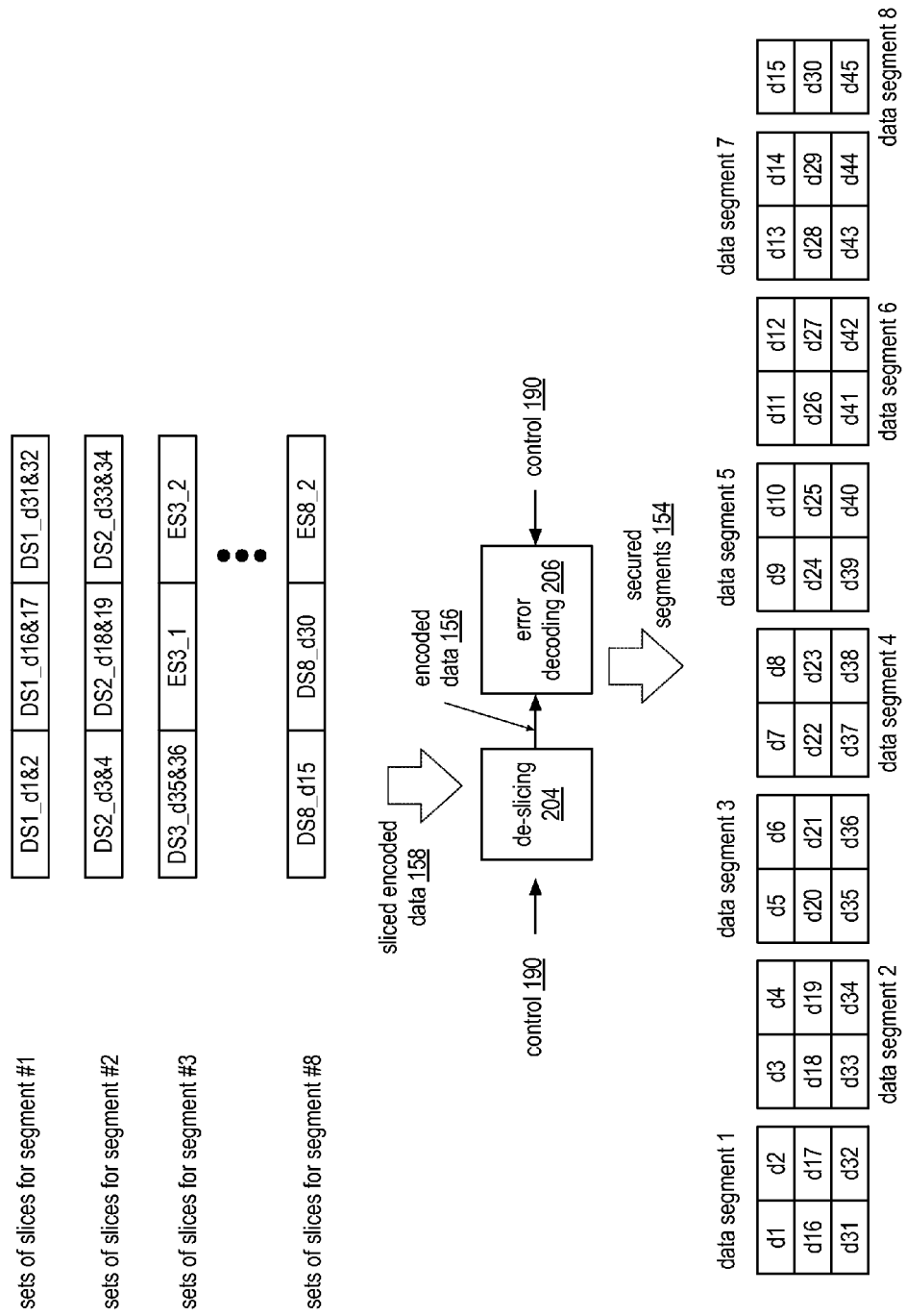
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce data segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
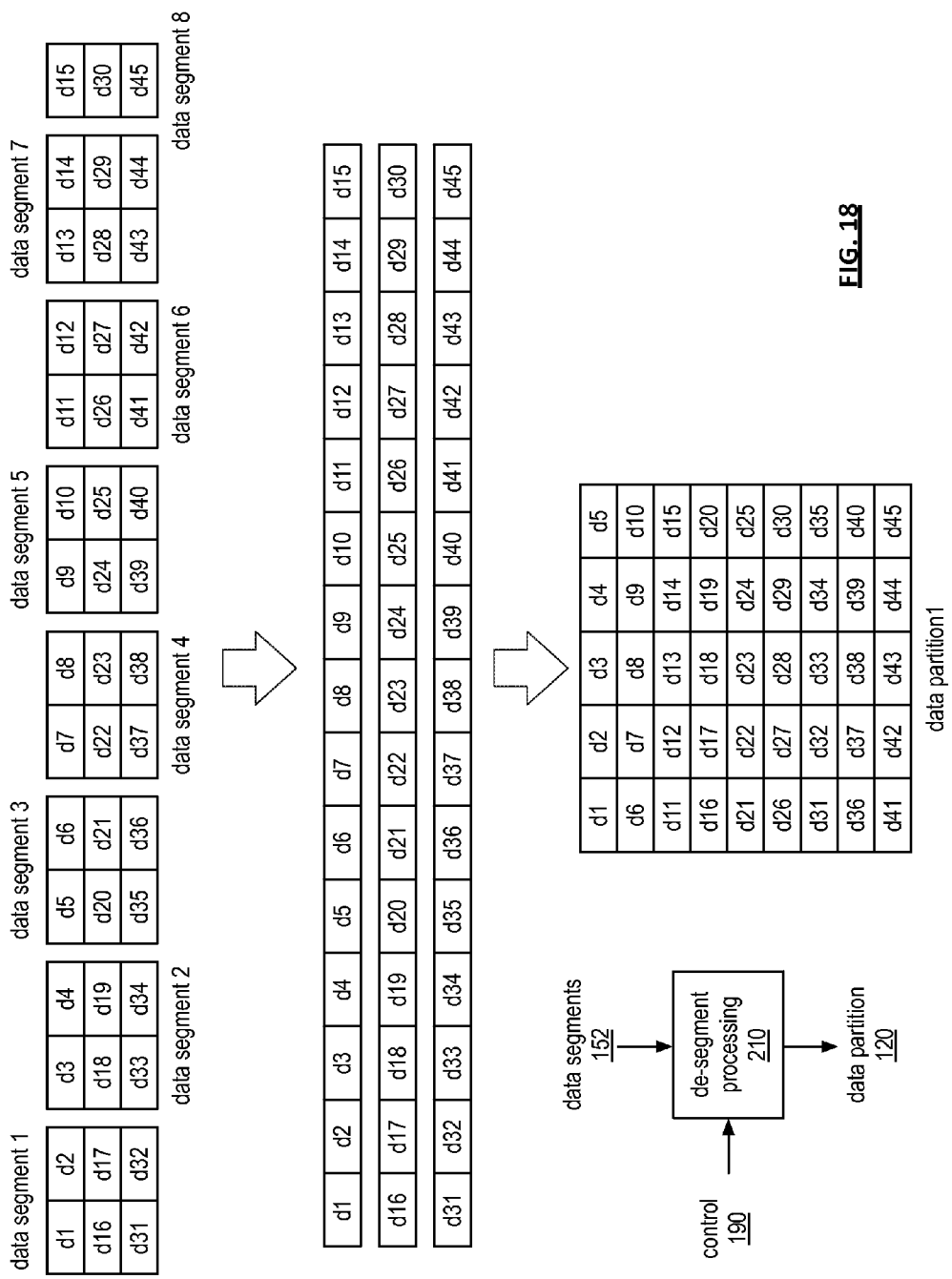
FIG. 18 is a diagram of an example of a de-segment processing of the dispersed error decoding in accordance with the present invention.

FIG. 18 is a diagram of an example of a de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
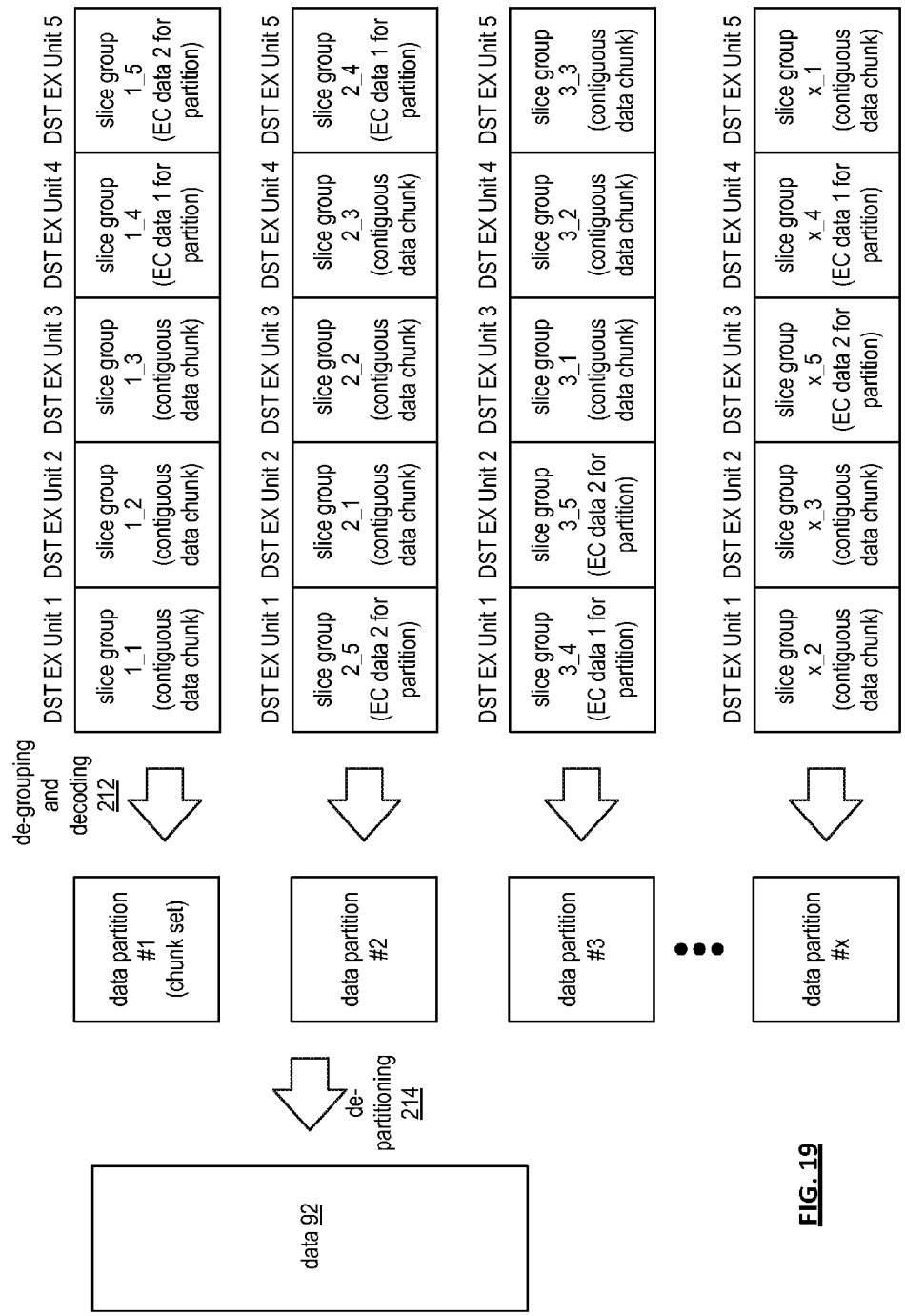
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
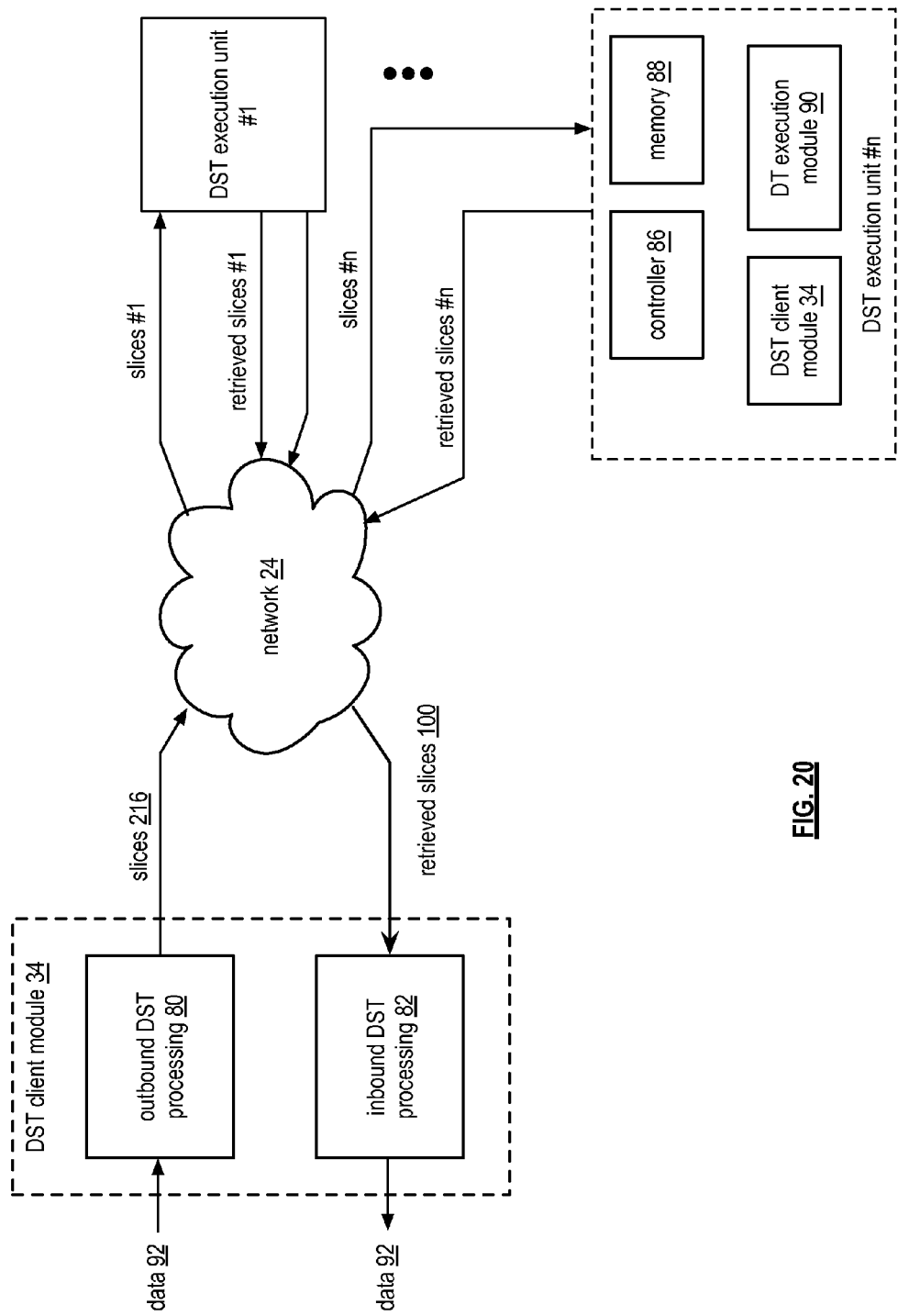
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
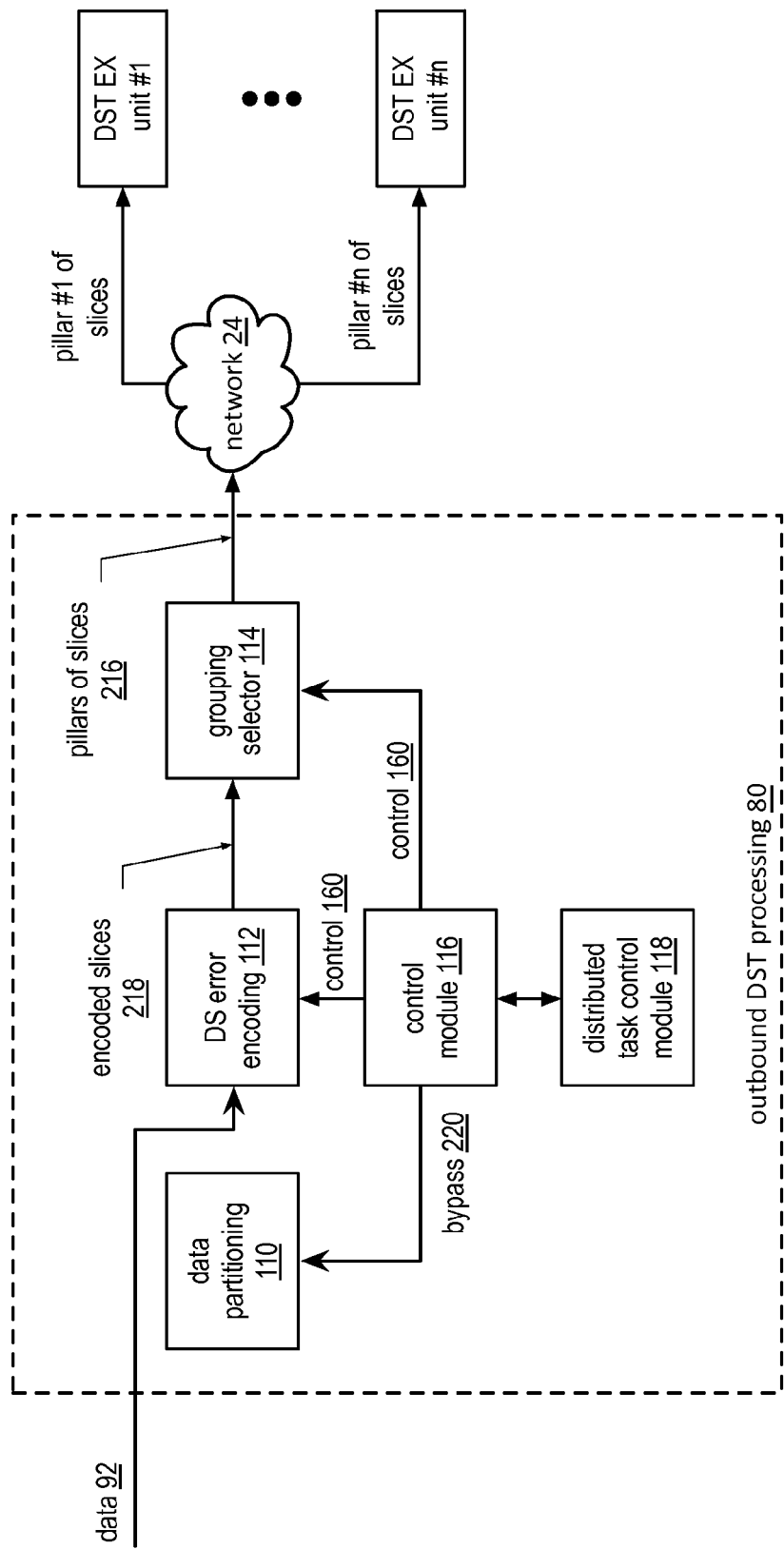
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
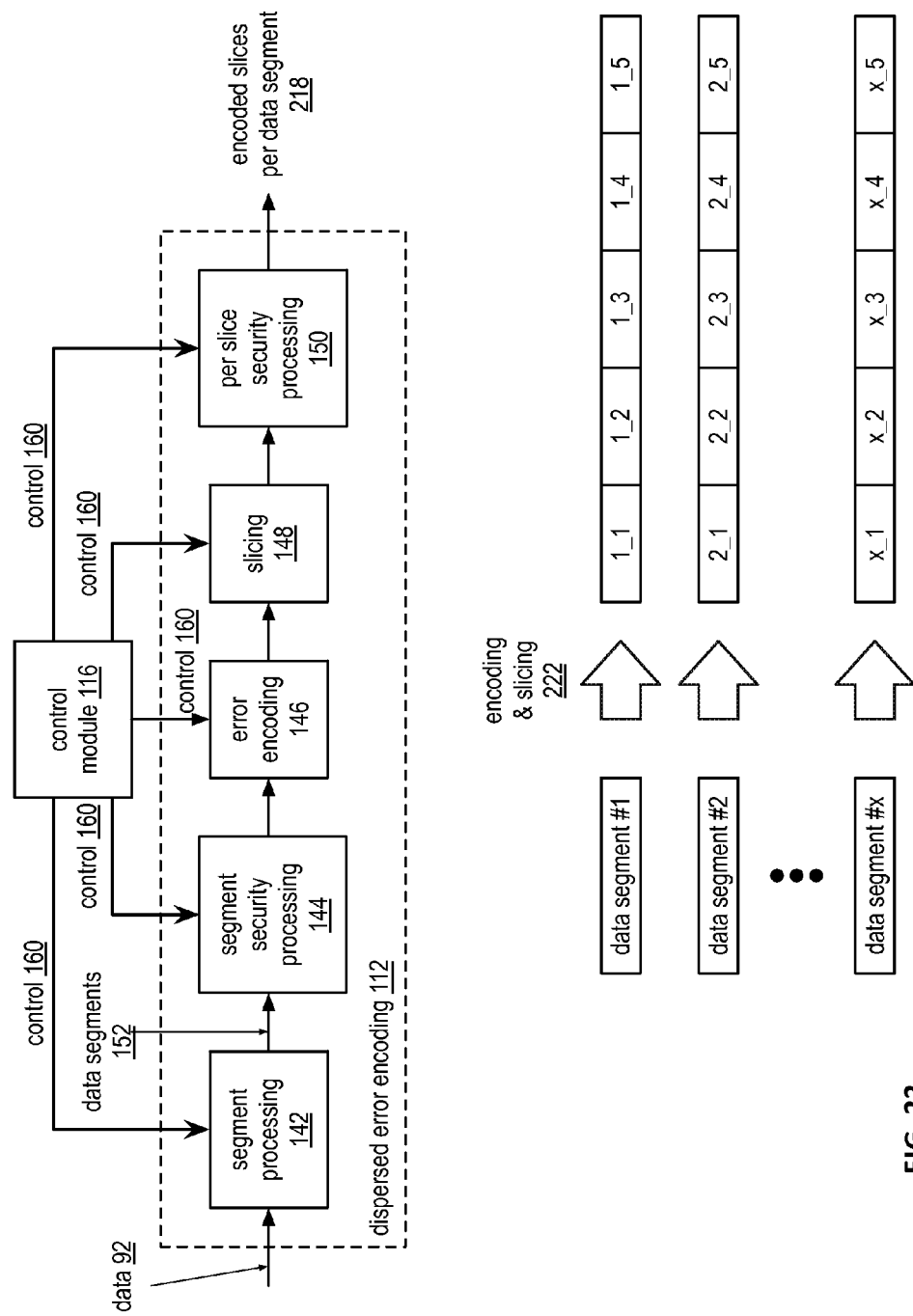
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC), etc., and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC), etc., and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
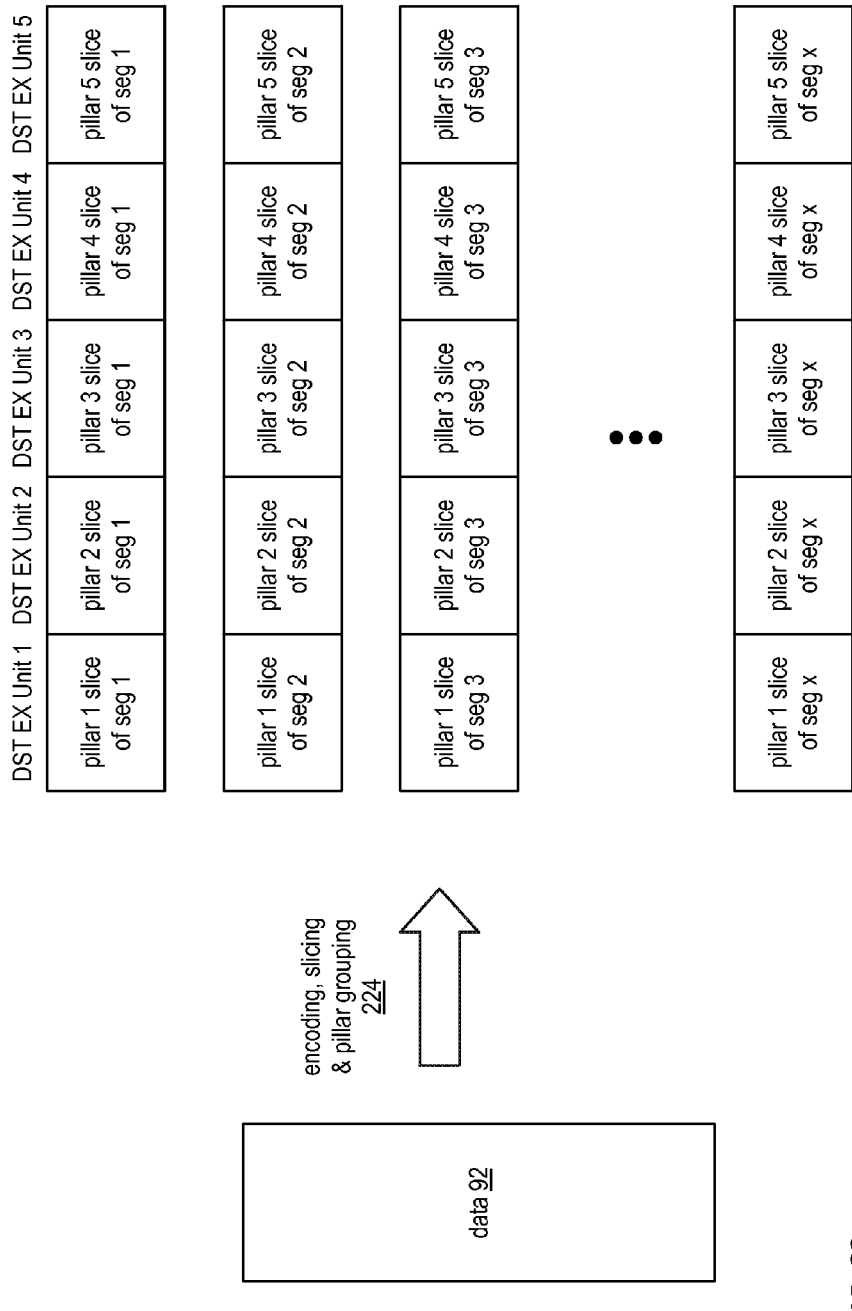
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selection module organizes the sets of encoded data slices into pillars of data slices. In this example, the DS error encoding parameters include a pillar width of 5 and a decode threshold of 3. As such, for each data segment, 5 encoded data slices are created.

The grouping selection module takes the first encoded data slice of each of the sets and forms a first pillar, which may be sent to the first DST execution unit. Similarly, the grouping selection module creates the second pillar from the second slices of the sets; the third pillar from the third slices of the sets; the fourth pillar from the fourth slices of the sets; and the fifth pillar from the fifth slices of the set.

Figure 24:
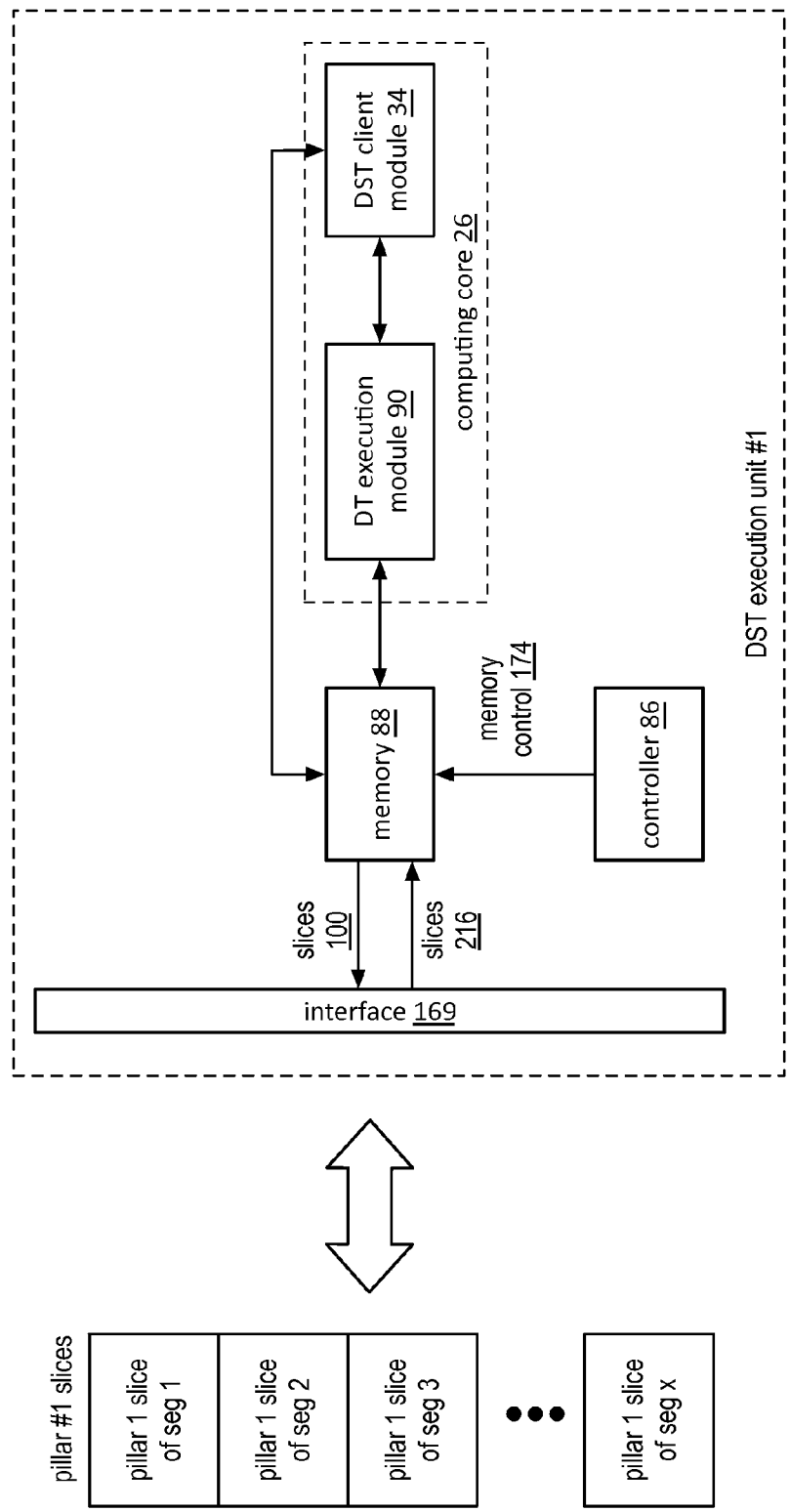
FIG. 24 is a schematic block diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC) verification, etc., and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from the control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC), etc. verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task ⇔ sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few terra-bytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slices names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4-translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc., may include the word and/or phrase, how many times it is used, where in the data it is used, and/or any other information requested regarding a word and/or phrase.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done the by DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terra-Byte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terra-Byte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
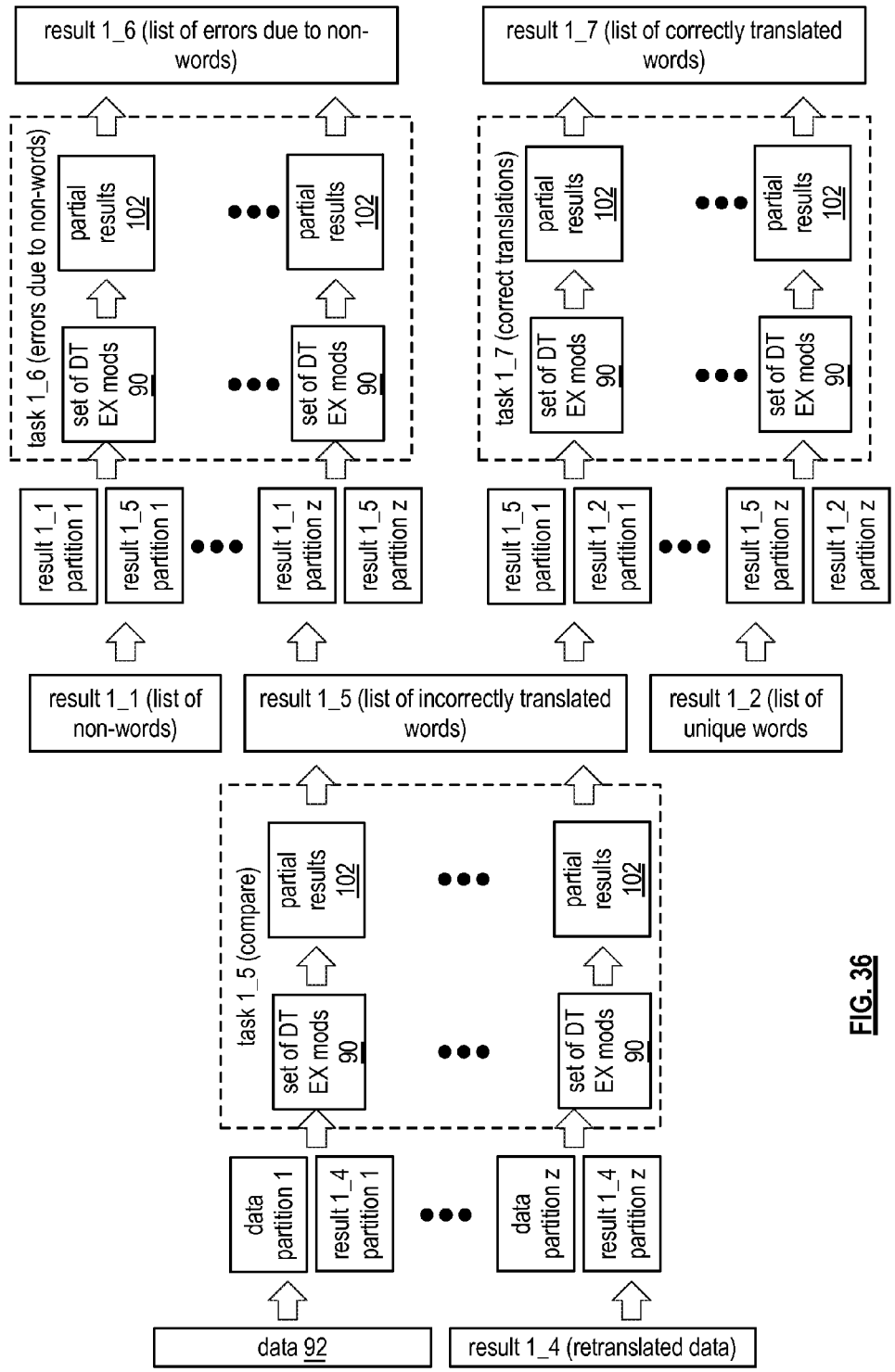

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7 z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terra-Byte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terra-Byte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

FIG. 40A is a diagram of an example embodiment of a dispersed storage and task execution unit 36 that includes an interface 169, a computing core 26, a controller 86, at least one memory 88, and one or more memory modules 350. A memory module 350 of the one or more memory modules 350 may include a memory device 352 (e.g., implemented utilizing FLASH memory technology, a random access memory, a read-only memory, a magnetic disk drive, and an optical disk drive), may include one or more distributed task (DT) execution modules 90 (e.g., implemented utilizing at least one of a processing module, and a computing core), and may include one or more DST client module 34. For example, a memory device 352 is implemented by adding a processing core (e.g., to enable a DT execution module) to a FLASH memory. As another example, a memory device 352 is implemented by adding four processing cores to the FLASH memory. Alternatively, or in addition to, the memory device 352 includes one or more distributed storage and task (DST) client modules 34. As yet another example, a memory module 350 is implemented as a disk drive unit that includes one DT execution module 90 and four memory devices 352 (e.g. disk drives). As a still further example, a memory module 350 is implemented as a disk drive unit that includes 100 DT execution modules 90 and 10 memory devices 352 (e.g. disk drives).

FIG. 40B is a flowchart illustrating an example of storing and processing a group of slices. The method begins at step 354 where a processing module (e.g., of a distributed task (DT) execution module of a distributed storage and task execution (DST EX) unit embedded within a disk drive unit) receives at least one partial task with regards to a group of slices of contiguous data (e.g., from a DST client module). The method continues at step 356 where the processing module receives slices of the group of slices to produce received slices. The method continues at step 358 where, when an interim threshold number (e.g., a maximum number of bytes limited by an ingestion cache memory) of received slices has been received, the processing module streams the received slices to a disk drive for storage therein. The streaming may provide a write bandwidth system improvement for the group of slices (e.g., as the group of slices pertain to the contiguous data).

The method continues at step 360 where the processing module determines whether to execute a partial task. The determining may be based on one or more of comparing an amount of data received to a data threshold, a partial task type, task execution resource availability, and a task schedule. For example, the processing module determines to execute the partial task when data of the received slices can be processed in accordance with a partial task. The method branches to step 364 when the processing module determines to execute the partial task. The method continues to step 362 when the processing module determines not to execute the partial task.

The method continues at step 362 where the processing module determines whether more slices are expected. The determining may be based on one or more of a contiguous data size indicator, a query, a lookup, and a number of bytes received so far. The method repeats back to step 356 when the processing module determines that there are more slices. The method continues to step 364 when the processing module determines that there are no more slices.

The method continues at step 364 where the processing module determines execution steps and schedule. The determining may be based on one or more of the at least one partial task, the data, a previous task schedule, a schedule template, a task execution resource availability level, and a task execution requirement. The method continues at step 366 where the processing module identifies a portion of the contiguous data for execution of one or more steps of the execution steps. The identifying includes matching the portion of the contiguous data to the one or more steps of execution steps based on one or more of a data type indicator associated with the portion, a data type associated with one or more steps, and a data available indicator.

The method continues at step 368 where the processing module retrieves the portion of the contiguous data from the disk drive as a data stream. The retrieving includes accessing the disk drive for multiple contiguous data bytes. The streaming may provide a read bandwidth system improvement for the portion of data. The method continues at step 370 where the processing module executes the steps in accordance with the schedule on the portion of the contiguous data to produce a partial result. For example, the processing module executes a search partial task on the portion to produce a search partial result.

The method continues at step 372 where the processing module dispersed storage error encodes the partial results to produce a plurality of sets of slices in accordance with dispersal parameters associated with one or more of the group of slices and the at least one partial task. The method continues at step 374 where the processing module facilitates storing a plurality of sets of slices in a dispersed storage and task network (DSTN). For example, the processing module sends groups of slices to a DST EX unit, where the slices are of a common pillar number when a storage method indicates dispersed storage. As another example, the processing module sends groups of slices to a DST EX unit, where the slices are of two or more pillar number when a storage method indicates distributed task storage to enable subsequent task execution on the partial result. In addition, the processing module may receive more slices for more execution steps.

FIG. 41 is a flowchart illustrating another example of storing and processing a group of slices, which include similar steps to FIG. 40B. The method begins with steps 354-356 of FIG. 40B where a processing module (e.g., of a distributed task (DT) execution module embedded within a solid state memory) receives at least one partial task with regards to a group of slices of contiguous data (e.g., from a DST client module) and receives slices of the group of slices to produce received slices.

The method continues at step 376 where the processing module stores the received slices in a local solid-state memory device. The random access nature of storing the slices in the solid-state memory device may provide a write address agility system improvement for the group of slices. The method continues with step 360 of FIG. 40B where the processing module determines whether to execute a partial task. The method branches to step 364 of FIG. 40B when the processing module determines to execute the partial task. The method continues to step 362 of FIG. 40B when the processing module determines not to execute the partial task.

The method continues with step 362 of FIG. 40B where the processing module determines whether more slices are expected when the processing module determines not to execute a partial task. The method repeats back to step 356 of FIG. 40B when the processing module determines that there are more slices. The method continues to step 364 of FIG. 40B when the processing module determines that there are no more slices.

The method continues with steps 364-366 of FIG. 40B where the processing module determines execution steps and schedule and identifies a portion of the contiguous data for execution of one or more steps of the execution steps. The method continues at step 378 where the processing module retrieves the portion of the contiguous data from the solid-state memory device. The retrieving includes accessing a slice location table to retrieve random access addresses within the solid-state memory device for the corresponding slices. The method continues with step 370 of FIG. 40B where the processing module executes the steps in accordance with the schedule on the portion of the contiguous data to produce a partial result. The method continues at step 380 where the processing module stores the partial result in the solid-state memory. The method continues with steps 372-374 of FIG. 40B where the processing module dispersed storage error encodes the partial results produce a plurality of sets of slices in accordance with dispersal parameters associated with one or more of the group of slices and the at least one partial task and facilitates storing a plurality of sets of slices in a dispersed storage and task network (DSTN).

FIG. 42A is a schematic block diagram of another embodiment of a distributed computing system that includes a distributed storage (DS) module 382 and a distributed storage and task (DST) execution unit superset 384. The DS module 382 may be implemented within one or more of a computing device, a DST execution unit 36, and a DST processing unit. The DST execution unit superset 384 includes a plurality of DST execution units 36. A portion of the plurality of DST execution units 36 includes a set of DST execution units 386. The DS module 382 may be implemented by one or more of a computing device, a DST client module, a distributed task (DT) execution module, a processing module, a controller, a user device, a DST processing unit, a DST execution unit 36, a distributed storage and task network (DSTN) managing unit, and a DST integrity processing unit. The DS module 382 includes a select module 388, an encode module 390, a task module 392, and an output module 394.

The system is operable to facilitate distributed computing of a task 398 (e.g., a computing task) on data 396. The select module 388 selects the set of DST execution units 386 to produce a DST execution unit set selection for executing the task 398 on the data 396 based on at least one of the task 398 and DST execution unit capability information 400 (e.g., task execution capability level, encryption capability level, availability level). The select module 388 selects the set of DST execution units 386 by a series of steps. A first step includes determining execution requirements of the task 398. A second step includes analyzing, in light of the execution requirements, the DST execution capability information 400 for the plurality of DST execution units 36. For example, the select module 388 receives the DST execution capability information 400 from at least some of the plurality of DST execution units 36. A third step includes identifying DST execution units 36 of the plurality of DST execution units 36 that have capabilities corresponding to the execution requirements. A fourth step includes selecting the set of DST execution units 386 from the identified DST execution units.

The encode module 390 determines dispersed storage error coding parameters for the data 396 based on information regarding the set of DST execution units 402 (e.g., number of DST execution units in the set, storage capabilities of the set of DST execution units, task processing capabilities of the set of DST execution units, DST execution unit set selection). The encode module 390 further functions to dispersed storage error encode the data 396 in accordance with the dispersed storage error coding parameters to produce a plurality of encoded data blocks. The encoding may include matrix multiplying an encoding matrix by portions of the data 396 to produce the plurality of encoded data blocks. The encoding matrix may include a unity Vandermonde matrix such that a first decode threshold number of encoded data blocks are substantially the same as the data 396. The encoding may also include on-line coding or other forms of error coding. An encoded data block may include one or more slices, an on-line encoded block, or another erasure encoded data block.

The encode module 390 further functions to group the plurality of encoded data blocks into a plurality of encoded data block groupings 404 in accordance with the dispersed storage error encoding. The encode module 390 groups the plurality of encoded data blocks further by grouping the plurality of encoded data blocks into the plurality of encoded data block groupings 404 based on at least one of the DST execution unit capability information 400 and the information regarding the set of DST execution units 402. A first grouping of encoded data blocks of the plurality of encoded data block groupings 404 may include less encoded data blocks than a second grouping of encoded data blocks of the plurality of encoded data block groupings 404.

The task module 392 partitions the task 398 into a set of partial tasks 406 based on at least one of the DST execution unit capability information 400 and the information regarding the set of DST execution units 402. The task module 392 partitions the task 398 into the set of partial tasks 406 by one of a plurality of approaches. A first approach includes replicating the task 398 for each DST execution unit of the set of DST execution units 386 to produce the set of partial tasks 406. A second approach includes identifying sub-tasks of the task 398 and producing the set of partial tasks 406 based on the identified sub-tasks. For example, a first DST execution unit is assigned a unique sub-task that compares favorably with a unique capability of the first DST execution unit. A third approach includes identifying the sub-tasks of the task 398 and replicating the identified sub-tasks for each of the set of DST execution units 386 to produce the set of partial tasks 406.

The output module 394 outputs at least some of the plurality of encoded data block groupings 408 to the set of DST execution units 386. For example, the output module 394 outputs a first decode threshold number of encoded data block groupings 408 to the set of DST execution units 386. The output module 394 may encrypt at least some of the encoded data block groupings 408 to provide improved security. When encrypting, the output module 394 outputs the at least some of the plurality of encoded data block groupings 408 by a series of steps. A first step includes generating an encryption key for an encoded data block grouping of the at least some of the plurality of encoded data block groupings 408 associated with a selected DST execution unit of the set of DST execution units 386 based on one or more of a corresponding DST execution unit identifier (ID), a Diffie Hellman exchange with the selected DST execution unit, a data identifier associated with the data, and a retrieved key. For example, the output module 394 combines a retrieved base key and a DST execution unit ID of a second DST execution unit to produce a second encryption key for encrypting an encoded data block grouping associated with the second DST execution unit. A second step includes encrypting the encoded data block grouping using the encryption key to produce an encrypted encoded data block grouping. A third step includes outputting the encrypted encoded data block grouping to the selected DST execution unit. The output module 394 further functions to output the set of partial tasks 406 to the set of DST execution units 386 for execution of the set of partial tasks 406 on the at least some of plurality of encoded data block groupings 408.

The select module 388 further functions to identify the superset of DST execution units 384 for storing the plurality of encoded data block groupings 404, where the superset of DST execution units 384 includes the set of DST execution units 386. The output module 394 further functions to output other encoded data block groupings 410 of the plurality of encoded data block groupings 404 to other DST execution units of the superset of DST execution units 384. The superset of DST execution units 384 stores the plurality of encoded data block groupings 404.

FIG. 42B is a flowchart illustrating an example of distributed computing of a task on data. The method begins at step 412 where a processing module (e.g., of a distributed storage and task processing unit) selects a set of distributed storage and task (DST) execution units for executing the task based on at least one of the task and DST execution unit capability information. The selecting the set of DST execution units includes a series of steps. A first step includes determining execution requirements of the task. A second step includes analyzing, in light of the execution requirements, the DST execution capability information for a plurality of DST execution units. A third step includes identifying DST execution units of the plurality of DST execution units that have capabilities corresponding to the execution requirements. A fourth step includes selecting the set of DST execution units from the identified DST execution units.

The method continues at step 414 where the processing module determines dispersed storage error coding parameters for the data based on information regarding the set of DST execution units. For example, the processing module establishes a pillar width to be substantially the same as the number of DST execution units of the set of DST execution units. The method continues at step 416 where the processing module dispersed storage error encodes the data in accordance with the dispersed storage error coding parameters to produce a plurality of encoded data blocks. The method continues at step 418 where the processing module groups the plurality of encoded data blocks into a plurality of encoded data block groupings in accordance with the dispersed storage error encoding. The grouping of the plurality of encoded data blocks may include grouping the plurality of encoded data blocks into the plurality of encoded data block groupings based on at least one of the DST execution unit capability information and the information regarding the set of DST execution units. A first grouping of encoded data blocks of the plurality of encoded data block groupings may include less encoded data blocks than a second grouping of encoded data blocks of the plurality of encoded data block groupings.

The method continues at step 420 where the processing module partitions the task into a set of partial tasks based on at least one of the DST execution unit capability information and the information regarding the set of DST execution units. The partitioning the task into a set of partial tasks includes one of a plurality of approaches. A first approach includes replicating the task for each of the set of DST execution units to produce the set of partial tasks. A second approach includes identifying sub-tasks of the task and producing the set of partial tasks based on the identified sub-tasks. A third approach includes identifying the sub-tasks of the task and replicating the identified sub-tasks for each of the set of DST execution units to produce the set of partial tasks.

The method continues at step 422 where the processing module outputs at least some of the plurality of encoded data block groupings to the set of DST execution units. The outputting the at least some of the plurality of encoded data block groupings includes a series of steps. A first step includes generating an encryption key for an encoded data block grouping of the at least some of the plurality of encoded data block groupings associated with a selected DST execution unit of the set of DST execution units based on one or more of a corresponding DST execution unit identifier, a Diffie Hellman exchange with the selected DST execution unit, a data identifier associated with the data, and a retrieved key. A second step includes encrypting the encoded data block grouping using the encryption key to produce an encrypted encoded data block grouping. A third step includes outputting the encrypted encoded data block grouping to the selected DST execution unit.

The method continues at step 424 where the processing module outputs the set of partial tasks to the set of DST execution units for execution of the set of partial tasks on the at least some of plurality of encoded data block groupings. The method continues at step 426 where the processing module identifies a superset of DST execution units for storing the plurality of encoded data block groupings where the superset of DST execution units includes the set of DST execution units. The method continues at step 428 where the processing module outputs other encoded data block groupings of the plurality of encoded data block groupings to other DST execution units of the superset of DST execution units where the superset of DST execution units stores the plurality of encoded data block groupings.

FIG. 42C is a schematic block diagram of another embodiment of a distributed computing system that includes a distributed storage (DS) module 430 and a distributed storage and task (DST) execution unit superset 384. The DS module 430 may be implemented within one or more of a computing device, a DST execution unit 36, and a DST processing unit. The DST execution unit superset 384 includes a plurality of DST execution units 36. A portion of the plurality of DST execution units 36 includes a set of DST execution units 386. The DS module 430 may be implemented by one or more of a computing device, a DST client module, a distributed task (DT) execution module, a processing module, a controller, a user device, a DST processing unit, a DST execution unit, a distributed storage and task network (DSTN) managing unit, and a DST integrity processing unit. The DS module 430 includes an identify module 432, a task module 434, and an output module 436.

The system is operable to facilitate distributed computing of a task 398 (e.g., a computing task) on stored data. The identify module 432 identifies the set of DST execution units 386 of the superset of DST execution units 384. The identify module 432 outputs a DST execution unit set information 402 that includes identity of the set of DST execution units 386. The superset of DST execution units 384 store stored data as a plurality of encoded data block groupings. Data is dispersed storage error encoded in accordance with dispersed storage error coding parameters to produce a plurality of encoded data blocks that is arranged into the plurality of encoded data block groupings. The identify module 432 identifies the set of DST execution units 386 by at least one of a variety of approaches. A first approach includes determining a recovery threshold (e.g., decode threshold) of the data based on the dispersed storage error coding parameters and selecting a number of DST execution units of the superset of DST execution units 384 based on the recovery threshold. A second approach includes identifying the set of DST execution units 386 as DST execution units of the superset of the DST execution units 384 that is storing data slices of the plurality of encoded data slices. A third approach includes identifying the set of DST execution units 386 as DST execution units of the superset of the DST execution units 384 where a DST execution unit of the set of DST execution units 386 is storing an encoded data block grouping of the plurality of encoded data block groupings and the DST execution unit recovers a portion of the data from the encoded data block group.

The task module 434 partitions the task 398 for distributed computing on the stored data into a set of partial tasks 406 based on at least one of the DST execution unit capability information 400 and the information regarding the set of DST execution units 402. The task module 434 functions to partition the task 398 into the set of partial tasks 406 by one of a variety of approaches. A first approach includes replicating the task 398 for each of the set of DST execution units 386 to produce the set of partial tasks 406. A second approach includes identifying sub-tasks of the task 398 and producing the set of partial tasks 406 based on the identified sub-tasks (e.g., each DST execution unit will receive a unique sub-task). A third approach includes identifying the sub-tasks of the task 398 and replicating the identified sub-tasks for each of the set of DST execution units 386 to produce the set of partial tasks 406.

The output module 436 outputs the set of partial tasks 406 to the set of DST execution units 386 for execution of the set of partial tasks 406 on a set of the plurality of encoded data block groupings stored by the set of DST execution units. The data is recoverable from the set of the plurality of encoded data block groupings and other encoded data block groupings of the plurality of encoded data block groupings are for error coding redundancy.

FIG. 42D is a flowchart illustrating an example of distributed computing of a task on stored data. The method begins at step 438 where a processing module (e.g., of a distributed storage and task (DST) processing unit) identifies a set of DST execution units of a superset of DST execution units where the superset of DST execution units store a plurality of encoded data block groupings. Data is dispersed storage error encoded in accordance with dispersed storage error coding parameters to produce a plurality of encoded data blocks that is arranged into the plurality of encoded data block groupings. The identifying the set of DST execution units includes at least one of a variety of approaches. A first approach includes determining a recovery threshold of the data based on the dispersed storage error coding parameters and selecting a number of DST execution units of the superset of DST execution units based on the recovery threshold. A second approach includes identifying the set of DST execution units as the DST execution units of the superset of the DST execution units that is storing data slices of the plurality of encoded data slices. A third approach includes identifying the set of DST execution units as the DST execution units of the superset of the DST execution units, wherein a DST execution unit of the set of DST execution units is storing an encoded data block grouping of the plurality of encoded data block groupings and wherein the DST execution unit recovers a portion of the data from the encoded data block group.

The method continues at step 440 where the processing module partitions the task into a set of partial tasks based on at least one of the DST execution unit capability information and the information regarding the set of DST execution units. The partitioning the task into a set of partial tasks includes one of a variety of approaches. A first approach includes replicating the task for each of the set of DST execution units to produce the set of partial tasks. A second approach includes identifying sub-tasks of the task and producing the set of partial tasks based on the identified sub-tasks. A third approach includes identifying the sub-tasks of the task and replicating the identified sub-tasks for each of the set of DST execution units to produce the set of partial tasks.

The method continues at step 442 where the processing module outputs the set of partial tasks to the set of DST execution units for execution of the set of partial tasks on a set of the plurality of encoded data block groupings stored by the set of DST execution units. The data is recoverable from the set of the plurality of encoded data block groupings and other encoded data block groupings of the plurality of encoded data block groupings are for error coding redundancy.

FIG. 43A is a schematic block diagram of another embodiment of a distributed computing system that includes a computing device 444 and a plurality of distributed storage and task (DST) execution units 446. The plurality of DST execution units 446 includes at least one set of DST execution units 448 that each includes two or more DST execution units 36. The computing device 444 may be implemented by one or more of a DST execution unit 36 of the plurality of DST execution units 446, a DST client module, a distributed task (DT) execution module, a processing module, a controller, a user device, a DST processing unit, a distributed storage and task network (DSTN) managing unit, and a DST integrity processing unit. For example, the computing device 444 is implemented as a DST execution unit 36 of the DST execution unit set 448. The computing device 444 includes a distributed storage (DS) module 450 and a local memory 458. The local memory 458 may be implemented utilizing one or more memory devices. A memory device of the one or more memory devices may be implemented utilizing one or more of a solid-state memory, an optical disk drive, and a magnetic disk drive. The DS module 450 includes a receive module 452, a task module 454, and a storage module 456.

The system is operable to perform a partial task 460 (e.g., a computing task) on an encoded data block grouping 462. The partial task 460 may include programming instructions to execute the partial task and may include a command that identifies a set of instructions to be evoked. Data is dispersed storage error encoded in accordance with dispersed storage error coding parameters to produce a plurality of encoded data blocks. The plurality of encoded data block groupings includes the encoded data block grouping 462. The receive module 452 receives the partial task 460 regarding the encoded data block grouping 462 of the plurality of encoded data block groupings. The receive module 452 receives the partial task by a series of steps when the partial task is encoded utilizing a dispersed storage error coding function. A first step includes receiving a set of encoded task data blocks 464. For example, the receive module 452 retrieves the set of encoded task data blocks 464 from the DST execution unit set 448. A second step includes determining dispersed store error decoding parameters regarding the partial task. The determining includes at least one of initiating a query, retrieving, receiving, and a look up. A third step includes decoding the set of encoded task data blocks 464 to recover the partial task 460. Alternatively, or in addition to, the receive module 452 receives the encoded data block grouping 462 (e.g., from a DST processing unit) and/or retrieves the encoded data block grouping 462 from the local memory 458.

The task module 454 performs the partial task 460 on the encoded data block grouping 462 to produce a partial task result 466. The task module performs the partial task 460 by decoding the encoded data block grouping 462 in accordance with the dispersed storage error coding parameters to produce a partition of the data and performing the partial task 460 on the partition of data to produce the partial task result 466. The task module further performs the partial task by configuring an execution unit (e.g., a DST execution unit 36, the DS module 450, etc.) to perform the partial task 460 based on content of the partial task 460. For example, the task module decodes the encoded data block grouping 462 to produce a slice as the partition of the data.

The task module 454 further functions to determine whether the encoded data block grouping 462 is encrypted. The determining may be based on one or more of a flag, a test, receiving a message, and a look up. When the encoded data block grouping 462 is encrypted, the task module 454 determines sensitivity of the partition of data. The determining may be based on one or more of a lookup, a query, and receiving the sensitivity. When the sensitivity of the partition of data is of a first sensitivity, the task module 454 decrypts the encoded data block grouping 462 to produce the encoded data block grouping 462 and temporarily stores the partition of data. When the partial task 460 has been performed, the task module 454 deletes the temporary storage of the partition of data (e.g., overwrite with another value, zero out).

The task module 454 further functions to perform the partial task 460 by determining the DS module's 450 ability to fulfill the partial task 460 in a reasonable time frame. When the task module 454 cannot fulfill the partial task 460 in the reasonable time frame, the task module 454 executes a series of steps. A first step includes partitioning the partial task 460 into a set of sub-partial tasks. A second step includes portioning the encoded data block grouping 462 into a set of encoded data block sub-groupings. A third step includes sending a request 468 that includes the set of sub-partial tasks and set of encoded data block sub-groupings to the set of DST execution units 448 of the distributed computing system. The set of DST execution units 448 may include the computing device 444. A fourth step includes receiving sub-partial task results 470 from the set of DST execution units 448. A fifth step includes compiling the sub-partial task results 470 to produce the partial task result 466.

The storage module 456 determines subsequent treatment of the partial task result 466 and of the encoded data block grouping 462. The storage module 456 functions to determine the subsequent treatment by at least one of a plurality of approaches. A first approach includes extracting subsequent treatment information from the partial task 460. A second approach includes analyzing the partial task result 460 for one or more result criteria to determine the subsequent treatment (e.g., size, sensitivity, user identity, source, destination, analytics type of result of the source data, a modification type of result of the source data). A third approach includes sending a query to another device within a distributed computing system to ascertain the subsequent treatment. A fourth approach includes analyzing the encoded data block grouping 462 to identify source data criteria (e.g., sensitivity, user identity, source, destination, etc.) to determine the subsequent treatment.

When the subsequent treatment includes maintaining storage of the encoded data block grouping 462 and storage of the partial task result 466, the storage module 456 determines a manner in which the partial task result 466 is to be stored (e.g., store locally, store in at least some of the plurality DST execution units 446). When the manner in which the partial task result 466 is to be stored is dispersed storage, the storage module 456 dispersed storage error encodes the partial task result 466 in accordance with dispersed storage error encoding parameters to produce one or more sets of encoded partial task result blocks 472. Next, the storage module outputs the one or more sets of encoded partial task result blocks 472 to the set of DST execution units 448 for storage therein.

When the manner in which the partial task result 466 is to be stored is store locally, the storage module 456 stores the partial task result 466 in the local memory 458. When the manner in which the partial task result 466 is to be stored is group dispersed storage, the storage module 456 coordinates with other DST execution units 36 of the distributed computing system to collect a set of partial task results where the set of partial task results includes the partial task result 466 and partial task results of the other DST execution units 36 that performed a corresponding partial task on other encoded data block groupings of the plurality of encoded data block groupings. Next, the storage module 456 disperse storage error encodes the set of partial results to produce an error encoded result data block.

When the subsequent treatment includes overwriting the encoded data block grouping 462 with the partial task result 466, the storage module 456 overwrites the encoded data block grouping 462 with the partial task result 466 (e.g., within the local memory). Next, the storage module 456 coordinates with other DST execution units 36 of the distributed computing system to update redundancy data blocks 474 of the plurality of encoded data block groupings based on the partial task results. The coordinating includes identifying an update approach and facilitating the updating of the redundancy data blocks 474. The update approach includes encoding a decode threshold number of encoded data block groupings to produce modified redundancy data blocks 474. The identifying may be based on one or more of the predetermination, a lookup, receiving a message, distributed computing system capacity, and a network loading level. The facilitating the updating includes assigning one or more DST execution units 36 of the other DST execution units to perform the encoding.

FIG. 43B is a flowchart illustrating an example of performing a partial task. The method begins at step 476 where a processing module (e.g., of a dispersed storage and task (DST) execution unit) receives a partial task regarding an encoded data block grouping of a plurality of encoded data block groupings. Data is dispersed storage error encoded in accordance with dispersed storage error coding parameters to produce the plurality of encoded data blocks. The receiving the partial task includes a series of steps. A first step includes receiving a set of encoded task data blocks. A second step includes determining dispersed store error decoding parameters regarding the partial task. A third step includes decoding the set of encoded task data blocks to recover the partial task.

The method continues at step 478 where the processing module performs the partial task on the encoded data block grouping to produce a partial task result. The performing the partial task includes configuring an execution unit to perform the partial task based on content of the partial task. The performing the partial task further includes determining the processing module's ability to fulfill the partial task in a reasonable time frame. When the processing module cannot fulfill the partial task in the reasonable time frame, the processing module executes a series of steps. A first step includes partitioning the partial task into a set of sub-partial tasks. A second step includes portioning the encoded data block grouping into a set of encoded data block sub-groupings. A third step includes sending the set of sub-partial tasks and set of encoded data block sub-groupings to a set of DST execution units of a distributed computing system. A fourth step includes receiving sub-partial task results from the set of DST execution units. A fifth step includes compiling the sub-partial task results to produce the partial task result.

The performing the partial task further includes decoding the encoded data block grouping in accordance with the dispersed storage error coding parameters to produce a partition of the data and performing the partial task on the partition of data to produce the partial task result. The performing the partial task further includes determining whether the encoded data block grouping is encrypted and when the encoded data block grouping is encrypted determining sensitivity of the partition of data. When the sensitivity of the partition of data is of a first sensitivity, the processing module decrypts the encoded data block grouping to produce the encoded data block grouping, temporarily stores the partition of data, and when the partial task has been performed, deletes the temporary storage of the partition of data.

The method continues at step 480 where the processing module determines subsequent treatment of the partial task result and of the encoded data block grouping. The determining the subsequent treatment includes at least one of a variety of approaches. A first approach includes extracting subsequent treatment information from the partial task. A second approach includes analyzing the partial task result for one or more result criteria to determine the subsequent treatment. A third approach includes sending a query to another device within a distributed computing system to ascertain the subsequent treatment. A fourth approach includes analyzing the encoded data block grouping to identify source data criteria to determine the subsequent treatment. The method branches to step 486 when the processing module determines the subsequent treatment to include storing the partial task result. The method continues to step 482 when the processing module determines the subsequent treatment to include overwriting the encoded data block grouping.

When the subsequent treatment includes overwriting the encoded data block grouping with the partial task result, the method continues at step 482 where the processing module overwrites the encoded data block grouping with the partial task result. The method continues at step 484 where the processing module coordinates with other DST execution units of a distributed computing system to update redundancy data blocks of the plurality of encoded data block groupings based on the partial task results.

When the subsequent treatment includes maintaining storage of the encoded data block grouping and storage of the partial task result, the method continues at step 486 where the processing module determines a manner in which the partial task result is to be stored. When the manner in which the partial task result is to be stored is dispersed storage, the method continues at step 488 where the processing module dispersed storage error encodes the partial task result in accordance with dispersed storage error encoding parameters to produce one or more sets of encoded partial task result blocks. The method continues at step 490 where the processing module outputs the one or more sets of encoded partial task result blocks to another set of DST execution units for storage therein.

When the manner in which the partial task result is to be stored is store locally, the method continues at step 492 where the processing module stores the partial task result in local memory of the DST execution unit. When the manner in which the partial task result is to be stored is group dispersed storage, the method continues at step 494 where the processing module coordinates with other DST execution units of the distributed computing system to collect a set of partial task results where the set of partial task results includes the partial task result and partial task results of the other DST execution units that performed a corresponding partial task on other encoded data block groupings of the plurality of encoded data block groupings. The method continues at step 496 where the processing module disperses storage error encodes the set of partial results to produce an error encoded result data block.

FIG. 44A is a diagram of an example embodiment of a distributed storage and task (DST) unit 500 that includes a controller 86, a memory 88, a distributed task (DT) execution module A, a DT execution module B, and a DST client module 34. The DT execution module A and DT execution module B may be implemented utilizing one or more modules. The DST client module 34 includes at least one of an inbound DST processing 82 and an outbound DST processing. The DST unit 500 ingests raw data 502 for storage and processing in accordance with a received task 94. The task 94 includes one or more of a raw data search task and a partial task for execution on slices sent to the DST unit 500 (e.g., storage and/or processing).

The controller 86 produces control information based on the task 94 to control one or more of the memory 88, DT execution module A, DT execution module B, and the DST client module 34. For example, the controller 86 produces a memory control 174 such that the memory 88 caches the raw data 502 and generates index generation task information 508 such that DT execution module A processes the raw data 502 in accordance with the index generation task information 508 to produce a data index 504. The index generation task information 508 includes one or more of a search parameter, a keyword, pattern recognition information, and timing information. The data index 504 includes metadata of the raw data 502 including one or more of keywords, dates, internet protocol addresses, partial content, word counts, statistics, a summary, a distributed storage and task network (DSTN) address corresponding to raw data storage, a DSTN address corresponding to data index storage, and a DSTN address corresponding to index data storage.

The controller 86 may also generate data indexing task information 510 with regards to indexing of the data index 504. The data indexing task information 510 includes one or more of data reduction instructions, a keyword filter, a data index reference, and an indexed data format. The DT execution module B processes the raw data 502 in accordance with the data indexing task information 510 to produce indexed data 506. The indexed data 506 includes a subset of the raw data 502 organized in accordance with the data index 504.

The controller 86 controls the memory 88 with the memory control 174 to facilitate caching one or more of the raw data 502, the data index 504, and the indexed data 506. The memory control 174 may also facilitate the memory 88 outputting one or more of the raw data 502, the data index 504, and the indexed data 506. The memory control 174 may also facilitate the memory 88 inputting slice groupings 96 for caching in the memory 88 to facilitate further processing by DT execution module A and/or B.

The controller 86 generates and outputs a DST control 178 to the DST client module 34 to facilitate the generation and outputting of one or more of slice groupings 96 of the raw data 502, of the data index 504, of the indexed data 506, and one or more partial tasks 98. For example, the DST client module 34 sends a portion of the slice groupings 96 of the raw data 502 to the memory 88 for storage and sends other portions of the slice groupings 96 to other DST units for storage therein. As another example, the DST client module 34 generates slice groupings 96 of the indexed data 506 and sends the slice groupings 96 of indexed data 506 to at least one other DST unit for further processing (e.g., a pattern search).

FIG. 44B is a schematic block diagram of another embodiment of a distributed computing system that includes a computing device 512, a network 530, and a plurality of distributed storage and task (DST) units 514. The network 530 includes one or more of a computing network, a communication network, a processing network, a storage network, and any network capable of one or more of storing data, communicating data, sourcing data, consuming data, and processing data. The plurality of DST units 514 includes a first set of DST units 516 and a second set of DST units 518 that each includes two or more DST units 519. A DST unit 519 of the plurality of DST units 514 may be implemented by one or more of a DST execution unit, a server, the user device, and a DST processing unit. The computing device 512 may be implemented by one or more of a DST unit 519 of the plurality of DST units 514, a DST execution unit, a DST client module, a distributed task (DT) execution module, a processing module, a controller, a user device, a DST processing unit, a distributed storage and task network (DSTN) managing unit, and a DST integrity processing unit. The computing device 512 includes a distributed storage (DS) module 520. The DS module 520 includes an identifying criteria module 522, an analyzing criteria module 524, a distributed computing criteria module 526, and a results module 528.

The system is operable to facilitate searching data 532 on the network 530 to produce found data 534 and to analyze the found data 534 to produce a network data resultant 536. The identifying criteria module 522 establishes data identifying criteria 538 for searching data on a network. The identifying criteria module 522 establishes the data identifying criteria 538 by at least one of a plurality of approaches. A first approach includes determining data content search criteria (e.g., text search words, phrase search, photo, voice print, etc.). A second approach includes determining file name search criteria. A third approach includes determining data source identifying criteria. A fourth approach includes determining data destination identifying criteria. A fifth approach includes determining data type searching criteria (e.g., text file, email file, picture file, video file, etc.). A sixth approach includes determining data routing searching criteria (e.g., a data generation source, a data generation consumption entity, a routing path, an alternate routing path, etc.). A seventh approach includes compiling at least one of the data content search criteria, the file name search criteria, the data source identifying criteria, the data destination identifying criteria, the data type searching criteria, and the data routing searching criteria to produce the data identifying criteria 538.

The analyzing criteria module 524 establishes data analyzing criteria 540 for analyzing found data 534 of the data 532 on the network 530. The analyzing criteria module 524 establishes data analyzing criteria 540 by at least one of a plurality of approaches. A first approach includes performing organization analysis on the found data 534 (e.g., filtering limit found data content to a particular sender and/or recipient, categorizing the found data, aggregating the found data, etc.). A second approach includes performing statistical analysis on the found data 534 (e.g., word count, number of matches, summary of found data, etc.). A third approach includes performing interpretive analysis on the found data 534 (e.g., hidden means, translation, error detection, etc.).

The distributed computing criteria module 526 establishes distributed computing criteria 542 based on the data identifying criteria and data analyzing criteria. The distributed computing criteria module 526 establishes the distributed computing criteria 542 by at least one of a plurality of approaches. A first approach includes estimating computational resource requirements for searching the data on the network in accordance with the data identifying criteria 538 to produce the found data 534 and analyzing the found data 534 in accordance with the data analyzing criteria 540. A second approach includes determining computational capabilities of the set of DST units 516. A third approach includes establishing the distributed computing criteria 542 based on the estimated computational resource requirements and the computational capabilities.

The results module 528 facilitates searching the data 532 to produce the found data 534 and analyzing the found data 534 to produce the network data resultant 536 through a series of steps. In a first step, the results module 528 distributes the data identifying criteria 538 and the data analyzing criteria 540 to the set of DST units 516 in accordance with the distributed computing criteria 542. The distributing may include the results module 528 estimating computational resource requirements for searching the data 532 on the network 530 in accordance with the data identifying criteria 538 to produce the found data 534 and analyzing the found data 534 in accordance with the data analyzing criteria 540. Next, the results module 528 selects the set of DST units 516 from the plurality of DST units 514 based on the computational resource requirements.

In a second step, the results module 528 receives a set of network data partial resultants 544 from the set of DST units 516 where the set of DST units 516 generates the set of network data partial resultants 544 based on searching the data 532 on the network 530 in accordance with the data identifying criteria 538 to produce the found data 534 and analyzing the found data 534 in accordance with the data analyzing criteria 540. In a third step, the results module 528 processes the set of network data partial resultants 544 to produce the network data resultant 536 regarding the data 532 on the network 530.

The results module 528 further functions to establish data storage criteria for storing at least one of the found data 534 and the data 532 on the network 530. The data storage criteria identifies the at least one of the found data 534 and the data 532 on the network 530 and includes dispersed storage error coding parameters. The set of DST units 516 further functions to store the at least one of the found data 534 and the data 532 on the network 530 in accordance with the dispersed storage error coding parameters. For example, the results module 528 dispersed storage error encodes the at least one of the found data 534 and the data 532 on the network 530 in accordance with the dispersed storage error coding parameters to produce a plurality of sets of encoded data slices 546 and outputs the plurality of sets of encoded data slices 546 to the set of DST units 516 for storage therein.

A DST unit 519 of the set of DST units 516 may determine whether to sub-distribute at least one of an allocated portion of the network data identifying criteria 538 and an allocated portion of the network data analyzing criteria 540. When the DST unit 519 determines to sub-distribute the at least one of an allocated portion of the network data identifying criteria 538 and an allocated portion of the network data analyzing criteria 540, the DST unit 519 establishes at least one of local data identifying criteria 548 for searching the data 532 on the network 530 based on an allocation portion of the data identifying criteria 538 and local data analyzing criteria 550 for analyzing local found data 552 of the found data 534 based on an allocation portion of the data analyzing criteria 540. The DST unit establishes local distributed computing criteria based on at least one of the local data identifying criteria 548 and the local data analyzing criteria 550. The DST unit 519 distributes the at least one of the local data identifying criteria 548 and the local data analyzing criteria 550 to a second set of DST units 518 in accordance with the local distributed computing criteria (e.g., second set may include this DST unit).

At least one of the DST units 519 of the first set of DST units 516 and the second set of DST units 518 performs analysis of local found data 552 to produce one of the set of network data partial resultants 544. When the DST unit 519 of the set of DST units 516 performs analysis of local found data 552, the DST unit 519 of the set of DST units 516 performs a series of steps. A first step includes distributing the local data identifying criteria 548 to the second set of DST units 518 in accordance with the local distributed computing criteria. A second step includes receiving a set of sub-partial found data 554 from the second set of DST units 518. A third step includes compiling the set of sub-partial found data 554 into partial found data. A fourth step includes performing the allocation portion of the data analyzing criteria 540 on the partial found data to produce one of the set of network data partial resultants 544.

When the second set of DST units 518 performs analysis of local found data 552, the DST unit 519 of the set of DST units 516 performs a series of steps. A first step includes performing the allocation portion of the data identifying criteria 538 to produce partial found data. A second step includes distributing the local data analyzing criteria 550 to the second set of DST units 518 in accordance with the local distributed computing criteria. A third step includes dividing the partial found data into a set of sub-partial found data 554 in accordance with the local distributed computing criteria. A fourth step includes distributing the set of sub-partial found data 554 to the second set of DST units 518 in accordance with the local distributed computing criteria. A fifth step includes receiving a set of data sub-partial results 556 from the second set of DST units 518. A sixth step includes compiling the set of data sub-partial results 556 to produce one of the set of network data partial resultants 544.

FIG. 44C is a flowchart illustrating an example of analyzing data. The method begins at step 560 where a processing module (e.g., of a dispersed storage and task (DST) unit) establishes data identifying criteria for searching data on a network. The establishing includes at least one of a plurality of approaches. A first approach includes determining data content search criteria (e.g., text search words, phrase search, photo, voice print, etc.). A second approach includes determining file name search criteria. A third approach includes determining data source identifying criteria. A fourth approach includes determining data destination identifying criteria. A fifth approach includes determining data type searching criteria (e.g., text file, email file, picture file, video file, etc.). A sixth approach includes determining data routing searching criteria (e.g., a data generation source, a data generation consumption entity, a routing path, an alternate routing path, etc.). A seventh approach includes compiling at least one of the data content search criteria, the file name search criteria, the data source identifying criteria, the data destination identifying criteria, the data type searching criteria, and the data routing searching criteria to produce the data identifying criteria.

The method continues at step 562 where the processing module establishes data analyzing criteria for analyzing found data of the data on the network. The establishing includes at least one of a plurality of approaches. A first approach includes performing organization analysis on the found data (e.g., filtering limit found data content to a particular sender and/or recipient, categorizing the found data, aggregating the found data, etc.). A second approach includes performing statistical analysis on the found data (e.g., word count, number of matches, summary of found data, etc.). A third approach includes performing interpretive analysis on the found data (e.g., hidden means, translation, error detection, etc.).

The method continues at step 564 where the processing module establishes distributed computing criteria based on the data identifying criteria and data analyzing criteria. The establishing includes at least one of a plurality of approaches. A first approach includes estimating computational resource requirements for searching the data on the network in accordance with the data identifying criteria to produce the found data and analyzing the found data in accordance with the data analyzing criteria. A second approach includes determining computational capabilities of a set of DST units. A third approach includes establishing the distributed computing criteria based on the estimated computational resource requirements and the computational capabilities.

The method continues at step 566 where the processing module distributes the data identifying criteria and the data analyzing criteria to a set of distributed storage and task (DST) units in accordance with the distributed computing criteria. The distributing may include estimating computational resource requirements for searching the data on the network in accordance with the data identifying criteria to produce the found data and analyzing the found data in accordance with the data analyzing criteria. Next, the processing module selects the set of DST units from a plurality of DST units based on the computational resource requirements.

The method continues at step 568 where a DST unit of the set of DST units determines whether to sub-distribute at least one of an allocated portion of the network data identifying criteria and an allocated portion of the network data analyzing criteria. The DST unit determines to sub-distribute at least one of an allocated portion of the network data identifying criteria and an allocated portion of the network data analyzing criteria when offloading at least one of identifying data and analyzing data to a second set of DST units. For example, the DST unit determines to offload the identifying data when available DST unit resources compares unfavorably to a required level of resources. The DST unit performs the identifying data and analyzing data when not offloading to output a network data partial resultant (e.g., to the processing module).

When the DST unit determines to sub-distribute the at least one of an allocated portion of the network data identifying criteria and an allocated portion of the network data analyzing criteria, the method continues at step 570 where the processing module establishes at least one of local data identifying criteria for searching the data on a network based on an allocation portion of the data identifying criteria and local data analyzing criteria for analyzing local found data of the found data based on an allocation portion of the data analyzing criteria. Next, the DST unit establishes local distributed computing criteria based on at least one of the local data identifying criteria and the local data analyzing criteria. The method continues at step 572 where the DST unit distributes the at least one of the local data identifying criteria and the local data analyzing criteria to the second set of DST units in accordance with the local distributed computing criteria.

When the DST unit offloads the identifying, the method continues at step 574 where the DST unit receives a set of sub-partial found data from the second set of DST units subsequent to distributing the local data identifying criteria to the second set of DST units in accordance with the local distributed computing criteria. The method continues at step 576 where the DST unit compiles the set of sub-partial found data into partial found data. The method continues at step 578 where the DST unit performs the allocation portion of the data analyzing criteria on the partial found data to produce one of the set of network data partial resultants. Next, the DST unit outputs the one of the set of network data partial resultants (e.g., to the processing module). The method branches to step 592.

When the DST unit offloads the analyzing, the method continues at step 580 where the DST unit performs the allocation portion of the data identifying criteria to produce partial found data. The method continues at step 582 where the DST unit distributes the local data analyzing criteria to the second set of DST units in accordance with the local distributed computing criteria. The method continues at step 584 where the DST unit divides the partial found data into a set of sub-partial found data in accordance with the local distributed computing criteria. The method continues at step 586 where the DST unit distributes the set of sub-partial found data to the second set of DST units in accordance with the local distributed computing criteria. The method continues at step 588 where the DST unit receives a set of data sub-partial results from the second set of DST units. The method continues at step 590 where the DST unit compiles the set of data sub-partial results to produce one of the set of network data partial resultants. Next, the DST unit outputs the one of the set of network data partial resultants (e.g., to the processing module).

The method continues at step 592 where the processing module receives a set of network data partial resultants from the set of DST units, wherein the set of DST units generates the set of network data partial results based on searching the data on the network in accordance with the data identifying criteria to produce the found data and analyzing the found data in accordance with the data analyzing criteria. The method continues at step 594 where the processing module processes the set of network data partial resultants to produce a network data resultant regarding the data on the network. The method continues at step 596 where the processing module establishes data storage criteria for storing at least one of the found data and the data on a network, wherein the data storage criteria identifies the at least one of the found data and the data on a network and includes dispersed storage error coding parameters. The method continues at step 598 where the set of DST units store the at least one of the found data and the data on a network in accordance with the dispersed storage error coding parameters.

FIG. 45 is a flowchart illustrating an example of searching a data index. The method begins at step 600 where a processing module (e.g., of a distributed storage and task (DST) execution unit) obtains a data index search request to search a data index. The data index search request includes one or more of a data index identifier of a data index to search, one or more search terms (e.g., a trigger, a pattern, a value, a range, match criteria, failure criteria), subsequent search terms for subsequent searches based on a search term match, and subsequent search terms for subsequent searches based on an unfavorable search term match. The obtaining includes one or more of receiving, determining based on a previous data index search (e.g., modify a search term based on a previous result), a predetermination, a query, and a list.

The method continues at step 602 where the processing module identifies a portion of the data index to search based on the request. The identifying may be based on one or more of the request, a data index directory (e.g., a mapping of major subsections of the data index), execution resource availability, and a search timeframe requirement. The method continues at step 604 where the processing module identifies a dispersed storage and task network (DSTN) storage location corresponding to the portion. The storage location may include a local location (e.g., storage in a memory associated with a present DST execution unit) and one or more other DST execution units. The identifying may be based on one or more of the portion, a directory lookup, a query, and receiving storage location information.

The method continues at step 606 where the processing module determines whether the DSTN storage location is local. The determining may be based on one or more of a directory lookup, a query, and a memory map. The method branches to step 610 when the processing module determines that the DSTN storage location is not local. The method continues to step 608 when the processing module determines that the DSTN storage location is local. The method continues at step 608 where the processing module searches the portion of the data index to produce a result (e.g., executes a search task).

The method continues at step 610 where the processing module generates a task request when the processing module determines that the DSTN storage location is not local. The generating is based on one or more of the data index search request, the portion of the data index to search, and the DSTN storage location. For example, the processing module generates two task requests that include the search task and two DSTN addresses corresponding to the DSTN storage location at two DST execution units. The method continues at step 612 where the processing module sends the task request to a DST execution unit associated with the storage location. The method continues at step 614 where the processing module receives a result (e.g., from the DST execution unit associated with the storage location).

FIG. 46 is a flowchart illustrating another example of searching a data index, which includes similar steps to FIG. 45. The method begins with steps 600, 602, and 608 of FIG. 45 where a processing module (e.g., of a distributed storage and task (DST) execution unit) obtains a data index search request to search a data index, identifies a portion of the data index to search based on the request, and searches the portion of the data index to produce a result. The method continues at step 614 where the processing module determines whether the result is favorable. A favorable result corresponds to a result that compares favorably to a desired result (e.g., a search successfully found a search item, a pattern recognition successfully matched a pattern, etc.). The method branches to step 618 when the processing module determines that the result is not favorable. The method continues to step 616 when the processing module determines that the result is favorable. The method continues at step 616 where the processing module outputs the result. The outputting includes one or more of generating a partial result and sending the partial result to a requesting entity.

The method continues at step 618 where the processing module determines whether to modify the data index. The determining may include comparing a difference between the result and an expected result to a result threshold and indicating that the data index shall be modified when the difference is larger than the result threshold. The method branches to step 624 when the processing module determines to not modify the data index. The method continues to step 620 when the processing module determines to modify the data index.

The method continues at step 620 where the processing module generates updated index generation task information based on the result when modifying the data index. The updated index generation task information includes information to re-index raw data to produce an updated data index and to produce a more favorable result. The generating may be based on one or more of the result, an unfavorable attribute of the result, and the data index. The method continues at step 622 where the processing module indexes the raw data in accordance with the index generation task information to produce an updated data index. In addition, the processing module may send a task request to another DST execution unit. The method branches to step 624.

The method continues at step 624 where the processing module modifies the data index search request. The modifying may be based on one or more of the result, a data index identifier, and an unfavorable attribute of the result. The method repeats back to step 602 of FIG. 45.

FIG. 47A is a flowchart illustrating an example of initiating threshold computing, which includes similar steps to FIG. 5. The method begins with step 126 of FIG. 5 where a processing module (e.g., of a distributed storage and task (DST) client module) receives data and a corresponding task. The method continues at step 626 where the processing module selects one or more DST execution units for the task based on a capability level associated with each of the DST execution units. The selecting includes one or more of determining a number of DST execution units and selecting the number of DST execution units based on one or more of an estimated distributed computing loading level, a DST execution unit capability indicator, a DST execution unit performance indicator, a DST execution unit availability level indicator, a task schedule, and a DST execution unit threshold computing capability indicator. For example, the processing module selects DST execution units 1-8 when DST execution unit availability level indicators for DST execution units 1-8 compares favorably to an estimated distributed computing loading level. The method continues with step 130 of FIG. 5 where the processing module determines processing parameters of the data based on a number of DST execution units.

The method continues at step 628 where the processing module determines task partitioning based on the DST execution units, the processing parameters, and a threshold computing parameter. The threshold computing parameter includes one or more of a decode threshold number of DST execution units, a width number of DST execution units, and a task redundancy requirement (e.g., a number of DST execution units to execute an identical partial task). For example, the processing module partitions the task evenly into five partial tasks to assign to five of eight DST execution units when the decode threshold number is five and the width number is eight. The method continues with steps 134-136 of FIG. 5 where the processing module processes the data in accordance with the processing parameters to produce slice groupings and partitions the task based on the task partitioning to produce partial tasks.

The method continues at step 630 where the processing module sends the slice groupings and corresponding partial tasks to the selected DST execution units. The method continues at step 632 where the processing module determines whether a decode threshold number of partial results are available. The determining may be based on one or more of receiving a partial result, receiving a partial result status, a query, retrieving a partial result, and comparing a number of partial results to the decode threshold. The method continues at step 634 where the processing module obtains at least the decode threshold number of partial results based on the determining whether the decode threshold number of partial results are available. The obtaining includes one or more of receiving a partial result, determining distributed storage and task network (DSTN) addresses corresponding to the selected DST execution units, generating at least a decode threshold number of partial result requests, and sending the at least the decode threshold number of partial result requests to the selected DST execution units utilizing the corresponding DSTN addresses. The method continues at step 636 where the processing module processes the decode threshold number of partial results to produce a result. The processing includes at least one of aggregating the partial results and decoding the partial results to produce the result.

FIG. 47B is a flowchart illustrating an example of processing a threshold computing task, which includes similar steps to FIG. 40B. The method begins with step 354 of FIG. 40B where a processing module (e.g., of a distributed storage and task (DST) execution unit) receives at least one partial task with regards to a group of slices of contiguous data. The method continues at step 638 where the processing module receives the group of slices. The method continues with steps 364, 366, and 370 of FIG. 40B where the processing module determines execution steps of schedule, identifies a portion of the contiguous data, and executes the steps in accordance with the schedule on the portion of the contiguous data to produce a partial result.

The method continues at step 640 where the processing module determines whether the partial result compares favorably to an expected result. The expected result includes one or more of a result that was produced, the result was produced without computing errors (e.g., no divide by zero, etc.), the result is within a predetermined favorable range of results, and a result type of the result is of a predetermined result type. The method branches to step 642 when processing module determines that the partial result compares favorably to the expected result. The method continues to step 654 when the processing module determines that the partial result compares unfavorably to the expected result. The method continues at step 654 where the processing module modifies the execution steps and schedule. The modifying includes one or more of establishing updated steps and/or schedule to address an unfavorable nature of the partial result. The method loops back to step 366 of FIG. 40B. Alternatively, the process may end when reaching a limit of a number of loops and/or receiving a cancel request.

The method continues at step 642 where the processing module indicates that the partial result is favorable when the processing module determines that the partial result compares favorably to the expected result. For example, the processing module sends a result status to a requesting entity that includes an indication that the partial result is favorable. The method continues at step 644 where the processing module generates a slice grouping of the partial result. The method continues at step 646 where the processing module generates error coded data slice groupings modification information based on the slice groupings of the partial result. The generating may be based on one or more of a number of participating pillars, the slice grouping, a previous slice grouping of the partial result, an encoding matrix, an error coded data pillar number, and a zero information gain slice building approach. The zero information gain slice rebuilding approach is discussed in greater detail with reference to FIG. 50.

The method continues at step 648 where the processing module facilitates storing the slice grouping in the DSTN. For example, the processing module stores the slice grouping in a memory associated with a local (e.g., present) DST execution unit. The method continues at step 650 where the processing module facilitates storing the error coded data slice grouping modification information in the DSTN. For example, the processing module sends a first error coded data slice grouping modification information to a first DST execution unit and a second error coded data slice grouping modification information to a second DST execution unit, where the first and second DST execution units store error coded data slices corresponding to the slice grouping. The method continues at step 652 where the processing module indicates that the partial result is available. For example, the processing module sends a result status to the requesting entity that includes an indication that the partial result is available (e.g., available in the DSTN for retrieval).

FIG. 48A is a flowchart illustrating an example of generating a task, which includes similar steps to FIGS. 5 and 47A.

The method begins with step 126 of FIG. 5 where a processing module (e.g., of a distributed storage and task (DST) client module) receives data and a corresponding task and continues with step 626 of FIG. 47A where the processing module selects one or more DST execution units for the task based on a capability level associated with each of the DST execution units. The method continues with steps 130-136 of FIG. 5 where the processing module determines processing parameters of the data based on a number of DST execution units, determines task partitioning based on the DST execution units and the processing parameters, processes the data in accordance with the processing parameters to produce slice groupings, and partitions the task based on the task partitioning to produce partial tasks.

The method continues at step 654 where the processing module generates a partial task request message for each DST execution unit that includes corresponding partial tasks. As such, a mailbox message is produced corresponding to each partial task request message. The method continues at step 656 where the processing module processes each partial task request message in accordance with the processing parameters to produce task request slice groupings. The processing includes generating slices such that each message is directed at a corresponding DST execution unit. The method continues at step 658 where the processing module sends the slice groupings and the task request slice groupings to the selected DST execution units for storage therein. For example, the processing module sends a second slice grouping and a second task request slice grouping to DST execution unit 5, wherein the second slice grouping corresponds to the second task request slice grouping.

The method continues at step 660 where the processing module retrieves at least a decode threshold number of task response slices of one or more task response slice groupings from the DST execution units. The retrieving includes one or more of generating a retrieval request for slices that are of contiguous bytes of a task response and sending the retrieval request to a corresponding DST execution unit. The method continues at step 662 where the processing module decodes the task response slices to reproduce one or more task responses. The decoding includes at least one of aggregating the task response slices to reproduce the one or more task responses when the decode threshold number of task response slices correspond to data of the task responses (e.g., and not error coded data).

The method continues at step 664, when the task responses are favorable, the processing module retrieves at least a decode threshold number of partial result slices of one or more partial result slice groupings. The retrieving includes one or more of generating a retrieval request for slices that are of contiguous bytes of a partial result and sending the retrieval request to a corresponding DST execution unit. The method continues at step 666 where the processing module decodes the partial results slices to reproduce one or more partial results. The decoding includes at least one of aggregating the partial results slices to reproduce the one or more partial results when the decode threshold number of partial results slices correspond to data of the partial results (e.g., and not error coded data). The method continues at step 668 where the processing module processes the one or more partial results to produce a result. For example, the processing module aggregates the partial results to produce the result.

FIG. 48B is a flowchart illustrating an example of initiating a task, which includes similar steps to FIG. 40B. The method begins at step 670 where a processing module (e.g., of a distributed storage and task (DST) execution unit) receives a slice grouping of contiguous data and a corresponding task request slice grouping (e.g., from a DST client module). The method continues at step 672 where the processing module stores the slice grouping and the task request slice grouping (e.g., in accordance with a received storage task). For example, the processing module stores the slice grouping and the task request slice grouping in a local memory (e.g., as a mailbox).

The method continues at step 674 where the processing module retrieves the task request slice grouping to reproduce a partial task request message that includes at least one partial task (e.g., retrieving a mail message from the mailbox). The method continues with steps 364, 366, and 370 of FIG. 40B where the processing module determines execution steps and schedule, identifies a portion of the contiguous data, and executes the steps in accordance with the schedule on the portion of the contiguous data to produce a partial result. The method continues at step 676 where the processing module generates a partial task response that includes a partial result status indicator based on the partial result. The partial result status indicator includes one of a result ready status level and a result not ready status level.

The method continues at step 678 where the processing module processes the partial task response in accordance with the processing parameters to produce a task response slice grouping. The processing module may utilize zero information gain (ZIG) partial slice encoding to generate error coded task response slices based on one or more of a number of participating pillars, the task response slice grouping, a previous task response slice grouping, an encoding matrix, an error coded data pillar number, and a zero information gain slice building approach. The zero information gain slice rebuilding approach is discussed in greater detail with reference to FIG. 50. The method continues at step 680 where the processing module facilitates storing the task response slice grouping as task response slices. For example, the processing module sends the task response slice groupings to a distributed storage and task network (DSTN) for storage therein (e.g., a return mailbox).

The method continues at step 682 where the processing module processes the partial result in accordance with the processing parameters to produce a partial result slice grouping. In addition, the processing module may utilize zero information gain (ZIG) partial slice encoding to generate error coded partial result slices based on one or more of a number of participating pillars, the partial result slice grouping, a previous partial result slice grouping, an encoding matrix, an error coded data pillar number, and a zero information gain slice building approach. The method continues at step 684 where the processing module facilitates storing the partial result slice grouping as partial results slices. For example, the processing module sends the partial results slice groupings to the distributed storage and task network (DSTN) for storage therein (e.g., a return mailbox).

FIG. 49 is a flowchart illustrating another example of ingesting data, which includes similar steps to FIG. 5. The method begins at step 686 where a processing module (e.g., of a distributed storage and task (DST) execution unit) receives raw data for storage in a distributed storage and task network (DSTN). For example, the processing module receives a web upload as the raw data. As another example, the processing module receives a mass storage upload as the raw data. The method continues at step 688 where the processing module determines a storage profile for the raw data. The storage profile includes one or more of a security requirement, a performance requirement, an estimated retrieval frequency, an estimated distributed processing level, a data visibility profile, a data owner, a data index storage indicator, and a data deletion policy. The data deletion policy includes a data deletion indicator specifying circumstances to delete the raw data from the DSTN. For example, the data deletion indicator includes at least one of delete after a deletion time period expires, a deletion time period, never delete, and delete only upon request.

The method continues at step 690 where the processing module indexes the raw data in accordance with index generation task information to produce a data index that includes the storage profile. The method continues at step 692 where the processing module selects at least one of the raw data and the data index as data for storage in accordance with the storage profile. For example, the processing module selects the data index for storage in the DSTN and the raw data for storage in a local memory. The processing module may update a directory to indicate where the data is stored.

The method continues at step 694 where the processing module determines a task corresponding to the data, or that the task includes at least one of storing the data and processing the data to resize the data including generating indexed data. The determining may be based on one or more of the storage profile, a request from a requesting entity, a raw data size indicator, a maximum data size threshold, and an execution resource availability indicator. The method continues with steps 130-138 of FIG. 5 where the processing module determines processing parameters of the data based on a number of DST execution units, determines task partitioning based on the DST execution units and the processing parameters, processes the data in accordance with the processing parameters to produce slice groupings, partitions the task based on the task partitioning to produce partial tasks, and sends the slice groupings and corresponding partial tasks to the DST execution units. A DST execution unit subsequently processes a corresponding slice grouping including at least one of storing the corresponding slice grouping, processing some of the slice grouping in accordance with the task, and deleting some of the slice grouping in accordance with at least one of the storage profile and the task.

FIG. 50 is a flowchart illustrating an example of modifying a slice grouping, which includes similar steps to FIGS. 40B and 47B. The method begins with step 354 of FIG. 40B where a processing module (e.g., of a distributed storage and task (DST) execution unit) receives at least one partial task with regards to a group of slices of contiguous data. The method continues with step 638 of FIG. 47B where the processing module receives the group of slices and continues with steps 364, 366, and 370 of FIG. 40B where the processing module determines execution steps and schedule, identifies a portion of the contiguous data, and executes the steps in accordance with the schedule on the portion of the contiguous data to produce a partial result.

The method continues at step 696 where the processing module modifies a second portion of the contiguous data based on the partial result to produce an updated contiguous data. For example, the processing module replaces part of the portion of the contiguous data with the second portion of the contiguous data when the at least one partial task specifies to directly update a portion of the data as the partial result. The method continues at step 698 where the processing module stores the updated contiguous data as an updated group of slices (e.g., stored in a local memory).

The method continues at step 700 where the processing module, for each group of error coded data slices, generates error coded data slice grouping modification information based on the group of slices and the updated group of slices. The processing module utilizes a zero information gain (ZIG) slice building approach based on one or more of a number of participating pillars, the group of slices, the updated group of slices, an encoding matrix, and an error coded data pillar number. The processing module generates the error coded data slice grouping modification information as an exclusive OR function (XOR) of a partial encoding of a group of error coded data slices with respect to the updated group of slices XOR'd with a partial encoding of a group of error coded data slices with respect to the group of slices.

The processing module generates the partial encoding of the group of error coded data slices with respect to the updated group of slices by obtaining an encoding matrix utilized to generate the group of error coded data slices (e.g., extract from a request, retrieve from a memory), reducing the encoding matrix to produce a square matrix that exclusively includes rows identified as participating pillars (e.g., slice pillars associated with participating DST execution units of a decode threshold number of DST execution units), inverting the square matrix to produce an inverted matrix (e.g. alternatively, may extract the inverted matrix from the request), matrix multiplying the inverted matrix by the group of slices to produce a vector, and matrix multiplying the vector by a row of the encoding matrix corresponding to the error coded data slice grouping (e.g. alternatively, may extract the row from the request), to produce the partial encoded group of error coded data slices. The processing module generates the partial encoding of the updated group of error coded data slices in a similar fashion by utilizing the updated group of error coded data slices and place of the group of error coded data slices.

The method continues at step 702 where the processing module, for each DST execution unit corresponding to each group of error coded data slices, sends the error coded data slice grouping modification information to the DST execution unit. The method continues at step 704 where the processing module updates a directory to indicate a subsequent revision is visible. A DST execution unit responsible for error coded data slices generates and stores updated parity, where the generating includes calculating an updated error coded data slice grouping as an XOR of error coded data slice grouping (e.g., previously stored) with received error coded data slice grouping modification information.

FIG. 51 is a flowchart illustrating an example of further processing of a group of slices, which includes similar steps to FIGS. 5, 40B, and 47B. The method begins with step 354 of FIG. 40B where a processing module (e.g., of a distributed storage and task (DST) execution unit) receives at least one partial task with regards to a group of slices of contiguous data and continues with step 638 of FIG. 47B where the processing module receives the group of slices. The method continues with steps 364, 366, and 370 of FIG. 40B where the processing module determines execution steps and schedule, identifies a portion of the contiguous data, and executes the steps in accordance with the schedule on the portion of the contiguous data to produce a partial result.

The method continues at step 706 where the processing module determines whether to further process the partial result. The determining may be based on one or more of comparing the partial result to a partial result threshold with regards to one or more aspects of the partial result. For example, the processing module determines to further process the partial result when the partial result does not include a keyword search aspect. The method branches to step 708 when the processing module determines to further process the partial result. The method continues to step 712 when the processing module determines to not further process the partial result. The method continues at step 712, which includes steps 372 and 374 of FIG. 40B, where the processing module dispersed storage error encodes the partial result to produce a plurality of sets of slices and facilitates storing the plurality of sets of slices in a distributed storage and task network (DSTN).

The method continues at step 708 where the processing module selects one or more of the partial result, the contiguous data, and one or more other contiguous data as data. The selecting may be based on the partial result, a partial result threshold, a comparison of the partial result to the partial result threshold, an aspect of the partial result, a trigger associated with the aspect of the partial result, and a comparison of the aspect of the partial result with the trigger associated with the aspect of the partial result. The selecting enables processing, including at least one of processing the partial result further with a current task, processing the contiguous data with new tasks, and activating additional DST execution units to reprocess corresponding grouping of slices with new tasks. The method continues at step 710 where the processing module determines a task corresponding to the data (e.g., a lookup). The method continues with steps 130-132 of FIG. 5 where the processing module determines processing parameters of the data based on a number of DST execution units and determines task partitioning based on the DST execution units and the processing parameters.

The method continues with step 134 of FIG. 5 where the processing module processes the data in accordance with the processing parameters to produce slice groupings to align each slice grouping with a corresponding DST execution unit. The method continues with step 136 of FIG. 5 where the processing module partitions the task based on the task partitioning to produce partial tasks. The method continues with step 138 of FIG. 5 where the processing module sends the slice groupings of the corresponding partial tasks to the DST execution units. For example, the processing module sends slice groupings when sending the partial result and/or the contiguous data.

FIG. 52 is a flowchart illustrating an example of identifying data associations. The method begins at step 714 where a processing module (e.g., of a distributed storage and task (DST) execution unit) obtains raw data in accordance with the data ingestion task. For example, the processing module retrieves locally stored data as the raw data. The method continues at step 716 where the processing module indexes the raw data in accordance with index generation task information to produce a data index. The method continues at step 718 where the processing module processes the raw data based on the data index and in accordance with data indexing task information to produce indexed data.

The method continues at step 720 where the processing module facilitates storing one or more of the raw data, the data index, and the indexed data in a distributed storage and task network (DSTN). The storing includes one or more of selecting the data based on a selection input and storing the data in accordance with a storage method associated with the data. For example, the processing module stores the data as dispersed data to facilitate subsequent retrieval. As another example, the processing module stores the data as groups of slices of contiguous data to facilitate subsequent distributed computing tasks.

The method continues at step 722 where the processing module generates second index generation task information based on the data index, the indexed data, and/or an association guideline. The method continues at step 724 where the processing module indexes the data index in accordance with the second index generation task information to produce a second data index. For example, the processing module searches the raw data utilizing search parameters of the second index generation task information to produce the second data index.

The method continues at step 726 where the processing module generates second data indexing task information based on the second data index. The generating may be based on one or more of the second data index, the indexed data, and the association guideline. The method continues at step 728 where the processing module processes the raw data based on the second data index in accordance with the second data indexing task information to produce second indexed data. For example, the processing module extracts portions of the raw data that are associated with the second data index and that are relevant with respect to the second data indexing task information.

The method continues at step 730 where the processing module identifies one or more associations of data within the raw data based on one or more of the data index, the second data index, the indexed data, and the second indexed data. The identifying may be in accordance with a correlation guidance information, wherein the correlation guidance information includes data of the second indexed data associated with data of the data index.

The method continues at step 732 where the processing module facilitates storing one or more of the associations, the second data index, and the second indexed data in the DSTN. The storing includes one or more of selecting the one or more of the associations, the second data index, and the second indexed data as association result data and storing the data in accordance with a storage method associated with the association result data. For example, the processing module stores the data as dispersed data to facilitate subsequent retrieval. As another example, the processing module stores the data as groups of slices of contiguous data to facilitate subsequent distributed computing tasks.

FIG. 53A is a diagram illustrating encoding of data 734 that includes data 734 organized as a plurality of chunksets 1-N (e.g., a data partition, or portion thereof), a chunkset data matrix 736 for each of the plurality of chunksets 1-N that includes a row for each chunk, a generator matrix 738 to encode each chunkset column by column via a column selector 746 as a data selection 740 to produce a corresponding chunkset matrix of slices 742, and a pillar selector 744 to route slices of each chunkset to a corresponding distributed storage and task execution (DST EX) unit for task processing.

A number of chunks per chunkset is determined as a number of required parallel DST execution units to process parallel task processing to complete an overall task within a desired task execution time period. A decode threshold of an information dispersal algorithm (IDA) is determined as the number of chunks. A pillar width number of the IDA is determined based on or more of the decode threshold, a number of available DST EX units, an availability requirement, and a reliability requirement. For example, the decode threshold is set at 5 when the number of chunks is 5 and the pillar width is set at 8 in accordance with a reliability requirement.

A chunk size of each chunkset is determined to match a chunk size requirement for task processing. For example, a chunk size is determined as 20 k bytes when a DST EX unit indicates that a task processing data size limit is 20 k bytes. A chunkset size is the number of chunks multiplied by the chunk size. For example, the chunkset is 100 k bytes when the chunk size is 20 k bytes and the number of chunks is 5. A number of chunksets N is determined as a size of the data divided by the size of the chunkset.

The generator matrix 738 is determined in accordance with the IDA and includes a decode threshold number of columns and a pillar width number of rows. A unity matrix is utilized as a top square matrix to facilitate generation of contiguous slices that match contiguous data of chunks. Other rows of the encoding matrix facilitate generating error coded slices for remaining rows of the chunkset slice matrix.

For each chunkset, the generator matrix 738 is matrix multiplied by a column of the corresponding chunkset data matrix 736 (e.g., data selection 740 as selected by column selector 746) to generate a column of the chunkset slice matrix 742 for the corresponding chunkset. For example, row 1 of the generator matrix 738 is matrix multiplied by column 1 of the chunkset data matrix 736 to produce a row 1 byte of column 1 of the chunkset slice matrix 742, row 2 of the generator matrix 738 is matrix multiplied by column 1 of the chunkset data matrix 736 to produce a row 2 byte of column 1 of the chunkset slice matrix 742, etc. As another example, row 1 of the generator matrix 738 is matrix multiplied by column 2 of the chunkset data matrix to produce a row 1 byte of column 2 of the chunkset slice matrix, row 2 of the generator matrix is matrix multiplied by column 2 of the chunkset data matrix 736 to produce a row 2 byte of column 2 of the chunkset slice matrix 742, etc.

A segment may be considered as one or more columns of the chunkset data matrix 736 and slices that correspond to the segment are the rows of the chunkset slice matrix 742 that correspond to the one or more columns of the chunkset data matrix 736. For example, row 1 columns 1 and 2 of the chunkset slice matrix 742 form slice 1 when columns 1 and 2 of the chunkset data matrix 736 are considered as a corresponding segment. Slices of a common row of the chunkset slice matrix 742 are of a chunk of contiguous data of the data 734 and share a common pillar number and shall be stored in a common DST EX unit to facilitate a distributed task.

The pillar selector 744 routes slices of each pillar to a DST EX unit in accordance with a pillar selection scheme. For example, two slices of row 1 (e.g., slice comprising bytes from columns 1 through 10$k$ and slice 2 comprising bytes from columns 10$k$+1 through 20$k$) of the chunkset slice matrix 742 are sent to DST EX unit 1 as a contiguous chunk of data that includes 20 k bytes when the pillar selection scheme maps pillars 1-5 (e.g., associated with slices of contiguous data), to DST EX units 1-5 and maps pillars 6-8 (e.g., associated with error coded slices) to DST EX units 6-8 for a first chunkset.

To facilitate load leveling of tasks executed by the DST EX units, the pillar selection scheme may include rotating assignments of pillars to different DST EX units for each chunkset. For example, two slices of row 8 (e.g., slice comprising bytes from columns 1 through 10$k$ and slice 2 comprising bytes from columns 10$k$+1 through 20$k$) of the chunkset slice matrix 742 are sent to DST EX unit 1 as error coded data slices that includes 20 k bytes when the pillar selection scheme maps pillar 8 (e.g., associated with error coded slices), to DST EX units 1 and maps pillars 1 (e.g., associated with slices of contiguous data) to DST EX units 8 for another chunkset.

FIG. 53B is a flowchart illustrating an example of generating a slice grouping, which includes similar steps to FIG. 5. The method begins with step 126 of FIG. 5 where a processing module (e.g., of a distributed storage and task (DST) client module) receives data and a corresponding task. The method continues at step 748 where the processing module selects a number of DST execution units to favorably execute partial tasks of the corresponding tasks. The selecting includes determining a number of simultaneous compute resources to complete the task in a favorable timeframe based on DST execution unit capability. The method continues at step 750 where the processing module determines task partitioning based on one or more of distributed computing capabilities of the selected DST execution units. The determining includes at least one of aligning task partitions with DST execution unit capabilities and aligning subsequent computing tasks (e.g., based on partial results) with DST execution unit capabilities.

The method continues at step 752 where the processing module determines processing parameters of the data based on the task partitioning. The determining includes determining partitioning of data into chunks and chunksets based on the number of DST EX units to favorably execute the partial tasks. The method continues with steps 136 and 134 of FIG. 5 where the processing module partitions the tasks based on the task partitioning to produce partial tasks and processes the data in accordance with the processing parameters to produce slice groupings. The method continues at step 754 where the processing module sends the slice groupings in the corresponding partial tasks to the DST execution units in accordance with the pillar mapping. The processing module may obtain the pillar mapping based on one or more of receiving the mapping, a query, and generating the mapping based on a data processing load leveling requirement. The pillar mapping may include rotation of assignment of slice groupings by pillar to different DST execution units (e.g., a round-robin approach to facilitate load leveling).

FIG. 54 is a flow chart illustrating an example of selecting distributed computing resources, which includes similar steps to FIGS. 5 and 53B. The method begins with step 126 of FIG. 5 where a processing module (e.g., of a distributed storage and task (DST) client module) receives data and a corresponding task. The method continues at step 756 where the processing module identifies candidate DST execution units for executing partial tasks of the corresponding task. The identifying may include obtaining a distributed task computing capability level by one or more of a query, a lookup, and receiving a message and selecting the candidate DST execution units associated with favorable distributed task computing capability levels (e.g., above a threshold). A distributed task computing capability level includes one or more of a processing capability level, a memory capacity level, a network access level, a bandwidth capability level, an availability level, and a reliability level.

The method continues at step 758 where the processing module obtains distributed computing capabilities of the candidate DST execution units based on one or more of a query, a lookup, and receiving a message. The method continues at step 760 where the processing module selects a number of DST execution units of the candidate DST execution units to favorably execute the partial tasks of the corresponding tasks. The selecting includes identifying a number of simultaneous compute resources to execute the task in a favorable timeframe based on the distributed computing capabilities of the candidate DST execution units.

The method continues at step 762 where the processing module determines task partitioning based on one or more of the distributed computing capabilities of the selected DST execution units, the processing parameters, and an estimated next data processing destination. The determining includes aligning tasks with DST capabilities for current and potential future tasks. The method continues with step 752 of FIG. 53B where the processing module determines processing parameters of the data based on the task partitioning and continues with steps 136, 134, and 138 of FIG. 5 where the processing module partitions the tasks based on the task partitioning to produce partial tasks, processes the data in accordance with the processing parameters to produce slice groupings, and sends the slice groupings and corresponding partial tasks to the DST execution units.

FIG. 55 is a flowchart illustrating an example of retrieving distributed computed data, which includes similar steps to FIG. 48A. The method begins at step 764 where a processing module (e.g., of a distributed storage and task (DST) client module) receives a retrieve data request (e.g., from a user device), where the data is stored in a distributed storage and task network (DSTN) as a result of at least one executed partial task. For example, the data represents a partial result of a previously executed task. As another example, the data represents modify data of the previously executed task. The method continues at step 766 where the processing module identifies DST execution units of the DSTN associated with the data. The association includes one or more of where initial data was sent for storage and/or processing of a task, where a partial task was sent for storage and/or processing, where a partial result (e.g., an intermediate result) was sent for storage and/or further processing, where a subsequent partial task was sent for storage and/or processing, a location received in response to a query of DST allocation information, and a location extracted from a location table lookup. The method continues with steps 660 and 662 of FIG. 48A where the processing module retrieves at least a decode threshold number of task response slices of one or more task response slice groupings from the DST execution units and decodes the task response slices to reproduce one or more task responses.

The method continues at step 768 where the processing module determines second DST execution units associated with partial results based on the one or more task responses. The determining may be based on one or more of extracting second DST execution unit identifier information from the one or more task responses and performing a lookup to extract the second DST execution unit identifiers. For example, the processing module accesses DST allocation information to retrieve identifiers of the second DST execution units.

The method continues at step 770 where the processing module retrieves at least a decode threshold number of partial results slices of one or more partial results slice groupings from the second DST execution units. The retrieving includes one or more of selecting DST execution units associated with the one or more partial results slice groupings (e.g., that contain results and not error coded data), generating slice retrieval requests, sending the slice retrieval requests to identify DST execution units, and receiving the at least the decode threshold number of partial results slices. The method continues with steps 666 and 668 of FIG. 48A where the processing module decodes the partial results slices to reproduce one more partial results and processes the one or more partial results to produce a result.

FIG. 56 is a flowchart illustrating an example of load-balancing distributed computing resources, which includes similar steps to FIGS. 5, 53B, and 54. The method begins with step 126 of FIG. 5 where a processing module (e.g., of a distributed storage and task (DST) client module) receives data and a corresponding task and continues with steps 756, 758, 760, and 762 of FIG. 54 where the processing module identifies candidate DST execution units for executing partial tasks of the corresponding task, obtains distributed computing capabilities of the candidate DST execution units, selects a number of DST execution units of the candidate DST execution units to favorably execute the partial tasks of the corresponding task, and determines task partitioning based on one or more of the distributed computing capabilities of the selected DST execution units, the processing parameters, and an estimated next data processing destination. The method continues with step 752 of FIG. 53B where the processing module determines processing parameters of the data based on the task partitioning and continues with steps 136 and 134 of FIG. 5 where the processing module partitions the task based on the task partitioning to produce partial tasks and processes the data in accordance with the processing parameters to produce slice groupings.

The method continues at step 772 where the processing module determines a pillar mapping for at least some of the slice groupings. The determining includes identifying a favorable assignment of DST execution resources to tasks based on current information with regards to the DST execution resources and requirements of task execution. For example, the processing module may determine a round robin pillar mapping approach to evenly load a decode threshold number of the DST execution units. The method continues at step 774 where the processing module sends at least some of the slice groupings and corresponding partial tasks to the DST execution units in accordance with the pillar mapping.

The method continues at step 776 where the processing module obtains DST execution unit status information with regards to executing the partial tasks. The obtaining includes at least one of initiating a query, receiving status information, and performing a lookup to extract status information. The method continues at step 778 where the processing module updates the pillar mapping based on the DST execution unit status information. For example, the processing module determines an updated pillar mapping to shift DST execution resource loading from the busiest resources to resources that have more favorable available task execution capacity. The method continues at step 780 where the processing module sends other slice groupings and corresponding partial tasks to the DST execution units in accordance with the updated pillar mapping. For example, the processing module sends the other slice groupings and corresponding partial tasks to DST execution units to execute successive steps utilizing improved task execution capability. The process may continue to adjust the pillar mapping until all the partial tasks have been executed corresponding to the task.

FIG. 57 is a flowchart illustrating an example of transforming a task into sub-tasks, which includes similar steps to FIGS. 5, 40B, and 47B. The method begins with step 354 of FIG. 40B where a processing module (e.g., of a distributed storage and task (DST) execution unit) receives at least one partial task with regards to a group of slices of contiguous data and continues with step 638 of FIG. 47B where the processing module receives the group of slices. The method continues at step 782 where the processing module determines whether to process the at least one partial task locally. The determining may be based on one or more of a local task execution capacity level, a required task execution capacity level (e.g., to execute the partial task within a required task execution timeframe), and a comparison of the difference of the local task execution capacity level to the required task execution capacity level to a difference threshold. For example, the processing module determines to process the at least one partial task locally when the difference compares favorably to the difference threshold (e.g., local task execution meets the required task execution timeframe).

The method branches to step 784 when the processing module determines not to process the at least one partial task locally. The method continues to step 364 of FIG. 40B when the processing module determines to process the at least one partial task locally. The method continues with steps 364, 366, and 370 of FIG. 40B where the processing module determines execution steps and schedule, identifies a portion of the contiguous data, and executes the steps in accordance with the schedule on the portion of the contiguous data to produce a partial result.

The method continues at step 784 where the processing module selects a portion of the contiguous data as data when the processing module determines not to process the at least one partial task locally. The selecting includes determining which portion to process locally and which portions to process with other DST execution units based on one or more of DST execution unit task execution capacity and the required task execution timeframe such that the partial task is executed within the required timeframe. The method continues with step 130 of FIG. 5 where the processing module determines processing parameters of the data based on a number of DST execution units.

The method continues at step 786 where the processing module determines task partitioning based on the DST execution units and the processing parameters to transform the at least one partial task into at least one secondary partial task. For example, the processing module determines partitioning to form one or more sub-tasks as the at least one secondary partial tasks for execution by the number of DST execution units. The method continues at step 788 where the processing module processes the data in accordance with the processing parameters to produce secondary slice groupings. For example, the processing module generates groups of slices in accordance with the processing parameters to produce the secondary slice groupings.

The method continues at step 790 where the processing module sends the secondary slice groupings and corresponding secondary partial tasks to the DST execution units. The method continues at step 792 where the processing module receives one or more secondary partial results (e.g., from the DST execution units). The method continues at step 794 where the processing module processes the one or more secondary partial results to produce a partial result. The processing includes at least one of decoding and/or aggregating. In addition, the processing module may send the partial result to a requesting entity and/or facilitate storing of the partial result in a distributed storage and task network (DSTN).

FIG. 58A is a diagram of another example of error encoding and slicing processing of dispersed error encoding to facilitate storing data in accordance with a computational-orientated dispersed storage error coding function (e.g., to enable execution of a portion of a task on the stored data). In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Each data segment is converted via an error encoding and slicing 796 into a set of encoded data slices in accordance with error correction encoding parameters. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slice slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of second the second set of encoded data slices include error correction data based on the first-third words of the second data segment.

The sets of encoded data slices are utilized to form slice groupings for a set of distributed storage and task (DST) execution units. Slice grouping selection processing is performed in accordance with group selection information. In this example, the sets of encoded data slices are organized into five slice groupings (one for each DST execution unit of a set of DST execution units). As a specific example, the grouping selection module creates a first slice grouping for DST execution unit #1, which includes the first encoded slices of each of the sets of encoded slices. As such, the first DST execution unit receives encoded data slices corresponding to data blocks 1-15 (e.g., encoded data slices of contiguous data to enable execution of the portion of the task on the stored data).

The grouping selection module also creates a second slice grouping for DST execution unit #2, which includes the second encoded slices of each of the sets of encoded slices. As such, the second DST execution unit receives encoded data slices corresponding to data blocks 16-30. The grouping selection module further creates a third slice grouping for DST execution unit #3, which includes the third encoded slices of each of the sets of encoded slices. As such, the third DST execution unit receives encoded data slices corresponding to data blocks 31-45.

The grouping selection module creates a fourth slice grouping for DST execution unit #4, which includes the fourth encoded slices of each of the sets of encoded slices. As such, the fourth DST execution unit receives encoded data slices corresponding to first error encoding information (e.g., encoded data slices of error coding (EC) data). The grouping selection module further creates a fifth slice grouping for DST execution unit #5, which includes the fifth encoded slices of each of the sets of encoded slices. As such, the fifth DST execution unit receives encoded data slices corresponding to second error encoding information.

FIG. 58B is a diagram of an example of transforming data blocks from stored data that was stored in accordance with a computational-orientated dispersed storage error coding function to data stored in accordance with a long-term-storage-orientated dispersed storage error coding function. Slice groupings including data blocks stored in accordance with the computational-orientated dispersed storage error coding function stored in a set of distributed storage and task (DST) execution units are transformed using a transform function 798 to produce sets of data blocks stored in accordance with the long-term-storage-orientated dispersed storage error coding function. Utilization of the long-term-storage-orientated dispersed storage error coding function results in contiguous data blocks arranged by a set of encoded data slices. The transform function 798 produces a mapping of slices and facilitates storage of the slices in accordance with the mapping. As a specific example, a first set of encoded data slices includes three encoded data slices from DST execution unit 1, including a first encoded data slice that includes data blocks 1&2 (DS1_d1&2), a second encoded data slice that includes data blocks 3&4 (DS1_d3&4), and a third encoded data slice that includes data blocks 5&6 (DS1_d5&6). The transform function 798 results in the first encoded data slice remaining stored in DST execution unit 1, transfer of the second encoded data slice from DST execution unit 1 to DST execution unit 2, and transfer of the third encoded data slice from DST execution unit 1 to DST execution unit 3.

Each set of encoded data slices includes one or more encoded data slices corresponding to error encoding information (e.g., encoded data slices of error coding (EC) data). The transform function 798 results in encoding of a decode threshold number of encoded data slices of each set of encoded data slices to produce the one or more encoded data slices corresponding to error coding information. For example, the first encoded data slice, the second encoded data slice, and the third encoded data slice are dispersed storage error and encoded to produce two transformed error slices ES T1_1 and ES T1_2 when a decode threshold is 3 and a pillar with is 5. Transformed error slice ES T1_1 is stored at DST execution unit 4 and transformed error slice ES T1_2 is stored at DST execution unit 5.

A de-slicing and error decoding function 800 is utilized to decode the sets of encoded data slices stored in accordance with the long-term-storage-orientated dispersed storage error coding function to produce a plurality of data segments in accordance with long-term storage. As such, each data segment represents words of one or more data blocks of a contiguous data portion of the data. For example, at least a decode threshold number of encoded data slices of the first set of encoded data slices (e.g., that includes the first encoded data slice, the second encoded data slice, and the third encoded data slice) is dispersed storage error decoded in accordance with the de-slicing and error decoding function 800 to produce a data segment including data blocks d1-d6.

FIG. 58C is a schematic block diagram of another embodiment of a distributed computing system that includes a computing device 802 and a set of distributed storage and task (DST) units 804. The set of DST units 804 includes one or more DST units 806. A DST unit 806 of the set of DST units 804 may be implemented by one or more of a DST execution unit, a server, the user device, and a DST processing unit. The computing device 802 may be implemented by one or more of a DST unit 806 of the set of DST units 804, a DST execution unit, a DST client module, a distributed task (DT) execution module, a processing module, a controller, a user device, a DST processing unit, a distributed storage and task network (DSTN) managing unit, and a DST integrity processing unit. The computing device 802 includes a distributed storage (DS) module 808. The DS module 808 includes a determine module 810, a transform module 812, and an obtain module 814.

The system is operable to long-term store at least a portion of temporarily stored data in the set of DST units 804. The temporarily stored data is stored in the set of DST units 804 in accordance with a computational-orientated dispersed storage error coding function. The computational-orientated dispersed storage error coding function includes first dispersed storage error coding parameters that enables a DST unit 806 of the set of DST units 804 to recover, in the pre-dispersed storage error encoded format, a sub-portion of the portion of the temporarily stored data from encoded data slices (e.g., computational slices 816, data and/or check blocks) the DST unit 806 stores (e.g., with minimal communication with other DST units 806 of the set of DST units 804).

The determine module 810 determines whether the at least a portion of temporarily stored data is to be stored long-term. The determining may be based on at least one of receiving a message, detecting expiration of a temporarily stored data time period, and determining that no further computations are to be performed on the at least a portion of the temporarily stored data. For example, the DS module 808 performs a series of computational tasks and upon completion the determine module 810 indicates that the at least a portion of the temporarily stored data is to be stored long-term.

When the at least a portion of the temporarily stored data is to be stored long-term, the transform module 812 performs a series of steps to transform the temporarily stored data to long-term stored data. In a first step of the transforming, the transform module 812 identifies one or more DST units 806 of the set of DST units 804 storing the at least a portion of the temporarily stored data in accordance with the computational-orientated dispersed storage error coding function. The transform module 812 identifies the one or more DST units 806 of the set of DST units 804 by at least one of a plurality of approaches. A first approach includes receiving a message regarding the at least a portion of the temporarily stored data. For example, the message identifies the one or more DST units 806. A second approach includes receiving a message regarding the at least a portion of the temporarily stored data and determining the one or more DST units 806 based on storage of the at least a portion of the temporarily stored data. A third approach includes determining that no further computations are to be performed on the at least a portion of the temporarily stored data.

In a second step of the transforming, the transform module 812 recovers the at least a portion of the temporarily stored data from the one or more DST units 806 in a pre-dispersed storage error encoded format (e.g., data still includes pre-data manipulation functions such as encryption). The recovering includes at least one of retrieving and facilitating transfer (e.g., outputting a request to transfer). For example, the transform module 812 retrieves the computational slices 816 of the temporarily stored data from the one or more DST units 806.

In a third step of the transforming, the transform module 812 dispersed storage error encodes the at least a portion of the temporarily stored data in the pre-dispersed storage error encoded format (e.g., computational slices 816) into a plurality of sets of encoded data slices (e.g., storage slices 818) in accordance with a long-term-storage-orientated dispersed storage error coding function. The long-term-storage-orientated dispersed storage error coding function includes second dispersed storage error coding parameters that prevents the DST unit 806 from recovering, in the pre-dispersed storage error encoded format, the sub-portion of the portion of the temporarily stored data from encoded data slices the DST unit 806 stores and requires retrieval of encoded data slices from multiple DST units 806 of the set of DST units 804 to recover, in the pre-dispersed storage error encoded format, the sub-portion of the portion of the temporarily stored data.

The transform module 812 dispersed storage error encodes the at least a portion of the temporarily stored data by a sequence of procedures. A first procedure includes determining, in accordance with the long-term-storage-orientated dispersed storage error coding function, a data mapping of data-based encoded data slices of the at least a portion of the temporarily stored data in a pre-dispersed storage error encoded format. A second procedure includes generating redundancy-based encoded data slices based on the data-based encoded data slices and in accordance with the long-term-storage-orientated dispersed storage error coding function. A third procedure includes organizing the data-based encoded data slices and the redundancy-based encoded data slices into the plurality of set of encoded data slices (e.g., storage slices 818).

Alternatively, the transform module 812 dispersed storage error encodes the at least a portion of the temporarily stored data by a sequence of alternative procedures. A first alternative procedure includes dispersed storage error encoding the at least a portion of the temporarily stored data in the pre-dispersed storage error encoded format into a plurality of encoded data blocks in accordance with the long-term-storage-orientated dispersed storage error coding function. A second alternative procedure includes organizing the plurality of encoded data blocks into the plurality of sets of encoded data slices in accordance with the long-term-storage-orientated dispersed storage error coding function. For example, utilizing an on-line code conversion process.

In a fourth step of the transforming, the transform module 812 stores the plurality of sets of encoded data slices (e.g., storage slices 818) in the set of DST units 804. The obtain module 814 functions to obtain the temporarily stored data by at least one of two obtaining approaches. A first obtaining approach includes a series of first obtaining approach steps. A first step of the first obtaining approach steps includes temporarily storing raw data 820, as the temporarily stored data, in the set of DST units 804 in accordance with the computational-orientated dispersed storage error coding function. For example, the obtain module 814 dispersed storage error encodes the raw data 820 using the computational-orientated dispersed storage error coding function in accordance with the first dispersed storage error coding parameters to produce a plurality of sets of encoded raw slices 822. Alternatively, at least some of the DST units 806 obtains the raw data 820 and encodes the raw data 820 to produce the plurality of sets of encoded raw slices 822. Next, the obtain module 814 facilitates storage of the plurality of sets of encoded raw slices 822 in the set of DST units 804.

A second step of the first obtaining approach steps includes performing, by at least some of the DST units 806, a task on the temporarily stored data to produce found data 824. A third step of the first obtaining approach steps includes dispersed storage error encoding the found data 824, as the at least a portion of the temporarily stored data, into the plurality of sets of encoded data slices in accordance with the long-term-storage-orientated dispersed storage error coding function (e.g., the computational slices 816). Alternatively, at least some of the DST units 806 dispersed storage error encodes the found data 824 to produce a plurality of sets of encoded data slices in accordance with the long-term-storage-orientated dispersed storage error coding function.

A second obtaining approach includes a series of second obtaining approach steps. A first step of the second obtaining approach steps includes temporarily storing found data 824, as the temporarily stored data, in the set of DST units 804 in accordance with the computational-orientated dispersed storage error coding function, where at least some of the DST units 806 performed a task on the raw data 820 to produce the found data 824. A second step of the second obtaining approach steps includes performing, by at least some of the DST units 806, a second task on the temporarily stored data to produce a sub-set of found data 826. A third step of the second obtaining approach steps includes dispersed storage error encoding the sub-set of found data 826, as the at least a portion of the temporarily stored data, into the plurality of sets of encoded data slices in accordance with the long-term-storage-orientated dispersed storage error coding function.

FIG. 58D is a flowchart illustrating an example of transforming data. The method begins at step 830 where a processing module (e.g., of a distributed storage and task (DST) unit) temporarily stores raw data, as temporarily stored data, in a set of DST units in accordance with a computational-orientated dispersed storage error coding function. The computational-orientated dispersed storage error coding function includes first dispersed storage error coding parameters that enables a DST unit of the set of DST units to recover, in a pre-dispersed storage error encoded format, a sub-portion of a portion of temporarily stored data from encoded data slices the DST unit stores. The method continues at step 832 where at least some of the DST units performs a task on the temporarily stored data to produce found data.

The method continues at step 834 where the processing module dispersed storage error encodes the found data, as the at least a portion of the temporarily stored data, into a plurality of sets of encoded data slices in accordance with a long-term-storage-orientated dispersed storage error coding function. The long-term-storage-orientated dispersed storage error coding function includes second dispersed storage error coding parameters that prevents the DST unit from recovering, in the pre-dispersed storage error encoded format, the sub-portion of the portion of the temporarily stored data from encoded data slices the DST unit stores and requires retrieval of encoded data slices from multiple DST units of the set of DST units to recover, in the pre-dispersed storage error encoded format, the sub-portion of the portion of the temporarily stored data.

Alternatively, or in addition to, at least some of the DST units obtain the raw data. When the at least some of the DST units obtain the raw data, the method continues at step 836 where the at least some of the DST units performs a task on the raw data to produce the found data. The method continues at step 838 where the processing module temporarily stores the found data, as the temporarily stored data, in the set of DST units in accordance with the computational-orientated dispersed storage error coding function. The method continues at step 840 where the at least some of the DST units performs a second task on the temporarily stored data to produce a sub-set of found data. The method continues at step 844 where the processing module dispersed storage error encodes the sub-set of found data, as the at least a portion of the temporarily stored data, into the plurality of sets of encoded data slices in accordance with the long-term-storage-orientated dispersed storage error coding function.

The method continues at step 846 where the processing module determines whether at least a portion of the temporarily stored data is to be stored long-term, where the temporarily stored data is stored in the set of DST units in accordance with the computational-orientated dispersed storage error coding function. For example, a processing module determines that no further computational tasks are to be performed on the temporarily stored data.

When the at least a portion of the temporarily stored data is to be stored long-term, the method continues at step 848 where the processing module identifies one or more DST units of the set of DST units storing the at least a portion of the temporarily stored data in accordance with the computational-orientated dispersed storage error coding function. The identifying the one or more DST units of the set of DST units includes at least one of a plurality of approaches. A first approach includes receiving a message regarding the at least a portion of the temporarily stored data, where the message identifies the one or more DST units. A second approach includes receiving a message regarding the at least a portion of the temporarily stored data and determining the one or more DST units based storage of the at least a portion of the temporarily stored data. A third approach includes determining that no further computations are to be performed on the at least a portion of the temporarily stored data.

The method continues at step 850 where the processing module recovers the at least a portion of the temporarily stored data from the one or more DST units in the pre-dispersed storage error encoded format. The method continues at step 852 where the processing module dispersed storage error encodes the at least a portion of the temporarily stored data in the pre-dispersed storage error encoded format into the plurality of sets of encoded data slices in accordance with a long-term-storage-orientated dispersed storage error coding function. The dispersed storage error encoding the at least a portion of the temporarily stored data includes a series of steps. A first step includes determining, in accordance with the long-term-storage-orientated dispersed storage error coding function, a data mapping of data-based encoded data slices of the at least a portion of the temporarily stored data in a pre-dispersed storage error encoded format. A second step includes generating redundancy-based encoded data slices (e.g., error coded slices) based on the data-based encoded data slices and in accordance with the long-term-storage-orientated dispersed storage error coding function. A third step includes organizing the data-based encoded data slices and the redundancy-based encoded data slices into the plurality of set of encoded data slices.

Alternatively, the dispersed storage error encoding the at least a portion of the temporarily stored data includes an alternate series of steps. A first alternate step includes dispersed storage error encoding the at least a portion of the temporarily stored data in the pre-dispersed storage error encoded format into a plurality of encoded data blocks in accordance with the long-term-storage-orientated dispersed storage error coding function. A second alternate step includes organizing the plurality of encoded data blocks into the plurality of sets of encoded data slices in accordance with the long-term-storage-orientated dispersed storage error coding function. The method continues at step 854 where the processing module stores the plurality of sets of encoded data slices in the set of DST units subsequent to the encoding.

FIG. 58E is a schematic block diagram of another embodiment of a distributed computing system that includes a computing device 860 and a set of distributed storage and task (DST) units 804. The set of DST units 804 includes one or more DST units 806. A DST unit 806 of the set of DST units 804 may be implemented by one or more of a DST execution unit, a server, the user device, and a DST processing unit. The computing device 860 may be implemented by one or more of a DST unit 806 of the set of DST units 804, a DST execution unit, a DST client module, a distributed task (DT) execution module, a processing module, a controller, a user device, a DST processing unit, a distributed storage and task network (DSTN) managing unit, and a DST integrity processing unit.

The computing device 860 includes a distributed storage (DS) module 862. The DS module 862 includes a determine task module 864, a reconfigure module 866, and a task module 868.

The system is operable to transform data stored in accordance with a long-term-storage-orientated dispersed storage error coding function into data stored with a computational-orientated dispersed storage error coding function to facilitate performing of a task 870 on a recovered portion of the data to produce a task resultant. The data is encoded into a plurality of encoded data blocks 874 (e.g., sets of encoded slices, groups of check blocks, storage blocks 874) in accordance with the long-term-storage-orientated dispersed storage error coding function and the plurality of encoded data blocks 874 are stored in the set of DST units 804. The determine task module 864 determines that the task 870 is to be performed on the data. The determining may be based on one or more of receiving a task execution request, receiving the task 870, identifying a task execution need based on analysis of the data, a task execution schedule, and a predetermination.

The reconfigure module 866 reconfigures storage of the data from the long-term-storage-orientated dispersed storage error coding function to the computational-orientated dispersed storage error coding function, where the data is encoded into groupings of encoded data blocks 872 (e.g., computational data blocks 872) in accordance with the computational-orientated dispersed storage error coding function. The reconfigure module 866 reconfigures storage of the data by a series of steps. A first step includes decoding the plurality of encoded data blocks 874 in accordance with the long-term-storage-orientated dispersed storage error coding function to recover the data. A second step includes encoding the recovered data in accordance with the computational-orientated dispersed storage error coding function to produce the groupings of encoded data blocks 872. A third step includes sending one of the groupings of encoded data blocks 872 to a DST unit 806.

The reconfigure module 866 may reconfigure storage of the data by a series of alternate steps. A first alternate step includes identifying data-based encoded data slices of the plurality of encoded data blocks 874 in accordance with the long-term-storage-orientated dispersed storage error coding function. A second alternate step includes determining a data mapping of the data-based encoded data slices between the set of DST units 804 and the at least some of the DST units 806. A third alternate step includes facilitating copying of at least some of the data-based encoded data slices to the at least some of the DST units 806 in accordance with the data mapping.

The task module 868 facilitates performing the task 870 by a series of steps. A first step includes facilitating storage of the groupings of encoded data blocks 872 in the at least some of the set of DST units 806, where a DST unit 806 of the at least some of the DST units 806 recovers a portion of the data from the one of the groupings of encoded data blocks 872 and performs a portion of the task 870 on the recovered portion of the data to produce a partial task resultant 876. A second step includes receiving partial task resultants 876 from the at least some of the set of DST units 806. A third step includes compiling the partial task resultants 876 to produce the task resultant 878.

FIG. 58F is a flowchart illustrating another example of transforming data. The method begins at step 880 where a processing module (e.g., of a distributed storage and task (DST) unit) determines that a task is to be performed on data, where the data is encoded into a plurality of encoded data blocks (e.g., sets of encoded slices, groups of check blocks) in accordance with a long-term-storage-orientated dispersed storage error coding function and the plurality of encoded data blocks are stored in a set of DST units.

The method continues at step 882 with a processing module reconfigures storage of the data from the long-term-storage-orientated dispersed storage error coding function to a computational-orientated dispersed storage error coding function, where the data is encoded into groupings of encoded data blocks in accordance with the computational-orientated dispersed storage error coding function. The reconfiguring storage of the data includes a series of steps. A first step includes decoding the plurality of encoded data blocks in accordance with the long-term-storage-orientated dispersed storage error coding function to recover the data. A second step includes encoding the recovered data in accordance with the computational-orientated dispersed storage error coding function to produce the groupings of encoded data blocks. A third step includes sending one of the groupings of encoded data blocks to a DST unit of the set of DST units. Alternatively, the reconfiguring storage of the data includes a series of alternate steps. A first alternate step includes identifying data-based encoded data slices of the plurality of encoded data blocks in accordance with the long-term-storage-orientated dispersed storage error coding function. A second alternate step includes determining a data mapping of the data-based encoded data slices between the set of DST unit and the at least some of the DST units. A third alternate step includes facilitating copying of at least some of the data-based encoded data slices to the at least some of the DST units in accordance with the data mapping.

The method continues at step 884 where the processing module facilitates storage of the groupings of encoded data blocks in at least some of the set of DST units, where a DST unit of the at least some of the DST units recovers a portion of the data from the one of the groupings of encoded data blocks and performs a portion of the task on the recovered portion of the data to produce a partial task resultant. The method continues at step 886 where the processing module receives partial task resultants from the at least some of the set of DST units. The method continues at step 888 where the processing module compiles the partial task resultants to produce a task resultant.

FIG. 59 is a flowchart illustrating another example of transforming stored data. The method begins at step 890 where a processing module (e.g., of a distributed storage and task (DST) client module) determines to convert data stored to facilitate a dispersed storage task to data stored to facilitate a distributed computing task. The determining may include at least one of receiving a conversion request, determining to convert based on one or more of a distributed computing task request indicator, a data retrieval frequency indicator, a priority level indicator, and a security level indicator. For example, the processing module detects that a series of steps of a task have been queued up to process the data utilizing a distributed computing approach and determines to convert dispersed storage format data to distributed computing format data to facilitate a distributed computing task execution efficiency improvement.

The method continues at step 892 where the processing module identifies DST execution units utilized to store the data (e.g., a lookup). The method continues at step 894 where the processing module obtains dispersed storage task processing parameters of the data. The obtaining includes one or more of performing a lookup, receiving the parameters, accessing DST allocation information to extract the parameters, accessing a dispersed storage vault, and performing a query.

The method continues at step 896 where the processing module determines distributed computing task processing parameters of the data. The determining includes one or more of performing a lookup, receiving the parameters, accessing DST allocation information to extract the parameters, performing a query, and determining the parameters based on one or more of a distributed computing requirement, and a performance requirement.

The method continues at step 898 where the processing module obtains a dispersed storage task pillar mapping corresponding to the data. The determining includes one or more of performing a lookup, receiving the mapping, accessing DST allocation information to extract the mapping, performing a query, and determining the mapping based on one or more of a dispersed storage requirement, and a storage performance requirement.

The method continues at step 900 where the processing module determines a distributed computing task pillar mapping corresponding to the data. The determining may be based on one or more of a network topology, a distributed computing performance requirement, a network bandwidth utilization maximum and one more storage objectives including minimizing transfer of slices, and efficiently utilizing storage capacity. For example, the processing module determines to utilize DST execution units likely to be matched to steps of likely distributed computing tasks. As another example, the processing module determines to not transfer slices from at least some of the DST execution units to minimize network bandwidth utilization. As yet another example, the processing module determines to leave same pillar number slices in different DST execution units when the DST execution units are at the same site as indicated by the network topology.

The method continues at step 902 where the processing module identifies slice groupings to transfer based on the distributed computing task pillar mapping and the dispersed storage task pillar mapping. The method continues at step 904 where the processing module facilitates transfer of slice groupings to transfer between two or more of the DST execution units. The method continues at step 906 where the processing module updates a directory and/or DST allocation information to indicate where each slice grouping is stored. Subsequent utilization of the data may support execution of tasks by each DST execution unit thus providing a system level distributed computing performance improvement. Alternatively, the processing module may retrieve a decode threshold number of slice groupings, decode the decode threshold number of slice groupings to reproduce the data, generate new slice groupings in accordance with the pillar mappings, and facilitate storing of the new slice groupings in accordance with the pillar mappings.

FIG. 60A is a diagram illustrating an example of non-sequential data segment storage mapping that includes a directory 910, an anchor object 912, and one or more data regions 1-2. The directory 910 provides an index function for locating data objects stored within at least one of a distributed storage network (DSN) and a distributed storage and task network (DSTN). The directory 910 includes a data identifier (ID) field 914, a distributed storage network (DSN) address field 916, and an anchor object format flag 918. The anchor object 912 includes data storage mapping information. The data storage mapping information includes a link format indicator 920 and a segment allocation table (SAT) 922. Each data region of the one or more data regions 1-2 includes one or more data segments. For example, a first data region includes data segments 1_1, 1_2, etc. through data segment 1_N when the first data region includes N data segments and a second data region includes data segments 2_1, 2_2, etc. through data segment 2_M when the data region includes M data segments.

Each of the directory 910, the anchor object 912, and the one or more data regions 1-2 is stored in one or more of a local memory and a DSN memory. When utilizing the DSN memory, the directory 910 is encoded using a dispersed storage error coding function to produce a set of directory slices for storage in the DSN memory. When utilizing the DSN memory, the anchor object 912 is encoded using the dispersed storage error coding function to produce a set of anchor object slices for storage in the DSN memory. When utilizing the DSN memory, each data segment of one or more data segments of a region is encoded using the dispersed storage or coding function to produce a set of encoded data slices for storage in the DSN memory. When utilizing the DSN memory, a vault source name is assigned as a DSN address for an object to be stored in the DSN memory. For example, a first DSN address is assigned to the directory 910 and is utilized to generate a set of slice names corresponding to the set of directory slices. As another example, a second DSN address is assigned to the anchor object 912 and is utilized to generate a set of slice names corresponding to the set of anchor object slices. Such a second DSN address is utilized as an entry for the DSN address field 916.

DSN addresses are sequentially assigned to the one or more data segments of each data region. For example, a third DSN address is assigned to a first data segment of the first data region, a fourth DSN address is assigned to a second data segment of the first data region, where the fourth DSN address includes a data segment identifier entry that is substantially the same as a data segment identifier entry of the third DSN address incremented by one, a fifth DSN address is assigned to a third data segment of the first data region, where the fifth DSN address includes a data segment identifier entry that is substantially the same as the data segment identifier entry of the fourth DSN address incremented by one, etc. DSN addresses of each data segment of the one or more data segments of each data region may be generated based on a DSN address of a first data segment of the data region and information regarding the one or more data segments (e.g., how many data segments). Slice names of a set of slices associated with each data segment may be generated based on the DSN address of the data segment (e.g., appending a pillar index based on a pillar width of dispersed storage error coding parameters).

The SAT 922 includes one or more entries. Each entry includes identity of a corresponding data region (e.g., a region number), a DSN address of the first data segment, and information relating the first data segment to the one or more data segments (e.g., a total size of the data region, a data segment size, a data segmentation approach, a number of data segments). For example, a first entry of the SAT 922 includes a DSN address of data segment 1_1 and information that N data segments are included in region 1 and a second entry of SAT 922 includes a DSN address of data segment 2_1 and information that M data segments are included in region 2. As such, the SAT 922 provides access to the one or more data segments of the one or more data regions when stored in the DSN memory.

In an example of operation, a data ID 924, that corresponds to data stored as one or more data segments of the one or more data regions, is utilized to identify an entry of directory 910 that includes a data ID entry in the data ID field 914 that substantially matches data ID 924. The DSN address field 916 is accessed to retrieve the DSN address entry corresponding to the storage location of anchor object 912 and the anchor object format flag field 918 is accessed to retrieve an anchor object format flag entry. The anchor object format flag entry identifies whether the anchor object 912 includes a format indicator that includes the linked format indicator 920.

Next, the anchor object 912 is retrieved using the DSN address 916 of the anchor object 912. When the anchor object format flag 918 indicates that the anchor object 912 includes the format indicator, the format indicator is extracted from the anchor object 912. The format indicator includes at least one of a linked format indicator 920 and a packed format indicator 928 as discussed with reference to FIG. 60B. When the format indicator indicates the linked format indicator 920, the SAT 922 is extracted and interpreted to identify the DSN address of the first data segment of each data region of the one or more data regions. Next, at least one data segment of the one or more data segments per data region is accessed utilizing one or more entries of the SAT 922.

FIG. 60B is a diagram illustrating an example of sequential data segment storage mapping that includes a directory 910, an anchor object 926, and one or more data regions 1-2. The directory 910 provides an index function for locating data objects stored within at least one of a distributed storage network (DSN) and a distributed storage and task network (DSTN). The directory 910 includes a data identifier (ID) field 914, a distributed storage network (DSN) address field 916, and an anchor object format flag 918. The anchor object 926 includes data storage mapping information and a first data segment of a first data region of the one or more data regions 1-2. The data storage mapping information includes a packed format indicator 928 and a segment allocation table (SAT) 922. The first data region of the one or more data regions 1-2 includes the first data segment of the first data region and one or more remaining data segments of the one or more data segments. Remaining data regions of the one or more data regions 1-2 includes one or more data segments corresponding to the data region. For example, a first data region includes anchor object 926 (e.g., that includes data segment 1_1), data segments 1_2, 1_3, etc. through data segment 1_N when the first data region includes N data segments and a second data region includes data segments 2_1, 2_2, etc. through data segment 2_M when the data region includes M data segments.

Each of the directory 910, the anchor object 926, and data segments of the one or more data regions 1-2 is stored in one or more of a local memory and a DSN memory. When utilizing the DSN memory, the directory 910 is encoded using a dispersed storage error coding function to produce a set of directory slices for storage in the DSN memory. When utilizing the DSN memory, the anchor object 926 is encoded using the dispersed storage error coding function to produce a set of data storage information and data slices for storage in the DSN memory. When utilizing the DSN memory, each remaining data segment of one or more data segments of the first region is encoded using the dispersed storage or coding function to produce a set of encoded data slices for storage in the DSN memory. When utilizing the DSN memory, a vault source name is assigned as a DSN address for an object to be stored in the DSN memory. For example, a first DSN address is assigned to the directory 910 and is utilized to generate a set of slice names corresponding to the set of directory slices. As another example, a second DSN address is assigned to the anchor object 926 and is utilized to generate a set of slice names corresponding to the set of data storage information and data slices. Such a second DSN address is utilized as an entry for the DSN address field 916.

DSN addresses are sequentially assigned to the one or more data segments of each data region. For example, a third DSN address is assigned the anchor object 926 that includes the first data segment of the first data region, a fourth DSN address is assigned to a second data segment of the first data region, where the fourth DSN address includes a data segment identifier entry that is substantially the same as a data segment identifier entry of the third DSN address incremented by one, a fifth DSN address is assigned to a third data segment of the first data region, where the fifth DSN address includes a data segment identifier entry that is substantially the same as the data segment identifier entry of the fourth DSN address incremented by one, etc. DSN addresses of each data segment of the one or more data segments of each data region may be generated based on a DSN address of a first data segment (e.g., of the anchor object 926 for the first data region) of the data region and information regarding the one or more data segments (e.g., how many data segments). Slice names of a set of slices associated with each data segment may be generated based on the DSN address of the data segment (e.g., appending a pillar index based on a pillar width of dispersed storage error coding parameters).

The SAT 922 includes one or more entries. Each entry includes identity of a corresponding data region (e.g., a region number), a DSN address of the first data segment (e.g., of the anchor object 926 for the first data region), and information relating the first data segment to the one or more data segments (e.g., a total size of the data region, a data segment size, a data segmentation approach, a number of data segments). For example, a first entry of the SAT 922 includes a DSN address of the anchor object 926 that includes data segment 1_1 and information that N data segments are included in region 1 and a second entry of SAT 922 includes a DSN address of data segment 2_1 and information that M data segments are included in region 2. As such, the SAT 922 provides access to the one or more data segments of the one or more data regions when stored in the DSN memory.

In an example of operation, a data ID 924, that corresponds to data stored as one or more data segments of the one or more data regions, is utilized to identify an entry of directory 910 that includes a data ID entry in the data ID field 914 that substantially matches data ID 924. The DSN address field 916 is accessed to retrieve the DSN address entry corresponding to the storage location of anchor object 926 and the anchor object format flag field 918 is accessed to retrieve an anchor object format flag entry. The anchor object format flag entry identifies whether the anchor object 912 includes a format indicator that includes the packed format indicator 928.

Next, the anchor object 926 is retrieved using the DSN address 916 of the anchor object 926. When the anchor object format flag 918 indicates that the anchor object 926 includes the format indicator, the format indicator is extracted from the anchor object 926. The format indicator includes at least one of a linked format indicator 920 and a packed format indicator 928. When the format indicator indicates the packed format indicator 928, the SAT 922 is extracted and interpreted to identify the DSN address of the second data segment of the first data region. The first data segment is extracted from the anchor object 926. The SAT 922 is interpreted to identify the DSN address of the first data segment of remaining data regions (e.g., starting with the second data region when the second data region exists). Next, at least one data segment of the one or more data segments per data region is accessed utilizing one or more entries of the SAT 922. The storage mapping is discussed in greater detail with reference to FIGS. 60C-F.

FIG. 60C is a schematic block diagram of an embodiment of a distributed storage network (DSN) that includes a computing device 930 and a distributed storage network (DSN) memory 932. The DSN memory 932 includes a plurality of dispersed storage (DS) units 934. Each DS unit 934 may be implemented by one or more of a distributed storage and task (DST) execution unit, a DST unit, a server, a user device, a memory device, and a DST processing unit. The computing device 930 may be implemented by one or more of a DS unit 934, a DST unit, a DST execution unit, a DST client module, a distributed task (DT) execution module, a processing module, a controller, a user device, a DST processing unit, a distributed storage and task network (DSTN) managing unit, and a DST integrity processing unit. The computing device 930 includes a distributed storage (DS) module 936 (e.g., a distributed storage processing module). The DS module 936 includes a select storage module 938, a segment module 940, a generate mapping module 942, an encode module 944, and an output module 946.

The system is operable to store data 948 in the DSN memory 932 (e.g., also referred to as the DSN 932). The select storage module 938 determines whether to use sequential data segment storage mapping or non-sequential data segment storage mapping for storage of the data 948 based on data read/write probabilities 950 of the data 948. The data read/write probabilities 950 includes one or more of size of the data, data type, estimated regularity of editing at least a portion of the data, estimated regularity of deleting at least a portion of the data, estimated regularity of expanding the data, storage capabilities of the DSN 932 (e.g., vault capacity, performance level, formats, etc.), parallel read/write preferences, and non-sequential read/write preferences.

The segment module 940, when the non-sequential data segment storage mapping is to be used, performs a series of steps. A first step includes determining an initial set of storage regions of the DSN 932 for storing the data 948. The segment module 940 determines the initial set of storage regions by determining the initial set of storage regions based on one or more of the data read/write probabilities 950. A second step includes mapping a set of data partitions to the initial set of storage regions, where the data 948 is divided into the set of data partitions (e.g., data partitions may be the same size, different sizes, or a combination thereof). A third step includes, for each data partition of the set of data partitions, segmenting the data partition into a plurality of data segments 952. A fourth step includes, for each data partition of the set of data partitions, designating a first data segment of the plurality of data segments 952.

The generate mapping module 942, when the non-sequential data segment storage mapping is to be used, generates data storage mapping information 954 regarding at least one of the mapping of the set of data partitions to the initial set of storage regions, the plurality of data segments 952 for each data partition of the set of data partitions, and the first data segment for each data partition of the set of data partitions. The generate mapping module 942 generates the data storage mapping information 954 by a series of steps. A first step includes generating an indication for the non-sequential data segment storage mapping. A second step includes generating a segment allocation table, where an entry of the segment allocation table includes identity of one of the initial set of storage regions, identity of the first data segment, and information relating the first data segment to the plurality of data segments 952.

The encode module 944, when the non-sequential data segment storage mapping is to be used, performs a series of encoding steps. A first encoding step includes encoding, in accordance with a first dispersed storage error coding function, the data storage mapping information 954 to produce at least one set of encoded mapping information slices 956. A second encoding step includes, for each data partition of the set of data partitions, encoding, in accordance with a second dispersed storage error coding function, the plurality of data segments 952 to produce a plurality of sets of encoded data slices 958. The output module 946, when the non-sequential data segment storage mapping is to be used, outputs the at least one set of encoded mapping information slices 956 and, for each data partition of the set of data partitions, the plurality of sets of encoded data slices 958 to the DSN 932 for storage therein.

Alternatively, the DS module 936 (e.g., the encode module 944) combines the data storage mapping information 954 and the first data segment of a first data partition of the set of data partitions for storage as a common set of encoded mapping information and data slices 960. When combining, the first dispersed storage error coding function specifies dispersed storage error coding parameters and the second dispersed storage error coding function specifies the dispersed storage error coding parameters. When combining, the encode module 944 performs a series of combining encoding steps. A first combining encoding step includes encoding, in accordance with the dispersed storage error coding parameters, the data storage mapping information 954 and the first data segment of a first data partition of the set of data partitions to produce at least one set of encoded mapping information and data slices 960. A second combining encoding step includes, for each remaining data segment of the plurality of data segments 952 of the first data partition, encoding, in accordance with the dispersed storage error coding parameters, the remaining data segment to produce a set of encoded data slices 958 (e.g., for output by the output module 946 to the DSN 932).

Alternatively, the select storage module 938 may determine to utilize the sequential data segment storage mapping. When the sequential data segment storage mapping is to be used, the segment module 940 segments the data 948 into a plurality of data segments 952 and designates a first data segment of the plurality of data segments 952. The generate mapping module 942 generates data storage mapping information 954 regarding at least one of the plurality of data segments 952 and the first data segment. The encode module 944 encodes, in accordance with a dispersed storage error coding function, the data storage mapping information 954 and the first data segment to produce at least one set of encoded mapping information and data slices 960. For each remaining data segment of the plurality of data segments 952, the encode module 944 encodes, in accordance with the dispersed storage error coding function, the remaining data segment to produce a set of encoded data slices 958. The output module 946 outputs at least one set of encoded mapping information and data slices 960 and, for each remaining data segment of the plurality of data segments, the set of encoded data slices 958 to the DSN 932 for storage therein.

The DS module 936 may receive additional data 962 to store with the data 948. When receiving additional data 962, the select storage module 938 receives the additional data 962 to store with the data 948. The segment module 940, when receiving additional data 962, performs a series of additional steps. A first additional step includes selecting another storage region of the DSN 932 for storing the additional data 962. A second additional step includes updating a set of storage regions to include the initial set of storage regions and the other storage region. A third additional step includes segmenting the additional data 962 into an additional plurality of data segments 952. A fourth additional step includes designating a first data segment of the additional plurality of data segments 952.

When receiving the additional data 962, the generate mapping module 942 updates the data storage mapping information 954 to include at least one of the mapping of the set of data partitions and the additional data to the set of storage regions, the additional plurality of data segments 952, and the first data segment of the additional plurality of data segments 952. The encode module 944 performs additional steps including a first step where the encode module 944 encodes, in accordance with the first dispersed storage error coding function, the updated data storage mapping information to produce at least one updated set of encoded mapping information slices 956. In a second additional step, the encode module 944 encodes, in accordance with the second dispersed storage error coding function, the additional plurality of data segments to produce an additional plurality of sets of encoded data slices 958. The output module 944 outputs the at least one updated set of encoded mapping information slices 956 and the additional plurality of sets of encoded data slices 958 to the DSN 932 for storage therein.

FIG. 60D is a flowchart illustrating another example of storing data. The method begins at step 970 where a processing module (e.g., of a dispersed storage processing module) determines whether to use sequential data segment storage mapping or non-sequential data segment storage mapping for storage of data based on data read/write probabilities of the data. The method branches to step 984 when the processing module determines to use non-sequential data segment storage mapping. The method continues to step 972 when the processing module determines to use sequential data segment storage mapping. The method continues at step 972 where the processing module segments the data into a plurality of data segments when the sequential data segment storage mapping is to be used. The method continues at step 974 where the processing module designates a first data segment of the plurality of data segments.

The method continues at step 976 where the processing module generates data storage mapping information regarding at least one of the plurality of data segments and the first data segment. The generating data storage mapping information includes generating an indication for the sequential data segment storage mapping and generating a segment allocation table. An entry of the segment allocation table includes identity of the first data segment (e.g., a vault source name) and information relating the first data segment to the plurality of data segments (e.g., a number of data segments, a total length of the plurality of data segments).

The method continues at step 978 where the processing module encodes, in accordance with a dispersed storage error coding function, the data storage mapping information and the first data segment to produce at least one set of encoded mapping information and data slices. For each remaining data segment of the plurality of data segments, the method continues at step 980 where the processing module encodes, in accordance with the dispersed storage error coding function, the remaining data segment to produce a set of encoded data slices. The method continues at step 982 where the processing module outputs at least one set of encoded mapping information and data slices and, for each remaining data segment of the plurality of data segments, the set of encoded data slices to a distributed storage network (DSN) for storage therein.

When the non-sequential data segment storage mapping is to be used, the method continues at step 984 where the processing module determines an initial set of storage regions of the DSN for storing the data. The determining the initial set of storage regions includes determining the initial set of storage regions based on one or more of the data read/write probabilities. The method continues at step 986 where the processing module maps a set of data partitions to the initial set of storage regions, where the data is divided into the set of data partitions (e.g., data partitions can be the same size, different sizes, or a combination thereof). For each data partition of the set of data partitions, the method continues at step 988 where the processing module segments the data partition into a plurality of data segments and designates a first data segment of the plurality of data segments (e.g., identifies a vault source name).

The method continues at step 992 where the processing module generates data storage mapping information regarding at least one of the mapping of the set of data partitions to the initial set of storage regions, the plurality of data segments for each data partition of the set of data partitions, and the first data segment for each data partition of the set of data partitions. The generating data storage mapping information includes generating an indication for the non-sequential data segment storage mapping and generating the segment allocation table. An entry of the segment allocation table includes identity of one of the initial set of storage regions (e.g., a region identifier), identity of the first data segment (e.g., vault source name), and information relating the first data segment to the plurality of data segments (e.g., a number of data segments, a total length of the plurality of data segments).

The processing module may utilize a packed format for the first data segment, where the first data segment is combined with the data storage mapping information when utilizing the packed format. The processing module may determine to utilize the packed format based on one or more of the data read/write probabilities and the indication for the non-sequential data segment storage mapping. For example, the processing module selects the packed format when the data read/write probabilities indicate that a data size of the data is less than a packed data threshold size. As another example, the processing module selects the non-packed format when the non-sequential data segment format is indicated. The method branches to step 1000 when the processing module selects the packed format. The method continues to step 994 when the processing module selects a non-packed format.

The method continues at step 994 where the processing module encodes, in accordance with a first dispersed storage error coding function, the data storage mapping information to produce at least one set of encoded mapping information slices. For each data partition of the set of data partitions, the method continues at step 996 where the processing module encodes, in accordance with a second dispersed storage error coding function, the plurality of data segments to produce a plurality of sets of encoded data slices. The method continues at step 998 where the processing module outputs the at least one set of encoded mapping information slices and, for each data partition of the set of data partitions, the plurality of sets of encoded data slices to the DSN for storage therein. When receiving additional data, the method branches to step 1006.

When using the packed format, the first dispersed storage error coding function specifies dispersed storage error coding parameters, the second dispersed storage error coding function specifies the dispersed storage error coding parameters, and the method continues at step 1000 where the processing module encodes, in accordance with the dispersed storage error coding parameters, the data storage mapping information and the first data segment of a first data partition of the set of data partitions to produce at least one set of encoded mapping information and data slices. For each remaining data segment of the plurality of data segments of the first data partition, the method continues at step 1002 where the processing module encodes, in accordance with the dispersed storage error coding parameters, the remaining data segment to produce a set of encoded data slices. The method continues at step 1004 where the processing module outputs the at least one set of encoded mapping information and data slices and, for each remaining data segment of the plurality of data segments of the first data partition, the set of encoded data slices to the DSN for storage therein. When receiving the additional data, the method continues to step 1006.

The method continues at step 1006 where the processing module receives the additional data to store with the data. The method continues at step 1008 where the processing module selects another storage region of the DSN for storing the additional data and updates a set of storage regions to include the initial set of storage regions and the other storage region. The method continues at step 1012 where the processing module segments the additional data into an additional plurality of data segments and designates a first data segment of the additional plurality of data segments. The method continues at step 1016 where the processing module updates the data storage mapping information to include at least one of the mapping of the set of data partitions and the additional data to the set of storage regions, the additional plurality of data segments, and the first data segment of the additional plurality of data segments.

The method continues at step 1018 where the processing module encodes, in accordance with the first dispersed storage error coding function, the updated data storage mapping information to produce at least one updated set of encoded mapping information slices. The method continues at step 1020 where the processing module encodes, in accordance with the second dispersed storage error coding function, the additional plurality of data segments to produce an additional plurality of sets of encoded data slices. The method continues at step 1022 where the processing module outputs the at least one updated set of encoded mapping information slices and the additional plurality of sets of encoded data slices to the DSN for storage therein.

FIG. 60E is a schematic block diagram of another embodiment of a distributed storage network (DSN) that includes a computing device 1030 and a distributed storage network (DSN) memory 932. The DSN memory 932 includes a plurality of dispersed storage (DS) units 934. Each DS unit 934 may be implemented by one or more of a distributed storage and task (DST) execution unit, a DST unit, a server, a user device, a memory device, and a DST processing unit. The computing device 1030 may be implemented by one or more of a DS unit 934, a DST unit, a DST execution unit, a DST client module, a distributed task (DT) execution module, a processing module, a controller, a user device, a DST processing unit, a distributed storage and task network (DSTN) managing unit, and a DST integrity processing unit. The computing device 1030 includes a distributed storage (DS) module 1032 (e.g., a distributed storage processing module). The DS module 1032 includes a segment module 1034, a generate mapping module 1036, an encode module 1038, and an output module 1040.

The system is operable to store data 948 in the DSN memory 932 (e.g., also referred to as the DSN 932). The segment module 1034 performs a series of steps. A first step includes mapping a set of data partitions to a set of storage regions, where the data 948 is divided into the set of data partitions (e.g., data partitions can be the same size, different sizes, or a combination thereof). The segment module 1034 maps the set of data partitions to the set of storage regions by determining the set of storage regions based on data read/write probabilities. The data read/write probabilities includes one or more of size of the data, data type, estimated regularity of editing at least a portion of the data, estimated regularity of deleting at least a portion of the data, estimated regularity of expanding the data, storage capabilities of the DSN, parallel read/write preferences, and non-sequential read/write preferences. For each data partition of the set of data partitions, the segment module 1034 segments the data partition into a plurality of data segments 952 and designates a first data segment of the plurality of data segments (e.g., identifies a vault source name).

The generate mapping module 1036 generates data storage mapping information 954 regarding at least one of the mapping of the set of data partitions to the set of storage regions, the plurality of data segments 952 for each data partition of the set of data partitions, and the first data segment for each data partition of the set of data partitions. The generate mapping module 1036 generates the data storage mapping information 954 by a series of steps. A first step includes generating an indication for the non-sequential data segment storage mapping. A second step includes generating a segment allocation table. An entry of the segment allocation table includes identity of one of the initial set of storage regions, identity of the first data segment, and information relating the first data segment to the plurality of data segments 952.

The encode module 1038 performs a series of steps. A first step includes encoding, in accordance with a first dispersed storage error coding function, the data storage mapping information 954 to produce at least one set of encoded mapping information slices 956. For each data partition of the set of data partitions, a second step includes encoding, in accordance with a second dispersed storage error coding function, the plurality of data segments 952 to produce a plurality of sets of encoded data slices 958. The output module 1040 outputs the at least one set of encoded mapping information slices 956 and, for each data partition of the set of data partitions, the plurality of sets of encoded data slices 958 to the DSN 932 for storage therein.

Alternatively, the DS module 1032 (e.g., the encode module 1038) combines the data storage mapping information 954 and the first data segment of a first data partition of the set of data partitions for storage as a common set of encoded mapping information and data slices 960. When combining, the first dispersed storage error coding function specifies dispersed storage error coding parameters and the second dispersed storage error coding function specifies the dispersed storage error coding parameters. When combining, the encode module 1038 performs a series of combining encoding steps. A first combining encoding step includes encoding, in accordance with the dispersed storage error coding parameters, the data storage mapping information 954 and the first data segment of a first data partition of the set of data partitions to produce at least one set of encoded mapping information and data slices 960 (e.g., for output by the output module 1040 to the DSN 932). A second combining encoding step includes, for each remaining data segment of the plurality of data segments 952 of the first data partition, encoding, in accordance with the dispersed storage error coding parameters, the remaining data segment to produce a set of encoded data slices 958 (e.g., for output by the output module 1040 to the DSN 932).

The DS module 1032 may receive additional data 962 to store with the data 948. When receiving the additional data 962, the segment module 1034 performs a series of steps. A first step includes receiving the additional data 962 to store with the data 932. A second step includes selecting another storage region of the DSN 932 for storing the additional data 962. A third step includes updating the set of storage regions to include the other storage region. A fourth step includes segmenting the additional data 962 into an additional plurality of data segments 952. A fifth step includes designating a first data segment of the additional plurality of data segments 952. When receiving the additional data 962, the generate mapping module 1036 updates the data storage mapping information 954 to include at least one of the mapping of the set of data partitions and the additional data 962 to the updated set of storage regions, the additional plurality of data segments 952, and the first data segment of the additional plurality of data segments 952.

When receiving the additional data 962, the encode module 1038 performs a series of steps. A first step includes encoding, in accordance with the first dispersed storage error coding function, the updated data storage mapping information 954 to produce at least one updated set of encoded mapping information slices 956. A second step includes encoding, in accordance with the second dispersed storage error coding function, the additional plurality of data segments 952 to produce an additional plurality of sets of encoded data slices 958. When receiving the additional data, the output module 1040 outputs the at least one updated set of encoded mapping information slices 956 and the additional plurality of sets of encoded data slices 958 to the DSN 932 for storage therein.

FIG. 60F is a flowchart illustrating another example of storing data, which includes similar steps to FIG. 60D. The method begins at step 1042 where a processing module (e.g., of a dispersed storage processing module) maps a set of data partitions to a set of storage regions, where the data is divided into the set of data partitions. The mapping the set of data partitions to the set of storage regions includes determining the set of storage regions based on data read/write probabilities. For each data partition of the set of data partitions, the method continues with step 988 of FIG. 60D where the processing module segments the data partition into a plurality of data segments and designates a first data segment of the plurality of data segments (e.g., identifies a vault source name).

The method continues at step 1044 where the processing module generates data storage mapping information regarding at least one of the mapping of the set of data partitions to the set of storage regions, the plurality of data segments for each data partition of the set of data partitions, and the first data segment for each data partition of the set of data partitions. The generating data storage mapping information includes a series of steps. A first step includes generating an indication for the non-sequential data segment storage mapping. A second step includes generating a segment allocation table. An entry of the segment allocation table includes identity of one of the initial set of storage regions, identity of the first data segment, and information relating the first data segment to the plurality of data segments.

The processing module may utilize a packed format for the first data segment, where the first data segment is combined with the data storage mapping information when utilizing the packed format. The processing module may determine to utilize the packed format based on one or more of the data read/write probabilities. For example, the processing module selects the packed format when the data read/write probabilities indicate that a data size of the data is less than a packed data threshold size. The method branches to step 1000 of FIG. 60D when the processing module selects the packed format. The method continues to step 994 of FIG. 60D when the processing module selects a non-packed format.

The method continues with step 994 of FIG. 60D where the processing module encodes, in accordance with a first dispersed storage error coding function, the data storage mapping information to produce at least one set of encoded mapping information slices. For each data partition of the set of data partitions, the method continues at step 996 where the processing module encodes, in accordance with a second dispersed storage error coding function, the plurality of data segments to produce a plurality of sets of encoded data slices. The method continues with step 998 of FIG. 60D where the processing module outputs the at least one set of encoded mapping information slices and, for each data partition of the set of data partitions, the plurality of sets of encoded data slices to the DSN for storage therein. When receiving additional data, the method branches to step 1006 of FIG. 60D.

When using the packed format, the first dispersed storage error coding function specifies dispersed storage error coding parameters, the second dispersed storage error coding function specifies the dispersed storage error coding parameters, and the method continues with step 1000 of FIG. 60D where the processing module encodes, in accordance with the dispersed storage error coding parameters, the data storage mapping information and the first data segment of a first data partition of the set of data partitions to produce at least one set of encoded mapping information and data slices. For each remaining data segment of the plurality of data segments of the first data partition, the method continues with step 1002 of FIG. 60D where the processing module encodes, in accordance with the dispersed storage error coding parameters, the remaining data segment to produce a set of encoded data slices. The method continues with step 1004 of FIG. 60D where the processing module outputs the at least one set of encoded mapping information and data slices and, for each remaining data segment of the plurality of data segments of the first data partition, the set of encoded data slices to the DSN for storage therein. When receiving the additional data, the method continues to step 1006 of FIG. 60D.

The method continues with step 1006 of FIG. 60D where the processing module receives the additional data to store with the data. The method continues at step 1046 where the processing module selects another storage region of the DSN for storing the additional data. The method continues at step 1048 where the processing module updates the set of storage regions to include the other storage region. The method continues with step 1012 of FIG. 60D where the processing module segments the additional data into an additional plurality of data segments and designates a first data segment of the additional plurality of data segments. The method continues with step 1016 of FIG. 60D where the processing module updates the data storage mapping information to include at least one of the mapping of the set of data partitions and the additional data to the set of storage regions, the additional plurality of data segments, and the first data segment of the additional plurality of data segments.

The method continues with step 1018 of FIG. 60D where the processing module encodes, in accordance with the first dispersed storage error coding function, the updated data storage mapping information to produce at least one updated set of encoded mapping information slices. The method continues with step 1020 of FIG. 60D where the processing module encodes, in accordance with the second dispersed storage error coding function, the additional plurality of data segments to produce an additional plurality of sets of encoded data slices. The method continues with step 1022 of FIG. 60D where the processing module outputs the at least one updated set of encoded mapping information slices and the additional plurality of sets of encoded data slices to the DSN for storage therein.

FIG. 61A is a schematic block diagram of another embodiment of a distributed storage network (DSN) that includes a computing device 1060 and a DSN memory 932. The DSN memory 932 includes a plurality of dispersed storage (DS) units 934. Each DS unit 934 may be implemented by one or more of a distributed storage and task (DST) execution unit, a DST unit, a server, a user device, a memory device, and a DST processing unit. The computing device 1060 may be implemented by one or more of a DS unit 934, a DST unit, a DST execution unit, a DST client module, a distributed task (DT) execution module, a processing module, a controller, a user device, a DST processing unit, a distributed storage and task network (DSTN) managing unit, and a DST integrity processing unit. The computing device 1060 includes a distributed storage (DS) module 1062 (e.g., a distributed storage processing module). The DS module 1062 includes a receive module 1064, an index module 1066, an identify module 1068, and a retrieve module 1070.

The system is operable to retrieve a portion 1072 of a data object (e.g., data file, video file, text file, multimedia file, data file, etc.) from the DSN memory 932 (e.g., also referred to as the DSN 932). The receive module 1064 receives a request 1074 to retrieve the portion 1072 of the data object that is stored in the DSN 932, where the request includes a DSN address for data storage mapping information 1076 regarding storage of the data object. The request may also include one or more data interpretation parameters to facilitate identification of the portion 1072 of the data object. The data interpretation parameters includes one or more of interpretation-based separators for data filtering, interpretation-based separators for data access, chapters of the data object, pages of the data object, sub-chapters of the data object, markers within the data object, time codes associated with the data object, and run-time divisions for playback of the data object.

The data storage mapping information 1076 includes at least one of a plurality of subgroups of data storage mapping information. A first subgroup of data storage mapping information includes a mapping of a set of data partitions to storage regions, where the data object is partitioned into the set of data partitions. A second subgroup of data storage mapping information includes information regarding data segments as a plurality of data segments for each data partition of the set of data partitions (e.g., a number of data segments, a total size of the data partition, a data segmentation scheme). A third subgroup of data storage mapping information includes information regarding a first data segment of the plurality of data segments for each data partition of the set of data partitions. (e.g., a vault source name DSN address).

The index module 1066 performs a series of indexing steps. A first indexing step includes retrieving, based on the DSN address, the data storage mapping information 1076, which maps storage of the data object as data segments in data storage regions of the DSN in accordance with data storage optimization parameters. The data storage optimization parameters includes one or more of storage efficiency, storage reliability, DSN performance, data security, and read/write probabilities of the data object.

The index module 1066 retrieves the data storage mapping information 1076 by a series of retrieving steps. A first retrieving step includes retrieving at least a decode threshold number of at least one set of encoded mapping information slices 956 from a set of DS units 934 of the DSN 932 based on the DSN address. For example, the index module 1066 performs a directory lookup to identify the DSN address based on a data identifier of the data object. Next, the index module 1066 generates at least one set of slice names corresponding to the at least one set of encoded mapping information slices based on the identified DSN address. The index module 1066 generates at least one set of read slice requests that includes the at least one set of slice names. Next, the index module 1066 outputs the at least one set of read slice requests to the DSN memory 932. The index module 1066 receives the at least a decode threshold number of the at least one set of encoded mapping information slices 956. A second retrieving step includes the index module 1066 decoding, in accordance with a dispersed storage error coding function, the at least a decode threshold number of the at least one set of encoded mapping information slices 956 to produce the data storage mapping information 1076.

A second indexing step includes accessing, by the index module 1066, based on the request, indexing information 1078 regarding the data object, where the indexing information 1078 identifies a categorization of the data object into a plurality of categorical data portions 1080 in accordance with data interpretation parameters. The categorization includes user-based interpretation separators for data filtering, data finding, etc. (e.g., chapters, pages, some-chapters, markers, time codes, runtime divisions for playback of a file, etc.). For example, a first categorical data portion includes identifying a first data segment of each region of the set of regions. As another example, a second categorical data portion includes five minutes of video from a point 45 minutes into a video file. The accessing includes at least one of retrieving, generating, receiving, and obtaining. For example, the index module 1066 accesses the indexing information 1078 regarding the data by performing a distributed computing function on the data object stored in the DSN to generate the indexing information 1078. In such an example, the index module 1066 retrieves at least some encoded data slices 958 of the data object from the DSN memory 932 to facilitate performing the distributed computing function on the data object.

The identify module 1068 performs a series of identification steps. A first identification step includes identifying, for the portion of the data object, a specific categorical data portion of the plurality of categorical data portions 1080 in accordance with the indexing information 1078. A second identification step includes equating the specific categorical data portion to specific storage information 1082 of the data storage mapping information 1076 to identify at least one data segment of the data segments of at least one storage region of the storage regions. The identify module 1068 equates the specific categorical data portion to the specific storage information 1082 by a series of equating steps. A first equating step includes aligning the indexing information 1078 with the data storage mapping information 1076 to establish a common reference point. A second equating step includes identifying a target reference point with respect to the common reference point for the specific categorical data portion. A third equating step includes utilizing the target reference point to identify the specific storage information 1082 of the data storage mapping information 1076 with respect to the common reference point.

The retrieve module 1070 retrieves the at least one data segment of the at least one storage region from the DSN in accordance with the specific storage information 1082. The retrieve module 1070 retrieves the at least one data segment by, for each data segment of the at least one data segment of the at least one storage region, retrieving at least a decode threshold number of encoded data slices 958 from the DSN 932 and decoding, in accordance with a dispersed storage error coding function, the at least a decode threshold number of encoded data slices 958 to reproduce the data segment. The retrieve module 1070 outputs the at least one data segment as the portion 1072 of the data object.

FIG. 61B is a flowchart illustrating an example of retrieving data. The method begins at step 1090 where a processing module (e.g., of a dispersed storage (DS) processing module) receives a request to retrieve a portion of a data object (e.g., data file, video file, etc.) that is stored in a distributed storage network (DSN), where the request includes a DSN address for data storage mapping information regarding storage of the data object. The request may also include one or more of the data interpretation parameters to facilitate identification of the portion of the data object.

The method continues at step 1092 where the processing module retrieves, based on the DSN address, the data storage mapping information, which maps storage of the data object as data segments in data storage regions of the DSN in accordance with data storage optimization parameters. The retrieving the data storage mapping information includes a series of retrieving steps. A first retrieving step includes the processing module retrieving at least a decode threshold number of at least one set of encoded mapping information slices from a set of dispersed storage units of the DSN based on the DSN address. A second retrieving step includes the processing module decoding, in accordance with a dispersed storage error coding function, the at least a decode threshold number of the at least one set of encoded mapping information slices to produce the data storage mapping information.

The method continues at step 1094 where the processing module accesses, based on the request, indexing information regarding the data object, where the indexing information identifies a categorization of the data object into a plurality of categorical data portions in accordance with data interpretation parameters. The accessing the indexing information regarding the data includes performing a distributed computing function on the data object stored in the DSN to generate the indexing information. The method continues at step 1096 where the processing module identifies, for the portion of the data object, a specific categorical data portion of the plurality of categorical data portions in accordance with the indexing information.

The method continues at step 1098 where the processing module equates the specific categorical data portion to specific storage information of the data storage mapping information to identify at least one data segment of the data segments of at least one storage region of the storage regions. The equating the specific categorical data portion to specific storage information includes a series of equating steps. A first equating step includes the processing module aligning the indexing information with the data storage mapping information to establish a common reference point. A second equating step includes the processing module identifying a target reference point with respect to the common reference point for the specific categorical data portion. A third equating step includes the processing module utilizing the target reference point to identify the specific storage information of the data storage mapping information with respect to the common reference point.

The method continues at step 1100 where the processing module retrieves the at least one data segment of the at least one storage region from the DSN in accordance with the specific storage information. The retrieving the at least one data segment includes, for each data segment of the at least one data segment of the at least one storage region, the processing module retrieving at least a decode threshold number of encoded data slices from the DSN and the processing module decoding, in accordance with a dispersed storage error coding function, the at least a decode threshold number of encoded data slices to reproduce the data segment.

FIG. 62 is a flowchart illustrating an example of upgrading software. The method begins with step 1102 where a processing module (e.g., of a distributed storage and task network (DSTN) managing unit) determines to perform a software upgrade on a set of distributed storage and task (DST) execution units. The determining may be based on one or more of receiving a software upgrade from a software source, receiving a software upgrade request, a software revision usage timeout, an error message, a software defect detection indicator, and a manager input.

The method continues at step 1104 where the processing module obtains dispersal parameters utilized by the set of DST execution units. The obtaining includes at least one of receiving the parameters, initiating a query, performing a lookup, and accessing a vault associated with the set of DST execution units. The method continues at step 1106 where the processing module obtains availability information of the set of DST execution units. The availability information includes at least one of a currently active indicator, a currently inactive indicator, a scheduled downtime indicator, a downtime history record, a software revision indicator, and a current error indicator. The obtaining includes at least one of receiving the information, initiating a query, performing a lookup, and performing an availability test with one or more DST execution units of the set of DST execution units.

The method continues at step 1108 where the processing module selects one or more DST execution units of the set of DST execution units as selected units to upgrade. The selecting may be based on one or more of dispersed storage error coding parameters, a maximum number of unavailable DST execution units, a minimum number of available DST execution units, availability information, a software revision indicator, a timestamp associated with a last software upgrade, an upgrade schedule, and a last software upgrade success indicator. For example, the processing module selects at most a pillar width minus a decode threshold number of units such that there are at least a decode threshold number of DST execution units online and available (e.g., not currently being upgraded and available to access data). As another example, the processing module selects a DST execution unit that is associated with a previously unsuccessful software upgrade when remaining DST execution units of the set of DST execution units have all been upgraded.

The method continues at step 1110 where the processing module facilitates identifying the selected units as unavailable. The facilitating includes at least one of sending a message to the selected units and updating a DST execution unit availability table. The method continues at step 1112 where the processing module initiates a software upgrade for the selected units. The initiating includes at least one of sending software and an upgrade request to each DST execution unit of the selected units, and sending an upgrade request and an address of the software for retrieval to each DST execution unit of the selected units.

The method continues at step 1114 where the processing module receives a software upgrade response from a DST execution unit of the selected units. The software upgrade response includes at least one of a successful upgrade indicator and an unsuccessful upgrade indicator. The method continues at step 1116 where the processing module facilitates identifying the DST execution unit of the selected units as available when the software upgrade response is favorable. The facilitating includes at least one of sending an available message to the DST execution unit and updating the DST execution unit availability table to indicate that the DST execution unit is available and upgraded.

The method continues at 1118 where the processing module determines whether the set of DST execution units are all upgraded (e.g., by comparing a number of upgraded DST execution units from the DST execution unit availability table to the number of DST execution units). The method repeats back to step 1106 when the processing module determines that the set of DST execution units are not all upgraded. The method continues to step 1120 when the processing module determines that the set of DST execution units are all upgraded. The method continues at step 1120 where the method ends. In addition, the processing module may output an indicator that the upgrade process has completed.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A dispersed storage (DS) module comprises:
 a first module, when operable within a computing device, causes the computing device to:
  determine whether to use sequential data segment storage mapping or non-sequential data segment storage mapping for storage of data based on data read/write probabilities of the data;
 a second module, when operable within the computing device, causes the computing device to:
  when the non-sequential data segment storage mapping is to be used:
   determine an initial set of storage regions of a distributed storage network (DSN) for storing the data;
   map a set of data partitions to the initial set of storage regions, wherein the data is divided into the set of data partitions; and
   for each data partition of the set of data partitions:
    segment the data partition into a plurality of data segments; and
    designate a first data segment of the plurality of data segments;
 a third module, when operable within the computing device, causes the computing device to:
  when the non-sequential data segment storage mapping is to be used:
   generate data storage mapping information regarding at least one of:
    the mapping of the set of data partitions to the initial set of storage regions;
    the plurality of data segments for each data partition of the set of data partitions; and
    the first data segment for each data partition of the set of data partitions;
 a fourth module, when operable within the computing device, causes the computing device to:
  when the non-sequential data segment storage mapping is to be used:
   encode, in accordance with a first dispersed storage error coding function, the data storage mapping information to produce at least one set of encoded mapping information slices; and
   for each data partition of the set of data partitions, encode, in accordance with a second dispersed storage error coding function, the plurality of data segments to produce a plurality of sets of encoded data slices; and a fifth module, when operable within the computing device, causes the computing device to:
when the non-sequential data segment storage mapping is to be used:
output the at least one set of encoded mapping information slices and, for each data partition of the set of data partitions, the plurality of sets of encoded data slices to the DSN for storage therein.

2. The DS module of claim 1, wherein the data read/write probabilities comprises one or more of:
size of the data;
data type;
estimated regularity of editing at least a portion of the data;
estimated regularity of deleting the at least the portion of the data;
estimated regularity of expanding the data;
storage capabilities of the DSN;
parallel read/write preferences; and
non-sequential read/write preferences.

3. The DS module of claim 1, wherein the second module functions to determine the initial set of storage regions by:
determining the initial set of storage regions based on one or more of the data read/write probabilities.

4. The DS module of claim 1, wherein the third module functions to generate the data storage mapping information by:
generating an indication for the non-sequential data segment storage mapping; and
generating a segment allocation table, wherein an entry of the segment allocation table includes:
identity of one of the initial set of storage regions;
identity of the first data segment; and
information relating the first data segment to the plurality of data segments.

5. The DS module of claim 1 further comprises:
the first dispersed storage error coding function specifies dispersed storage error coding parameters;
the second dispersed storage error coding function specifies the dispersed storage error coding parameters; and
the fourth module further functions to:
encode, in accordance with the dispersed storage error coding parameters, the data storage mapping information and the first data segment of a first data partition of the set of data partitions to produce at least one set of encoded mapping information and data slices; and
for each remaining data segment of the plurality of data segments of the first data partition, encode, in accordance with the dispersed storage error coding parameters, the remaining data segment to produce a set of encoded data slices.

6. The DS module of claim 1 further comprises:
the first module further functions to receive additional data to store with the data;
the second module further functions to:
select another storage region of the DSN for storing the additional data;
update a set of storage regions to include the initial set of storage regions and the other storage region;
segment the additional data into an additional plurality of data segments; and
designate a first data segment of the additional plurality of data segments;

the third module further functions to update the data storage mapping information to include at least one of:
the mapping of the set of data partitions and the additional data to the set of storage regions;
the additional plurality of data segments; and
the first data segment of the additional plurality of data segments;
the fourth module further functions to:
encode, in accordance with the first dispersed storage error coding function, the updated data storage mapping information to produce at least one updated set of encoded mapping information slices; and
encode, in accordance with the second dispersed storage error coding function, the additional plurality of data segments to produce an additional plurality of sets of encoded data slices; and
the fifth module further functions to output the at least one updated set of encoded mapping information slices and the additional plurality of sets of encoded data slices to the DSN for storage therein.

7. The DS module of claim 1 further comprises:
when the sequential data segment storage mapping is to be used:
the second module further functions to:
segment the data into the plurality of data segments; and
designate the first data segment of the plurality of data segments;
the third module further functions to generate the data storage mapping information regarding at least one of:
the plurality of data segments; and
the first data segment;
the fourth module further functions to:
encode, in accordance with a dispersed storage error coding function, the data storage mapping information and the first data segment to produce at least one set of encoded mapping information and data slices; and
for each remaining data segment of the plurality of data segments, encode, in accordance with the dispersed storage error coding function, the remaining data segment to produce a set of encoded data slices; and
the fifth module further functions to output the at least one set of encoded mapping information and data slices and, for each remaining data segment of the plurality of data segments, the set of encoded data slices to the DSN for storage therein.

8. A dispersed storage (DS) module comprises:
a first module, when operable within a computing device, causes the computing device to:
map a set of data partitions to a set of storage regions, wherein data is divided into the set of data partitions; and
for each data partition of the set of data partitions:
segment the data partition into a plurality of data segments; and
designate a first data segment of the plurality of data segments;
a second module, when operable within the computing device, causes the computing device to:
generate data storage mapping information regarding at least one of:
the mapping of the set of data partitions to the set of storage regions;

the plurality of data segments for each data partition of the set of data partitions; and the first data segment for each data partition of the set of data partitions;

a third module, when operable within the computing device, causes the computing device to:

encode, in accordance with a first dispersed storage error coding function, the data storage mapping information to produce at least one set of encoded mapping information slices; and for each data partition of the set of data partitions, encode, in accordance with a second dispersed storage error coding function, the plurality of data segments to produce a plurality of sets of encoded data slices; and a fourth module, when operable within the computing device, causes the computing device to:

output the at least one set of encoded mapping information slices and, for each data partition of the set of data partitions, the plurality of sets of encoded data slices to a dispersed storage network (DSN) for storage therein.

9. The DS module of claim 8, wherein the first module functions to map the set of data partitions to the set of storage regions by:

determining the set of storage regions based on data read/write probabilities, wherein the data read/write probabilities includes one or more of:
size of the data;
data type;
estimated regularity of editing at least a portion of the data;
estimated regularity of deleting the at least the portion of the data;
estimated regularity of expanding the data;
storage capabilities of the DSN;
parallel read/write preferences; and
non-sequential read/write preferences.

10. The DS module of claim 8 further comprises:
the first dispersed storage error coding function specifies dispersed storage error coding parameters;
the second dispersed storage error coding function specifies the dispersed storage error coding parameters; and
the third module further functions to:
encode, in accordance with the dispersed storage error coding parameters, the data storage mapping information and the first data segment of a first data partition of the set of data partitions to produce at least one set of encoded mapping information and data slices; and for each remaining data segment of the plurality of data segments of the first data partition, encode, in accordance with the dispersed storage error coding parameters, the remaining data segment to produce a set of encoded data slices.

11. The DS module of claim 8, wherein the second module further functions to generate the data storage mapping information by:

generating an indication for non-sequential data segment storage mapping; and generating a segment allocation table, wherein an entry of the segment allocation table includes:
identity of one of an initial set of storage regions;
identity of the first data segment; and
information relating the first data segment to the plurality of data segments.

12. The DS module of claim 8 further comprises:
the first module further functions to:
receive additional data to store with the data;
select another storage region of the DSN for storing the additional data;
update the set of storage regions to include the other storage region;
segment the additional data into an additional plurality of data segments; and
designate a first data segment of the additional plurality of data segments;
the second module further functions to update the data storage mapping information to include at least one of:
the mapping of the set of data partitions and the additional data to the updated set of storage regions;
the additional plurality of data segments; and
the first data segment of the additional plurality of data segments;
the third module further functions to:
encode, in accordance with the first dispersed storage error coding function, the updated data storage mapping information to produce at least one updated set of encoded mapping information slices; and
encode, in accordance with the second dispersed storage error coding function, the additional plurality of data segments to produce an additional plurality of sets of encoded data slices; and
the fourth module further functions to output the at least one updated set of encoded mapping information slices and the additional plurality of sets of encoded data slices to the DSN for storage therein.

* * * * *